(12) United States Patent
Kawabata et al.

(10) Patent No.: US 9,152,047 B2
(45) Date of Patent: Oct. 6, 2015

(54) ACTINIC-RAY- OR RADIATION-SENSITIVE RESIN COMPOSITION, ACTINIC-RAY-OR RADIATION-SENSITIVE FILM THEREFROM, METHOD OF FORMING PATTERN, PROCESS FOR MANUFACTURING SEMICONDUCTOR DEVICE, SEMICONDUCTOR DEVICE AND COMPOUND

(71) Applicant: FUJIFILM Corporation, Minato-Ku, Tokyo (JP)

(72) Inventors: Takeshi Kawabata, Shizuoka (JP); Hideaki Tsubaki, Shizuoka (JP); Hiroo Takizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/451,814

(22) Filed: Aug. 5, 2014

(65) Prior Publication Data

US 2014/0349223 A1 Nov. 27, 2014

Related U.S. Application Data

(63) Continuation of application No. PCT/JP2013/053168, filed on Feb. 5, 2013.

(30) Foreign Application Priority Data

Feb. 6, 2012 (JP) ................................. 2012-023486

(51) Int. Cl.
| | | |
|---|---|---|
| G03F 7/004 | (2006.01) | |
| G03F 7/027 | (2006.01) | |
| G03F 7/039 | (2006.01) | |
| G03F 7/038 | (2006.01) | |
| C08K 5/42 | (2006.01) | |
| G03F 7/11 | (2006.01) | |
| G03F 7/20 | (2006.01) | |

(52) U.S. Cl.
CPC .............. *G03F 7/027* (2013.01); *G03F 7/0045* (2013.01); *G03F 7/0046* (2013.01); *G03F 7/0388* (2013.01); *G03F 7/0392* (2013.01); *G03F 7/0397* (2013.01); *G03F 7/20* (2013.01); *G03F 7/2059* (2013.01); *C08K 5/42* (2013.01); *G03F 7/11* (2013.01); *G03F 7/2041* (2013.01)

(58) Field of Classification Search
CPC ... G03F 7/0045; G03F 7/0046; G03F 7/0392; G03F 7/20; G03F 7/027; G03F 7/11; G03F 7/2014; G03F 7/0397; G03F 7/2059; G03F 7/0388; C08K 5/42

USPC ............ 430/18, 270.1, 296, 311, 326; 562/75
See application file for complete search history.

(56) References Cited

U.S. PATENT DOCUMENTS

| 6,265,135 B1 | 7/2001 | Kodama et al. | |
|---|---|---|---|
| 7,341,817 B2 | 3/2008 | Wada et al. | |
| 2005/0123859 A1* | 6/2005 | Wada et al. | 430/313 |
| 2007/0087288 A1 | 4/2007 | Nishiyama et al. | |
| 2011/0171577 A1 | 7/2011 | Tsuchimura et al. | |

FOREIGN PATENT DOCUMENTS

| JP | 2000-187330 A | | 7/2000 |
|---|---|---|---|
| JP | 2005-173549 A | | 6/2005 |
| JP | 2005-309421 A | * | 11/2005 |
| JP | 2006-047533 A | | 2/2006 |
| JP | 2008-163056 A | | 7/2008 |
| JP | 2009-235118 A | * | 10/2009 |
| JP | 2010-100604 A | | 5/2010 |
| JP | 2010-128371 A | * | 6/2010 |
| WO | WO 2011/025070 A1 | * | 3/2011 |

OTHER PUBLICATIONS

Computer-generated translation of JP 2005-309421 (Nov. 2005).*
Computer-generated translation of JP 2010-128371 (Jun. 2010).*
Computer-generated translation of JP 2009-235118 (Oct. 2009).*
English Translation of International Preliminary Report on Patentability issued in application No. PCT/JP2013/053168 dated Aug. 21, 2014.
International Search Report for PCT/JP2013/053168 dated Apr. 23, 2013.
Written Opinion for PCT/JP2013/053168 dated Apr. 23, 2013.

\* cited by examiner

*Primary Examiner* — John A McPherson
(74) *Attorney, Agent, or Firm* — Sughrue Mion, PLLC

(57) ABSTRACT

Provided is an actinic-ray- or radiation-sensitive resin composition including a compound that when exposed to actinic rays or radiation, generates any of acids of general formula (I) below.

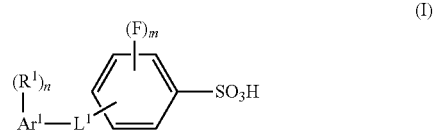

12 Claims, No Drawings

ACTINIC-RAY- OR RADIATION-SENSITIVE RESIN COMPOSITION, ACTINIC-RAY- OR RADIATION-SENSITIVE FILM THEREFROM, METHOD OF FORMING PATTERN, PROCESS FOR MANUFACTURING SEMICONDUCTOR DEVICE, SEMICONDUCTOR DEVICE AND COMPOUND

CROSS-REFERENCE TO RELATED APPLICATIONS

This application is a Continuation application of PCT Application No. PCT/JP2013/053168, filed Feb. 5, 2013 and based upon and claiming the benefit of priority from Japanese Patent Application No. 2012-023486, filed Feb. 6, 2012, the entire contents of all of which are incorporated herein by reference.

BACKGROUND OF THE INVENTION

1. Field of the Invention

The present invention relates to an actinic-ray- or radiation-sensitive resin composition that can find appropriate application in an ultramicrolithography process applicable to the manufacturing of a super-LSI or a high-capacity microchip, etc. and other photofabrication processes, and further relates to an actinic-ray- or radiation-sensitive film from the composition, a method of forming a pattern, a process for manufacturing a semiconductor device, a semiconductor device and a novel compound.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly required in accordance with the realization of high integration for integrated circuits. Accordingly, the trend of exposure wavelength toward a short wavelength, for example, from g-rays to i-rays and further to a KrF excimer laser light is seen. Further, now, the development of lithography using electron beams, X-rays or EUV light, aside from the excimer laser light, is being promoted.

In the development of such lithography technologies, various proposals have been made on, for example, photoacid generators incorporated in photoresist compositions (see, for example, patent references 1 to 3). In particular, the lithography comprising exposure to electron beams, X-rays or EUV light is positioned as the next-generation or next-next-generation pattern forming technology. Positive resists of high sensitivity and high resolution are required for this lithography. Specifically, increasing the sensitivity is a very important task to be attained for the shortening of wafer processing time. However, the pursuit of increasing the sensitivity is likely to cause not only the lowering of resolving power but also the deteriorations of pattern shape and line edge roughness. Thus, there is a strong demand for the development of resists that can simultaneously satisfy these performances. Herein, the line edge roughness (LER) refers to the phenomenon that the edge at an interface of resist pattern and substrate is irregularly varied in the direction perpendicular to the line direction due to the characteristics of the resist, so that when the pattern is viewed from directly above, the pattern edge is observed uneven. This unevenness is transferred in the etching operation using the resist as a mask to thereby cause poor electrical properties resulting in poor yield. Especially in the ultrafine region of 0.25 μm or less line width, the line edge roughness is now an extremely important theme in which improvement is to be attained.

CITATION LIST

Patent Literature

[Patent reference 1] Jpn. Pat. Appln. KOKAI Publication No. (hereinafter referred to as JP-A-) 2005-173549,
[Patent reference 2] JP-A-2000-187330, and
[Patent reference 3] JP-A-2010-100604.

BRIEF SUMMARY OF THE INVENTION

It is an object of the present invention to provide an actinic-ray- or radiation-sensitive resin composition that can simultaneously satisfy high sensitivity, high resolution, favorable pattern shape and favorable line edge roughness at high levels.

It is another object of the present invention to provide an actinic-ray- or radiation-sensitive film from the composition. It is a further object of the present invention to provide a method of forming a pattern, a process for manufacturing a semiconductor device, a semiconductor device and a novel compound.

Some aspects according to the present invention are as follows.

[1] An actinic-ray- or radiation-sensitive resin composition comprising a compound that when exposed to actinic rays or radiation, generates any of acids of general formula (I) below,

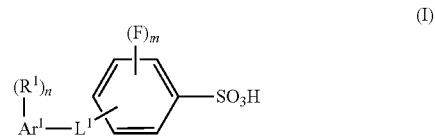

in which $L^1$ represents a single bond, —O—, —S—, —C(=O)—, —C(=O)O—, —OC(=O)—, —S(=O)—, —S(=O)$_2$—, an optionally substituted methylene group or an optionally substituted ethylene group;

$Ar^1$ represents an aryl group;

$R^1$ represents a monovalent substituent, provided that at least one $R^1$ represents a group having two or more carbon atoms, and that when n is 2 or greater, two or more $R^1$s may be identical to or different from each other and may be connected to each other to thereby form a ring;

m is an integer of 1 to 4; and n is an integer of 1 to 5.

[2] The actinic-ray- or radiation-sensitive resin composition according to item [1], wherein in general formula (I), $L^1$ represents —O— or —S—.

[3] The actinic-ray- or radiation-sensitive resin composition according to item [1] or [2], wherein in general formula (I), $Ar^1$ is substituted with at least one $R^1$ at an ortho position to -$L^1$-.

[4] The actinic-ray- or radiation-sensitive resin composition according to any one of items [1] to [3], further comprising a resin that when acted on by an acid, is decomposed to thereby increase its solubility in an alkali developer.

[5] The actinic-ray- or radiation-sensitive resin composition according to any one of items [1] to [4] to be exposed to electron beams, X-rays or soft X-rays.

[6] An actinic-ray- or radiation-sensitive film formed from the actinic-ray- or radiation-sensitive resin composition according to any one of items [1] to [5].

[7] A method of forming a pattern, comprising exposing the actinic-ray- or radiation-sensitive film according to item [6] to actinic rays or radiation and developing the exposed film.

[8] The method according to item [7], wherein the exposure is performed by use of electron beams, X-rays or soft X-rays.

[9] A process for manufacturing a semiconductor device, comprising the method according to item [7] or [8].

[10] A semiconductor device manufactured by the process according to item [9].

[11] A compound of general formula (II) below,

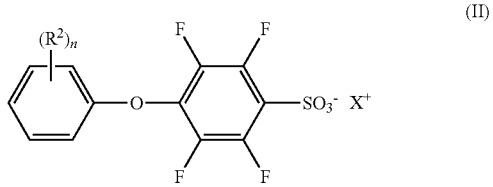

in which $R^2$ represents a monovalent substituent, provided that at least one $R^2$ represents a group having two or more carbon atoms, and that when n is 2 or greater, two or more $R^2$s may be identical to or different from each other and may be connected to each other to thereby form a ring;

n is an integer of 1 to 5; and $X^+$ represents a cation.

The present invention makes it feasible to provide an actinic-ray- or radiation-sensitive resin composition that can simultaneously satisfy high sensitivity, high resolution, favorable pattern shape and favorable line edge roughness at high levels. Further, the present invention makes it feasible to provide an actinic-ray- or radiation-sensitive film from the composition and provide a method of forming a pattern, a process for manufacturing a semiconductor device, a semiconductor device and a novel compound.

DETAILED DESCRIPTION OF THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

Further, herein, the term "actinic rays" or "radiation" means, for example, brightline spectra from a mercury lamp, far ultraviolet represented by an excimer laser, X-rays, soft X-rays such as extreme ultraviolet (EUV) light, or electron beams (EB). The term "light" means actinic rays or radiation. The term "exposure to light" unless otherwise specified means not only irradiation with light, such as light from a mercury lamp, far ultraviolet, X-rays or EUV light, but also lithography using particle beams, such as electron beams and ion beams.

The present invention is based on finding of novel compounds (photoacid generators) that when exposed to actinic rays or radiation, generate acids, which compounds are advantageously used in actinic-ray- or radiation-sensitive resin compositions (hereinafter each referred to as a "photoacid generator (A1)").

The actinic-ray- or radiation-sensitive resin composition of the present invention comprising any of the photoacid generators (A1) in its one aspect is a positive actinic-ray- or radiation-sensitive resin composition and in its other aspect is a negative actinic-ray- or radiation-sensitive resin composition.

The positive actinic-ray- or radiation-sensitive resin composition (more preferably positive resist composition) of the present invention may comprise the photoacid generator (A1) and a resin (B) that when acted on by an acid, is decomposed to thereby increase its solubility in an alkali developer.

The negative actinic-ray- or radiation-sensitive resin composition (more preferably negative resist composition) of the present invention may comprise the acid generator (A1), a resin (C) soluble in an alkali developer and an acid crosslinking agent (D) capable of crosslinking with the resin (C) soluble in an alkali developer by the action of an acid.

The composition of the present invention is preferably exposed to electron beams, X-rays or soft X-rays (namely, composition for electron beams, X-rays or soft X-rays).

The constituents of this composition will be described below.

[1] Compounds that when Exposed to Actinic Rays or Radiation, Generate Acids (Photoacid Generators (A1))

The photoacid generator (A1) contained in the actinic-ray- or radiation-sensitive resin composition of the present invention, when exposed to actinic rays or radiation, generates any of acids of general formula (I) below. Any of acids of general formula (I) ensures low diffusion and high acidity. It is presumed that the incorporation of the photoacid generator (A1) capable of generating any of these acids in the composition of the present invention is a key factor for the improvement of pattern shape and LER and the enhancement of sensitivity and resolution.

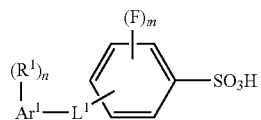

In the formula, $L^1$ represents a single bond, —O—, —S—, —C(=O)—, —C(=O)O—, —OC(=O)—, —S(=O)—, —S(=O)$_2$—, an optionally substituted methylene group or an optionally substituted ethylene group.

$Ar^1$ represents an aryl group.

$R^1$ represents a monovalent substituent, provided that at least one $R^1$ represents a group having two or more carbon atoms, and that when n is 2 or greater, two or more R's may be identical to or different from each other and may be connected to each other to thereby form a ring;

m is an integer of 1 to 4; and n is an integer of 1 to 5.

General formula (I) will be described in detail below.

As substituents introducible in the methylene group and ethylene group represented by $L^1$, there can be mentioned, for example, a halogen group such as a fluorine atom, a chlorine atom, a bromine atom or an iodine atom; an alkoxy group such as a methoxy group, an ethoxy group or a tert-butoxy group; an aryloxy group such as a phenoxy group or a p-tolyloxy group; an alkylthioxy group such as a methylthioxy group, an ethylthioxy group or a tert-butylthioxy group; an arylthioxy group such as a phenylthioxy group or a p-tolylthioxy group; an alkoxycarbonyl group such as a methoxycarbonyl group or a butoxycarbonyl group; an aryloxycarbonyl group such as a phenoxycarbonyl group or a p-tolyloxycarbonyl group; an acetoxy group; a linear or branched alkyl group such as a methyl group, an ethyl group, a propyl group, a butyl group, a heptyl group, a hexyl group, a dodecyl group or a 2-ethylhexyl group; an alkenyl group such as a vinyl group, a propenyl group or a hexenyl group; an alkynyl group such as an acetylene group, a propynyl group or a hexynyl group; a cycloalkyl group; an aryl group such as a phenyl group or a tolyl group; a hydroxyl group; and a carboxyl group.

$L^1$ is preferably —O—, —S—, —C(=O)—, —S(=O)—, —S(=O)$_2$— or an optionally substituted methylene group. $L^1$ is more preferably —O— or —S—, most preferably —O—. It is preferred for the number of atoms as constituents of $L^1$ to be less from the viewpoint that the thermal rotation of $Ar^1$ is restricted to thereby increase the Tg of the actinic-ray- or radiation-sensitive film and accordingly enhance the resolution and LER.

Further, it is preferred for the position at which the substitution with $L^1$ occurs on the benzene ring to be the para-position to —SO$_3$H.

The aryl group represented by $Ar^1$ is a monocyclic or condensed polycyclic aryl group, which is, for example, a phenyl group, a naphthyl group, an anthracenyl group or the like, preferably a naphthyl group.

As the monovalent substituent represented by R1, there can be mentioned, for example, a halogen atom such as a fluorine atom, a chlorine atom, a bromine atom or an iodine atom; an alkoxy group such as a methoxy group, an ethoxy group or a tert-butoxy group; a cycloalkyloxy group such as a cyclohexyloxy group; an aryloxy group such as a phenoxy group or a p-tolyloxy group; an alkylthioxy group such as a methylthioxy group, an ethylthioxy group or a tert-butylthioxy group; an arylthioxy group such as a phenylthioxy group or a p-tolylthioxy group; an alkoxycarbonyl group such as a methoxycarbonyl group or a butoxycarbonyl group; an aryloxycarbonyl group such as a phenoxycarbonyl group or a p-tolyloxycarbonyl group; an acetoxy group; a linear or branched alkyl group such as a methyl group, an ethyl group, a propyl group, a butyl group, a heptyl group, a hexyl group, a dodecyl group, an i-propyl group or a 2-ethylhexyl group; an alkenyl group such as a vinyl group, a propenyl group or a hexenyl group; an alkynyl group such as an acetylene group, a propynyl group or a hexynyl group; a cycloalkyl group; an aryl group such as a phenyl group or a tolyl group; a hydroxyl group; or a carboxyl group.

$R^1$ is preferably a halogen atom, an alkoxy group, an alkylthioxy group, a linear or branched alkyl group, a cycloalkyl group or an aryl group. An alkoxy group having 2 to 10 carbon atoms, an alkylthioxy group having 2 to 10 carbon atoms, a linear or branched alkyl group having 2 to 10 carbon atoms and a cycloalkyl group having 3 to 10 carbon atoms are more preferred. An i-propyl group and a cyclohexyl group are most preferred. When a group with a bulky structure is employed as $R^1$, any in-film diffusion in the PEB (post-exposure bake) operation can be suppressed, so that the resolving power and LER can be enhanced. From this viewpoint, at least one $R^1$ is a group having 2 or more carbon atoms. Preferably, at least two $R^1$s are groups each having 2 or more carbon atoms. Most preferably, at least two $R^1$s are i-propyl or cyclohexyl groups.

In general formula (I), it is preferred for the position at which the substitution with at least one $R^1$ occurs on the $Ar^1$ ring to be the ortho-position to -$L^1$-.

In the formula, m is an integer of 1 to 4, preferably 2 to 4, and more preferably 4. The greater the number of substituent fluorine atoms, the greater the strength of generated acid. As a result, a deprotection reaction can be facilitated to thereby enhance the resolving power and LER performance.

In the formula, n is an integer of 1 to 5, preferably 2 to 5, and more preferably 3.

Preferred particular examples of the acids of general formula (I) are shown below, which in no way limit the scope of the present invention.

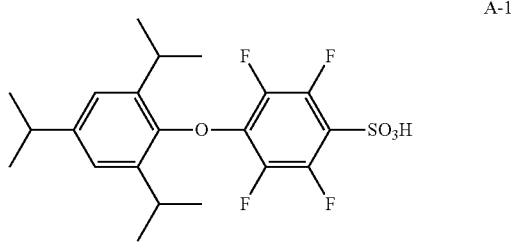

A-1

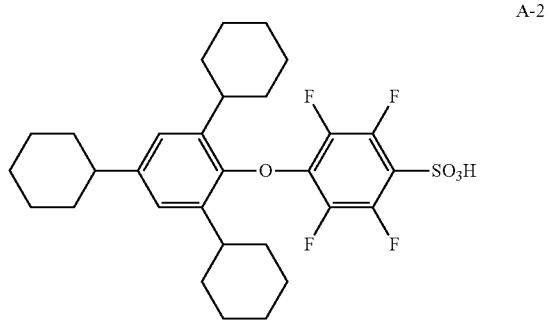

A-2

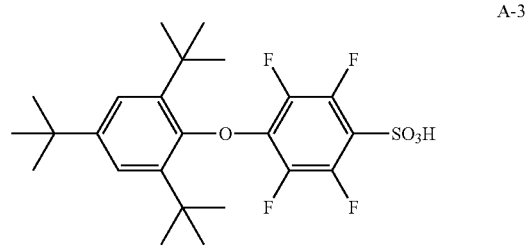

A-3

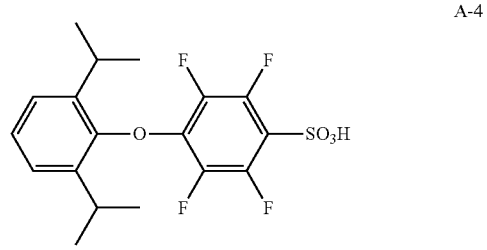

A-4

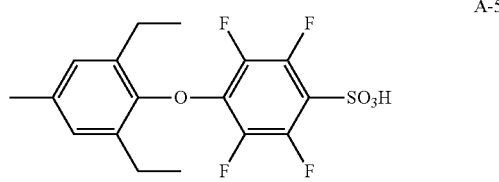

A-5

A-6 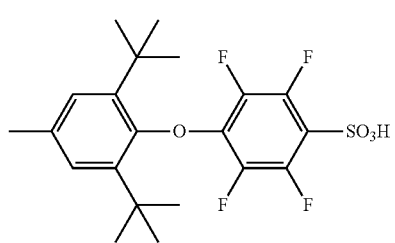
A-7 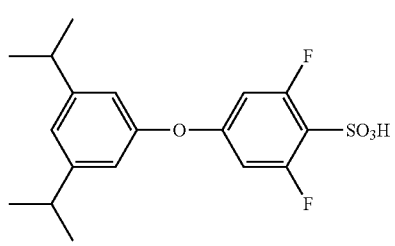
A-8 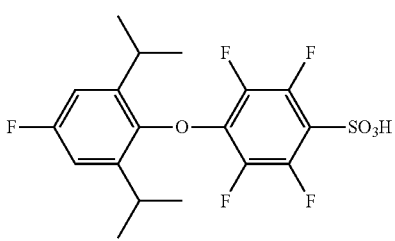
A-9 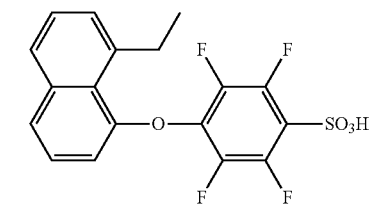
A-10 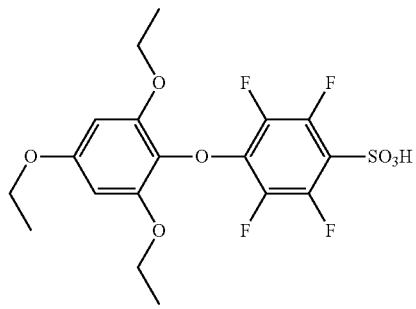
A-11 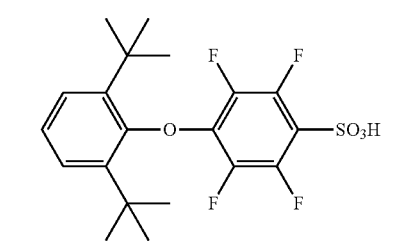
A-12 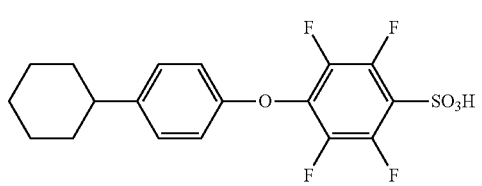
A-13 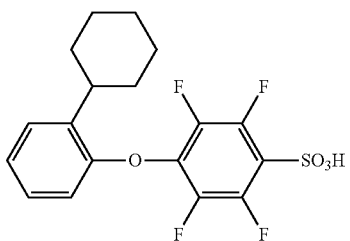
A-14 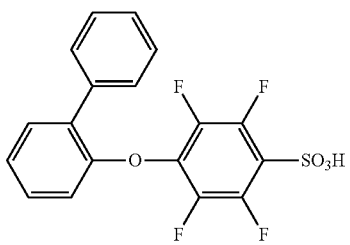
A-15 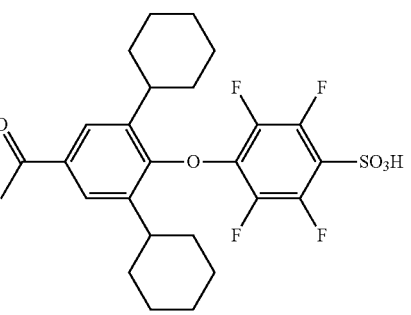
A-16 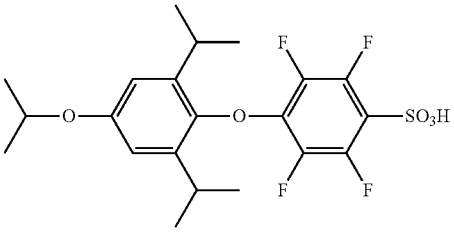
A-17 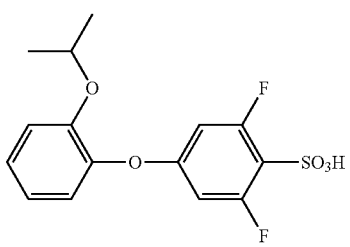

A-18
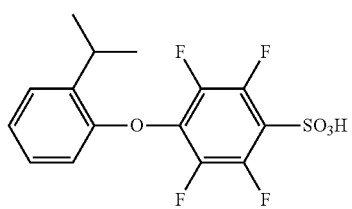
A-19
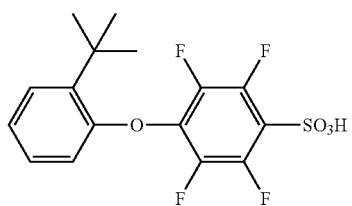
A-20
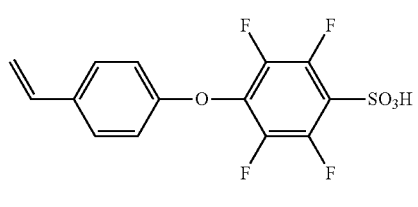
A-21
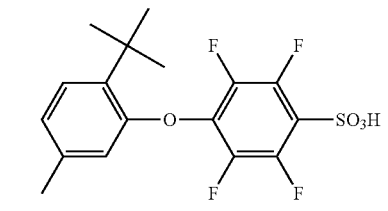
A-22
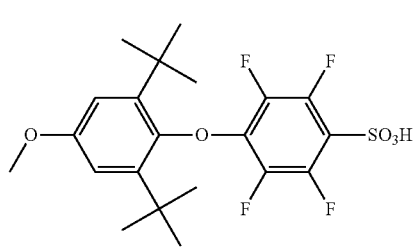
A-23
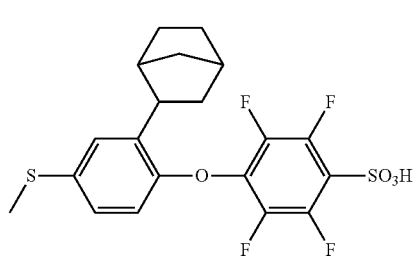
A-24
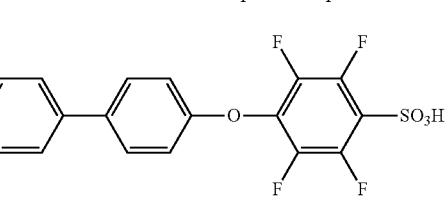
A-25
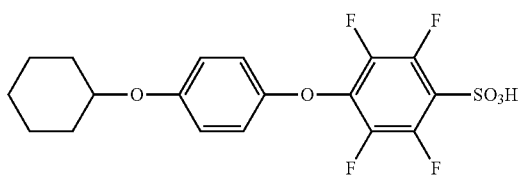
A-26
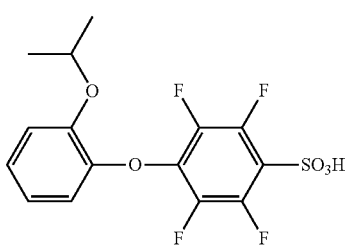
A-27
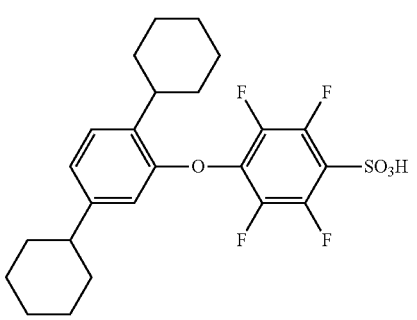
A-28
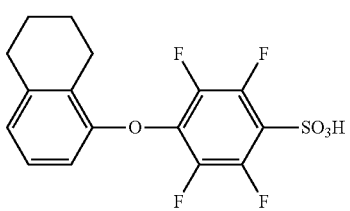
A-29
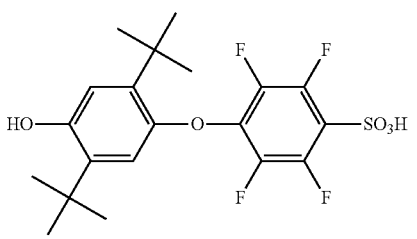
A-30
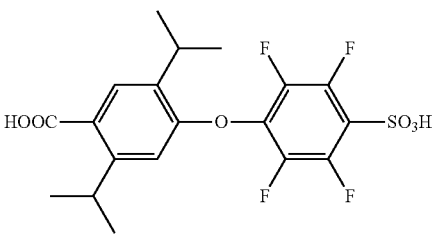

A-31
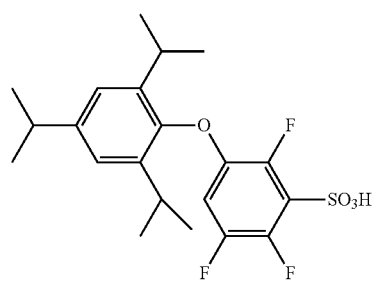
A-32
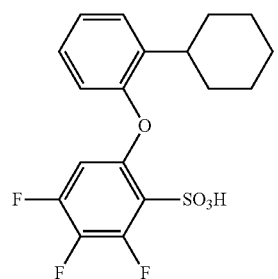
A-33
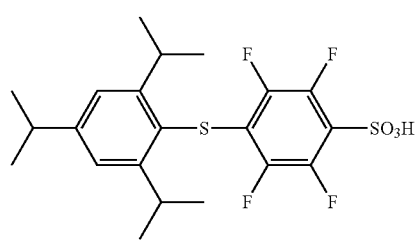
A-34
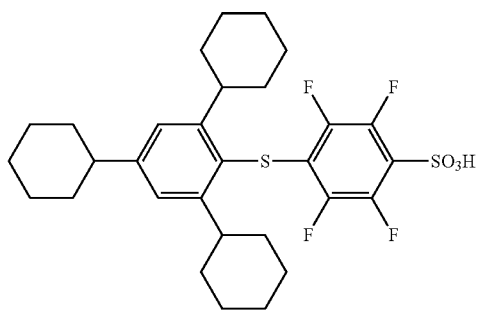
A-35
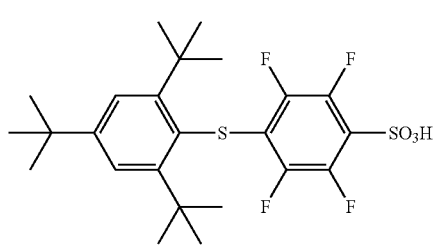
A-36
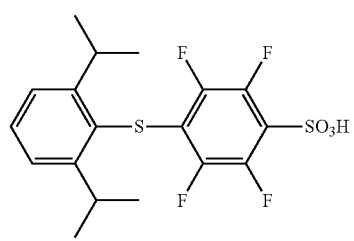
A-37
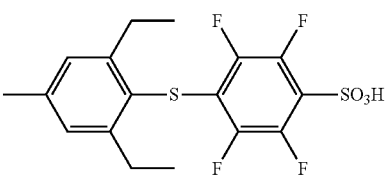
A-38
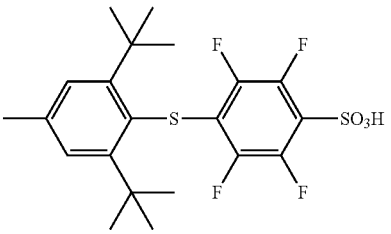
A-39
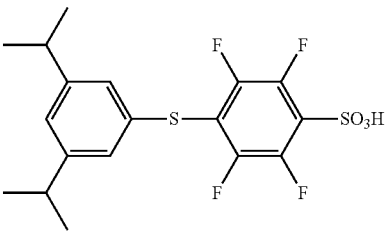
A-40
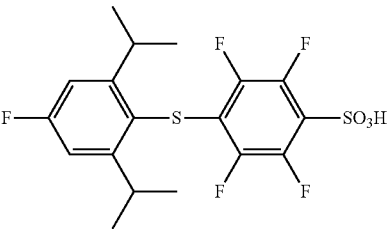
A-41
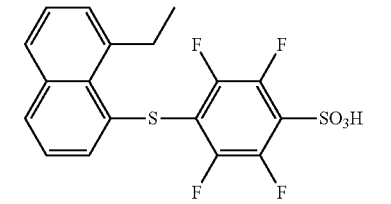
A-42
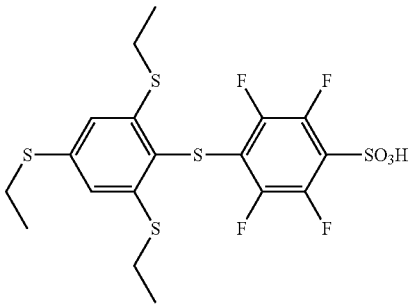

-continued
A-43
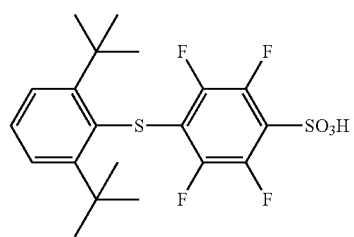
A-44
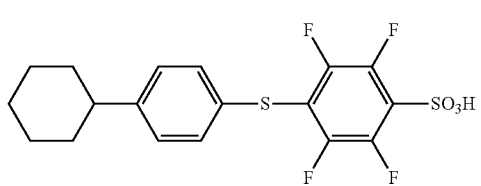
A-45
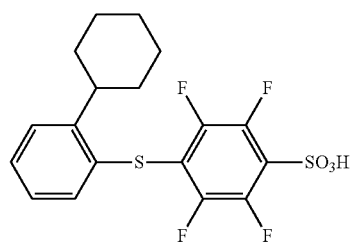
A-46
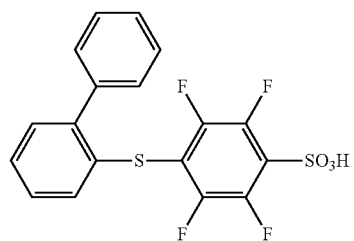
A-47
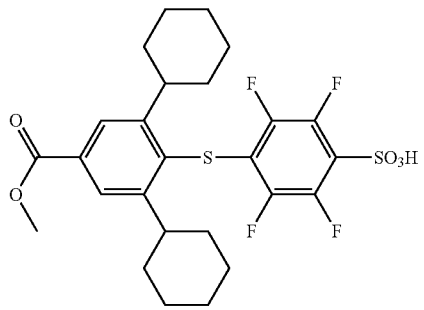
A-48
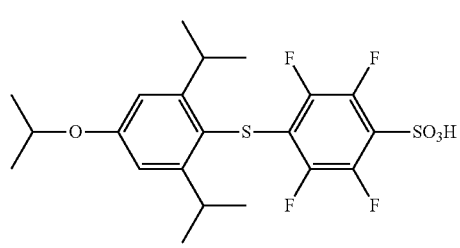
-continued
A-49
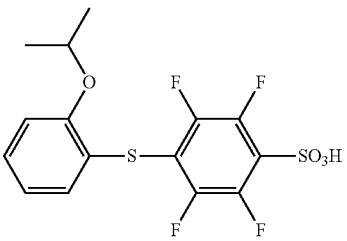
A-50
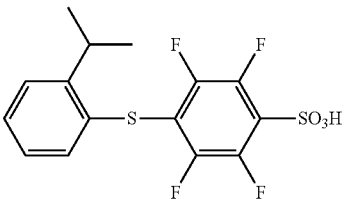
A-51
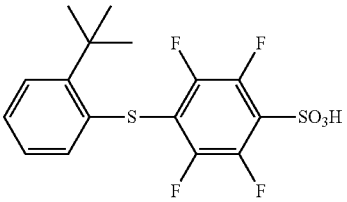
A-52
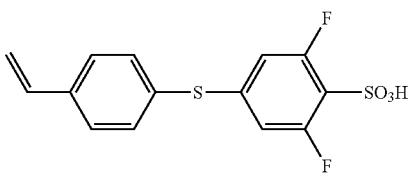
A-53
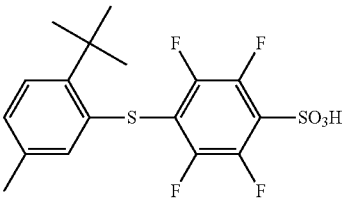
A-54
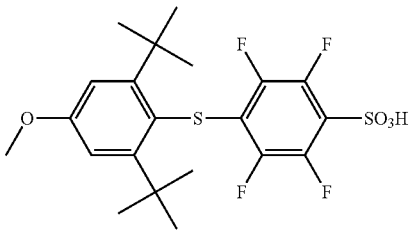
A-55
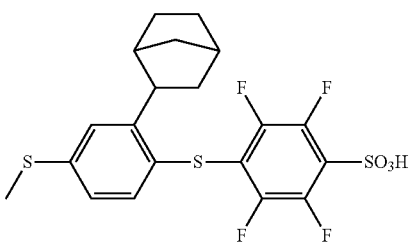

-continued
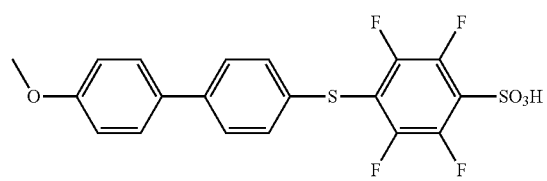
A-56
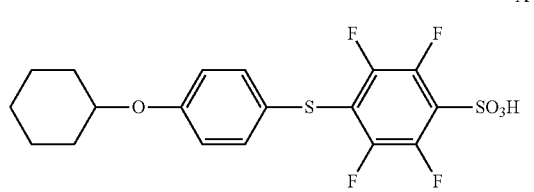
A-57
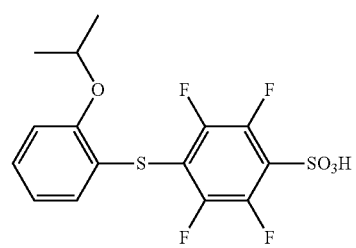
A-58
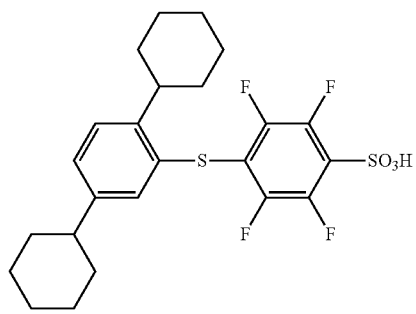
A-59
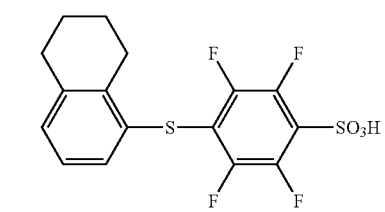
A-60
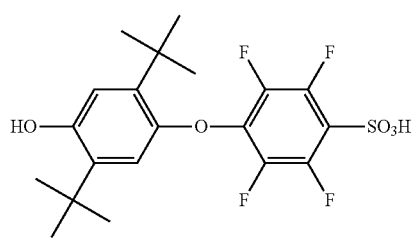
A-61
-continued
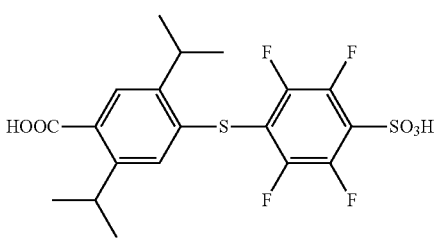
A-62
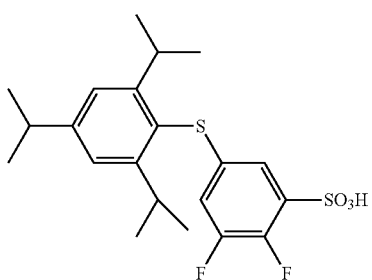
A-63
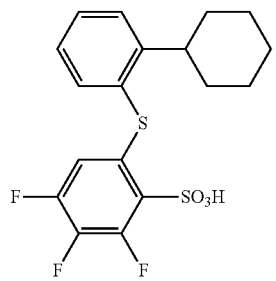
A-64
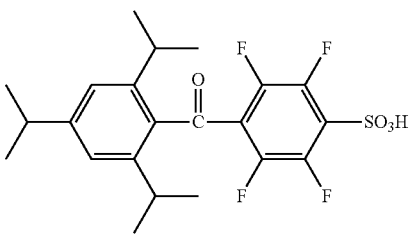
A-65
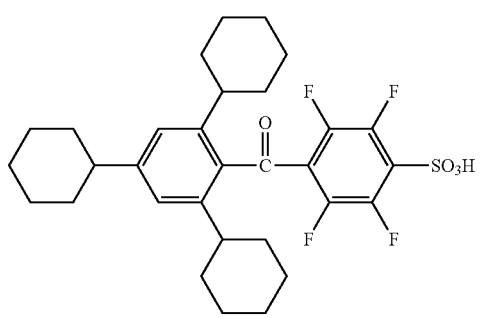
A-66
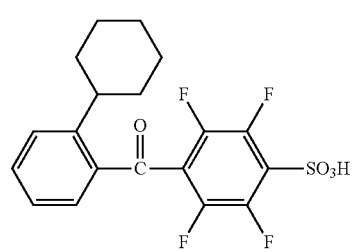
A-67

A-68
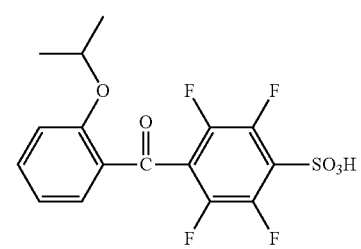
A-69
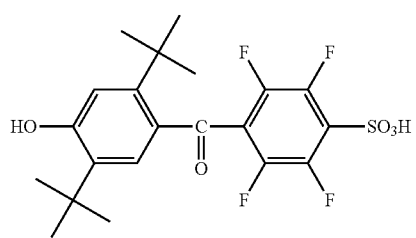
A-70
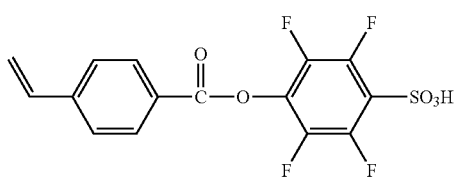
A-71
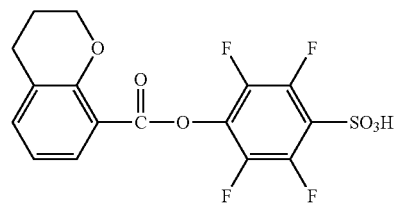
A-72
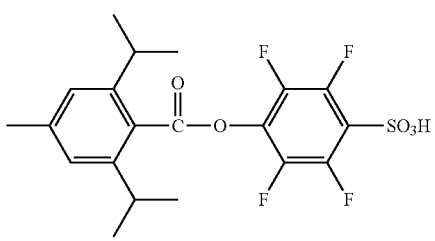
A-73
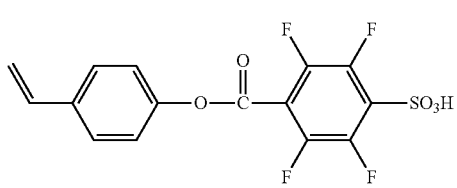
A-74
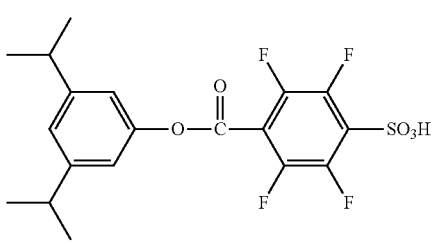
A-75
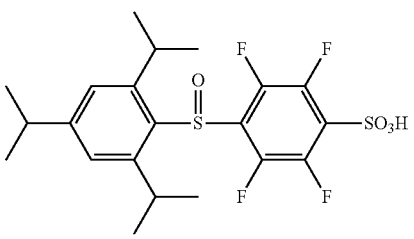
A-76
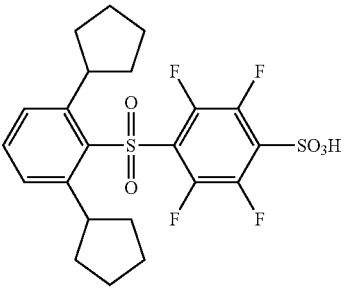
A-77
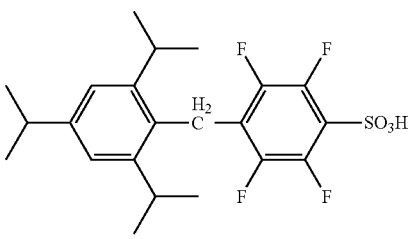
A-78
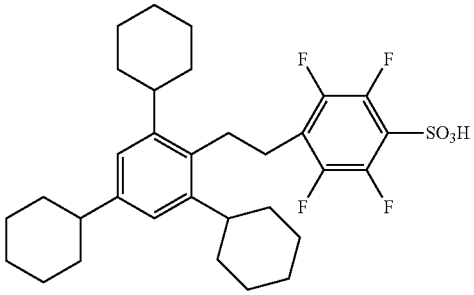
A-79
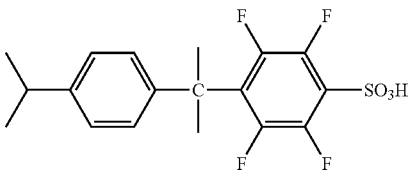
A-80
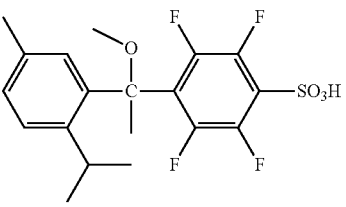
The compound (A1) that when exposed to actinic rays or radiation, generates any of acids of general formula (I), in its one form, is expressed by general formula (III) below.

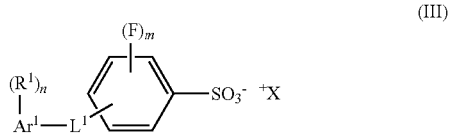

(III)

In the formula, $L^1$, $Ar^1$, $R^1$, m and n are as defined above in connection with general formula (I) and, $X^+$ represents a cation.

In general formula (III) above, it is preferred for $X^+$ to be a sulfonium cation or an iodonium cation.

In an aspect of the present invention, $X^+$ preferably has a structure of general formula (ZA-1) or (ZA-2) below.

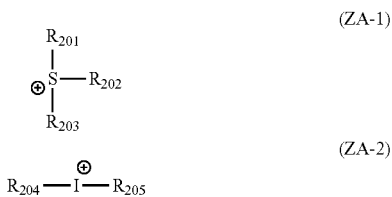

In general formula (ZA-1), each of $R_{201}$, $R_{202}$ and $R_{203}$ independently represents an organic group. The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure (including a condensed ring), and the ring within the same may contain an oxygen atom, a sulfur atom, an ester bond, an amido bond or a carbonyl group aside from the sulfur atom appearing in the formula.

As the organic groups represented by $R_{201}$, $R_{202}$ and $R_{203}$, there can be mentioned, for example, the corresponding groups contained in the (ZA-1-1), (ZA-1-2) and (ZA-1-3) groups to be described below as preferred forms of the groups of general formula (ZA-1), preferably the corresponding groups contained in the (ZA-1-1) and (ZA-1-3) groups.

First, the (ZA-1-1) groups will be described.

The (ZA-1-1) groups are groups of general formula (ZA-1) wherein at least one of $R_{201}$ to $R_{203}$ is an aryl group, namely, groups containing an arylsulfonium as a cation.

In the (ZA-1-1) group, all of the $R_{201}$ to $R_{203}$ may be aryl groups. It is also appropriate that the $R_{201}$ to $R_{203}$ are partially an aryl group and the remainder is an alkyl group or a cycloalkyl group.

As the (ZA-1-1) group, there can be mentioned, for example, a group corresponding to each of a triarylsulfonium, a diarylalkylsulfonium, an aryldialkylsulfonium, a diarylcycloalkylsulfonium and an aryldicycloalkylsulfonium.

The aryl group of the arylsulfonium is preferably a phenyl group or a naphthyl group. The aryl group may be one having a heterocyclic structure containing an oxygen atom, a nitrogen atom, a sulfur atom or the like. As the heterocyclic structure, there can be mentioned, for example, a pyrrole, a furan, a thiophene, an indole, a benzofuran, a benzothiophene or the like.

When the arylsulfonium has two or more aryl groups, the two or more aryl groups may be identical to or different from each other.

The alkyl group or monovalent aliphatic hydrocarbon ring group contained in the arylsulfonium according to necessity is preferably a linear or branched alkyl group having 1 to 15 carbon atoms or a monovalent aliphatic hydrocarbon ring group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like. The monovalent aliphatic hydrocarbon ring group is preferably a cycloalkyl group.

The aryl group, alkyl group or monovalent aliphatic hydrocarbon ring group represented by $R_{201}$ to may have as its substituent an alkyl group (for $R_{203}$ example, 1 to 15 carbon atoms), a monovalent aliphatic hydrocarbon ring group (for example, 3 to 15 carbon atoms; preferably a cycloalkyl group having 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a monovalent aliphatic hydrocarbon ring group having 3 to 12 carbon atoms (preferably a cycloalkyl group having 3 to 12 carbon atoms) and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to represent an aryl group, the substituent $R_{203}$ preferably lies at the p-position of the aryl group.

As more preferred groups of (ZA-1-1), there can be mentioned a triarylsulfonium, or structures of general formula (ZA-1-1A) or (ZA-1-1B) below.

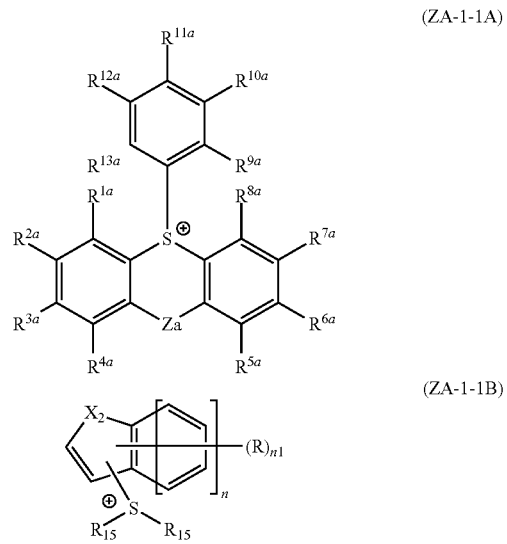

In the general formula (ZA-1-1A), each of $R^{1a}$ to $R^{13a}$ independently represents a hydrogen atom or a substituent, provided that at least one of $R^{1a}$ to $R^{13a}$ is a substituent containing an alcoholic hydroxyl group.

Za represents a single bond or a bivalent connecting group.

In the present invention, the alcoholic hydroxyl group refers to a hydroxyl group bonded to a carbon atom of a linear, branched or cyclic alkyl group.

When $R^{1a}$ to $R^{13a}$ represent substituents containing an alcoholic hydroxyl group, it is preferred for the $R^{1a}$ to $R^{13a}$ to represent the groups of the formula —W—Y, wherein Y represents a hydroxyl-substituted linear, branched or cyclic alkyl group and W represents a single bond or a bivalent connecting group.

As the linear, branched or cyclic alkyl group represented by Y, there can be mentioned a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group, a boronyl group or the like. Of these, an ethyl group, a propyl group, an isopropyl group, an n-butyl group, an isobutyl group and a sec-butyl group are preferred. An ethyl group, a propyl group and an isopropyl group are more preferred. Especially preferably, Y contains the structure of —$CH_2CH_2OH$.

W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^{1a}$ to $R^{13a}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^{1a}$ to $R^{13a}$ may have two or more alcoholic hydroxyl groups. The number of alcoholic hydroxyl groups contained in each of the substituents containing an alcoholic hydroxyl group represented by $R^{1a}$ to $R^{13a}$ is in the range of 1 to 6, preferably 1 to 3 and more preferably 1.

The number of alcoholic hydroxyl groups contained in any of the cations of the general formula (ZA-1-1A) as the total of those of $R^{1a}$ to $R^{13a}$ is preferably in the range of 1 to 10, more preferably 1 to 6 and still more preferably 1 to 3.

When $R^{1a}$ to $R^{13a}$ do not contain any alcoholic hydroxyl group, each of $R^{1a}$ to $R^{13a}$ preferably represents a hydrogen atom, a halogen atom, an alkyl group, a monovalent aliphatic hydrocarbon ring group (preferably a cycloalkyl group), any of alkenyl groups (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^{1a}$ to $R^{13a}$ do not contain any alcoholic hydroxyl group, each of $R^{1a}$ to $R^{13a}$ more preferably represents a hydrogen atom, a halogen atom, an alkyl group, a monovalent aliphatic hydrocarbon ring group (preferably a cycloalkyl group), a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^{1a}$ to $R^{13a}$ do not contain any alcoholic hydroxyl group, especially preferably, each of $R^{1a}$ to $R^{13a}$ represents a hydrogen atom, an alkyl group, a monovalent aliphatic hydrocarbon ring group (preferably a cycloalkyl group), a halogen atom or an alkoxy group.

Any two adjacent to each other of $R^{1a}$ to $R^{13a}$ can cooperate with each other so as to form a ring (an aromatic or nonaromatic cyclohydrocarbon or heterocycle which can form a condensed polycycle through further combination; as such, there can be mentioned, for example, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring).

In the general formula (ZA-1-1A), at least one of $R^{1a}$ to $R^{13a}$ contains an alcoholic hydroxyl group. Preferably, at least one of $R^{9a}$ to $R^{13a}$ contains an alcoholic hydroxyl group.

Za represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, —C≡C—, an aminocarbonylamino group, an aminosulfonylamino group or the like. The bivalent connecting group may have a substituent. The same substituents as mentioned above with respect to $R^{1a}$ to $R^{13a}$ can be employed. Preferably, Za is a single bond or a substituent exhibiting no electron withdrawing properties, such as an alkylene group, an arylene group, an ether group, a thioether group, an amino group, —CH=CH—, —CH≡CH—, an aminocarbonylamino group or an aminosulfonylamino group. More preferably, Z is a single bond, an ether group or a thioether group. Most preferably, Z is a single bond.

Now, general formula (ZA-1-1B) will be described. In general formula (ZA-1-1B), each of $R_{15}$s independently represents an alkyl group, a monovalent aliphatic hydrocarbon ring group (preferably a cycloalkyl group) or an aryl group, provided that two $R_{15}$s may be bonded to each other to thereby form a ring.

$X_2$ represents any of —$CR_{21}$=$CR_{22}$—, —$NR_{23}$—, —S— and —O—. Each of $R_{21}$ and $R_{22}$ independently represents a hydrogen atom, an alkyl group, a monovalent aliphatic hydrocarbon ring group (preferably a cycloalkyl group) or an aryl group. $R_{23}$ represents a hydrogen atom, an alkyl group, a monovalent aliphatic hydrocarbon ring group (preferably a cycloalkyl group), an aryl group or an acyl group.

R, or each of R's independently, represents a substituent. As the substituent represented by R, there can be mentioned, for example, the corresponding groups in general formulae (ZI-1) to (ZI-3) to be described below as preferred forms of general formula (ZA-1-1B).

In the formula, n is an integer of 0 to 3, and n1 is an integer of 0 to 11.

Substituents may be introduced in the alkyl groups represented by $R_{15}$ and $R_{21}$ to $R_{23}$. A linear or branched alkyl group having 1 to 20 carbon atoms is a preferred substituent. An oxygen atom, a sulfur atom or a nitrogen atom may be introduced in the alkyl chain.

In particular, as a substituted alkyl group, there can be mentioned a linear or branched alkyl group substituted with a monovalent aliphatic hydrocarbon ring group (preferably a cycloalkyl group) (for example, an adamantylmethyl group, an adamantylethyl group, a cyclohexylethyl group, a camphor residue or the like).

Substituents may be introduced in the monovalent aliphatic hydrocarbon ring groups represented by $R_{15}$ and $R_{21}$ to $R_{23}$. A cycloalkyl group is a preferred substituent, and a cycloalkyl group having 3 to 20 carbon atoms is a more preferred substituent. An oxygen atom may be introduced in the ring.

Substituents may be introduced in the aryl groups represented by $R_{15}$ and $R_{21}$ to $R_{23}$. An aryl group having 6 to 14 carbon atoms is a preferred substituent.

With respect to the alkyl group contained in the acyl group represented by $R_{23}$, particular examples and preferred range thereof are the same as those of alkyl groups mentioned above.

As substituents that may be introduced in these groups, there can be mentioned, for example, a halogen atom, a hydroxyl group, a nitro group, a cyano group, a carboxyl group, a carbonyl group, an alkyl group (preferably 1 to 10 carbon atoms), a monovalent aliphatic hydrocarbon ring group (preferably 3 to 10 carbon atoms, more preferably a cycloalkyl group having 3 to 10 carbon atoms), an aryl group (preferably 6 to 14 carbon atoms), an alkoxy group (preferably 1 to 10 carbon atoms), an aryloxy group (preferably 6 to 14 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms), an alkylthio group (preferably 1 to 10 carbon atoms), an arylthio group (preferably 6 to 14 carbon atoms), and the like. In the cyclic structure of the aryl group, monovalent aliphatic hydrocarbon ring group or the like and in the aminoacyl group, an alkyl group (preferably 1 to 20 carbon atoms) may further be introduced as a substituent.

The ring that may be formed by the mutual bonding of two $R_{15}$s is a ring structure formed in cooperation with —$S^+$ shown in formula (ZA-1-1B), preferably a 5-membered ring containing one sulfur atom or a condensed ring containing the same. The condensed ring is preferably one containing one sulfur atom and up to 18 carbon atoms, more preferably any of the ring structures of general formulae (IV-1) to (IV-3) below.

In the formulae, * represents a bonding hand. R represents an arbitrary substituent. As such, there can be mentioned, for example, any of the same substituents that may be introduced in the groups represented by $R_{15}$ and $R_{21}$ to $R_{23}$. In the formulae, n is an integer of 0 to 4, and n2 is an integer of 0 to 3.

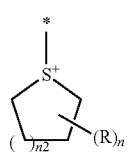

(IV-1)

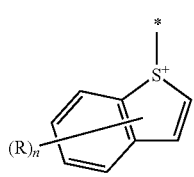

(IV-2)

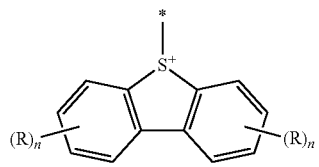

(IV-3)

Among the cations of general formula (ZA-1-1B), as preferred cation structures, there can be mentioned the following cation structures (ZI-1) to (ZI-3).

The cation structure (ZI-1) refers to the structure of general formula (ZI-1) below.

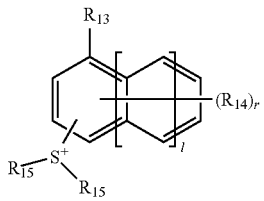

(ZI-1)

In general formula (ZI-1), $R_{13}$ represents a hydrogen atom, a fluorine atom, a hydroxyl group, an alkyl group, a monovalent aliphatic hydrocarbon ring group, an alkoxy group, an alkoxycarbonyl group or a group with a mono- or polycycloalkyl skeleton.

$R_{14}$, or each of $R_{14}$s independently, represents an alkyl group, a monovalent aliphatic hydrocarbon ring group, an alkoxy group, an alkylsulfonyl group, a cycloalkylsulfonyl group, a hydroxyl group or a group with a mono- or polycycloalkyl skeleton.

Each of $R_{15}$s independently represents an alkyl group, a monovalent aliphatic hydrocarbon ring group or an aryl group, provided that two $R_{15}$s may be bonded to each other to thereby form a ring.

In the formula, 1 is an integer of 0 to 2, and r is an integer of 0 to 8.

In general formula (ZI-1), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are more preferred.

Each of the monovalent aliphatic hydrocarbon ring groups represented by $R_{13}$, $R_{14}$ and $R_{15}$ may be monocyclic or polycyclic, and preferably has 3 to 12 carbon atoms. As such, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, bicycloheptyl(norbornyl), adamantyl or the like. Cyclopropyl, cyclopentyl, cyclohexyl and cyclooctyl are preferred. It is preferred for the monovalent aliphatic hydrocarbon ring group to be a cycloalkyl group.

The aryl group represented by $R_{15}$ is preferably an aryl group having 6 to 14 carbon atoms, more preferably a phenyl group or a naphthyl group.

The alkoxy groups represented by $R_{13}$ and $R_{14}$ may be linear, branched or cyclic and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ is linear or branched, preferably having 2 to 11 carbon atoms, and can be, for example, any of the alkyl groups represented by $R_{13}$, $R_{14}$ and $R_{15}$ that are substituted with an oxycarbonyl group. As such, there can be mentioned a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are more preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

The alkylsulfonyl and cycloalkylsulfonyl groups represented by $R_{14}$ may be linear, branched or cyclic and preferably each having 1 to 10 carbon atoms, and can be, for example, any of the alkyl groups represented by $R_{13}$, $R_{14}$ and $R_{15}$ that are substituted with a sulfonyl group. As such, there can be mentioned a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are more preferred.

Substituents may further be introduced in the groups represented by $R_{13}$, $R_{14}$ and $R_{15}$. As optionally introduced substituents, there can be mentioned an alkyl group, such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group or an isoamyl group; a monovalent aliphatic hydrocarbon ring group (may be monocyclic or polycyclic, preferably having 3 to 20 carbon atoms, more preferably 5 to 8 carbon atoms); a hydroxyl group; a halogen atom (fluorine, chlorine, bromine or iodine); a nitro group; a cyano group; an amido group; a sulfonamido group; an alkoxy group; an alkoxyalkyl group; an alkoxycarbonyl group; an alkoxycarbonyloxy group; an acyl group, such as a formyl group, an acetyl group or a benzoyl group; an acyloxy group, such as an acetoxy group or a butyryloxy group; a carboxyl group; and the like As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

As the ring structure that may be formed by the mutual bonding of two $R_{15}$s, there can be mentioned a 5-membered or 6-membered ring, especially preferably a 5-membered ring (namely, a tetrahydrothiophene ring), formed by a bivalent group resulting from the bonding of two $R_{15}$s in cooperation with the sulfur atom in general formula (ZI-1). The ring may be condensed with an aryl group or an aliphatic hydrocarbon ring group (preferably a cycloalkyl group). A substituent may be introduced in this bivalent group. As the substituent, there can be mentioned, for example, an alkyl group, a cycloalkyl group, a hydroxyl group, a carboxyl group, a cyano group, a nitro group, an alkoxy group, an alkoxyalkyl group, an alkoxycarbonyl group, an alkoxycarbonyloxy group or the like.

In general formula (ZI-1), $R_{15}$ is preferably a methyl group, an ethyl group, a naphthyl group, a bivalent group resulting from the mutual bonding of two $R_{15}$s that forms a tetrahydrothiophene ring structure in cooperation with a sulfur atom, or the like.

As aforementioned, substituents may be introduced in the alkyl group, monovalent aliphatic hydrocarbon ring group, alkoxy group and alkoxycarbonyl group represented by $R_{13}$ and the alkyl group, monovalent aliphatic hydrocarbon ring group, alkoxy group, alkylsulfonyl group and cycloalkylsulfonyl group represented by $R_{14}$. Preferred substituents are a hydroxyl group, an alkoxy group, an alkoxycarbonyl group and a halogen atom (especially a fluorine atom).

Preferred particular examples of the cation structures of general formula (ZI-1) are shown below.

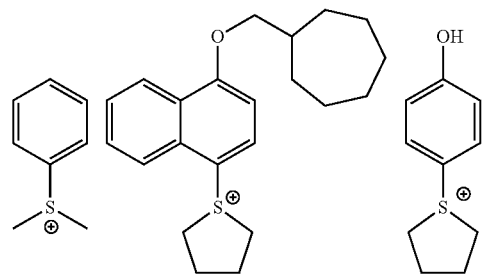

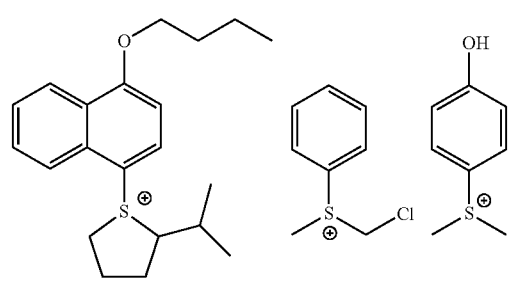

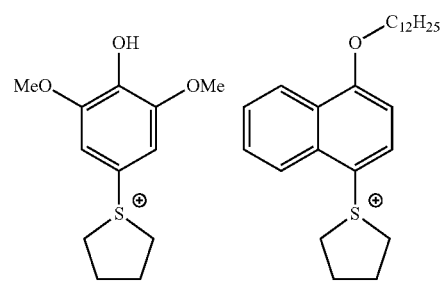

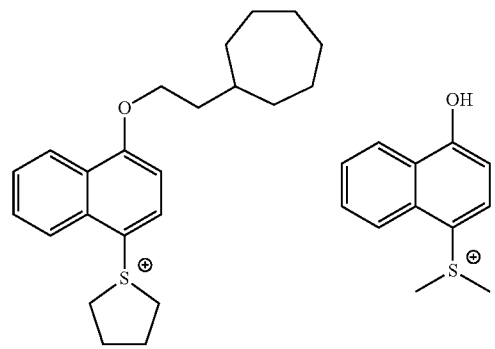

-continued

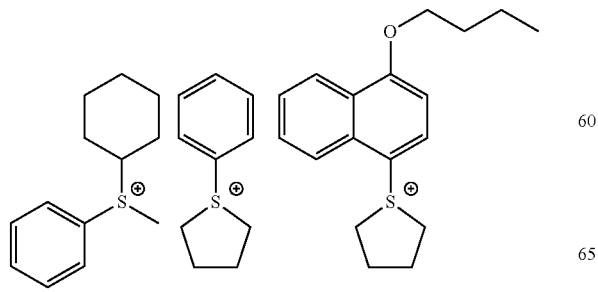

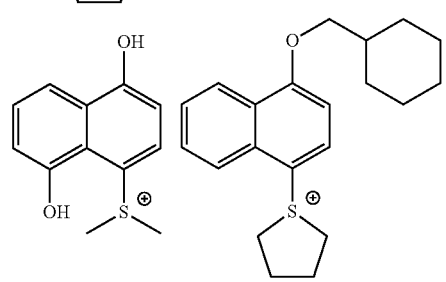

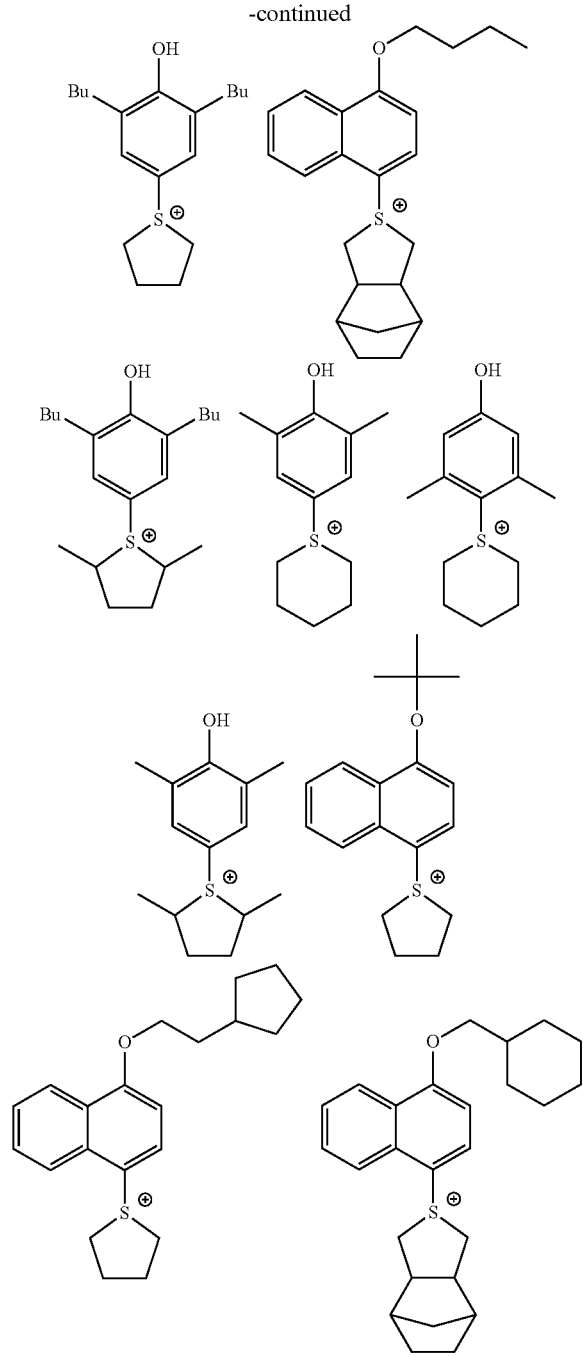

The cation structure (ZI-2) refers to the structure of general formula (ZI-2) below.

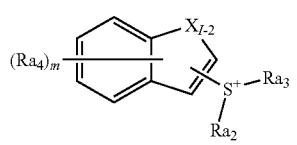

In general formula (ZI-2), $X_{I-2}$ represents an oxygen atom, a sulfur atom or any of the groups of the formula —NRa$_1$-, in which Ra$_1$ represents a hydrogen atom, an alkyl group, a monovalent aliphatic hydrocarbon ring group, an aryl group or an acyl group.

Each of Ra$_2$ and Ra$_3$ independently represents an alkyl group, a monovalent aliphatic hydrocarbon ring group, an alkenyl group or an aryl group, provided that Ra$_2$ and Ra$_3$ may be bonded to each other to thereby form a ring.

Ra$_4$, or each of Rags independently, represents a monovalent group.

In the formula, m is an integer of 0 to 3.

Each of the alkyl groups represented by Ra$_1$ to Ra$_3$ is preferably a linear or branched alkyl group having 1 to 20 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group or the like.

Each of the monovalent aliphatic hydrocarbon ring groups represented by Ra$_1$ to Ra$_3$ is preferably a monovalent aliphatic hydrocarbon ring group having 3 to 20 carbon atoms. As such, there can be mentioned, for example, a cyclopropyl group, a cyclobutyl group, a cyclopentyl group, a cyclohexyl group, a cyclooctyl group, an adamantyl group, a norbornyl group, an isobornyl group, a camphonyl group, a dicyclopentyl group, an α-pinanyl group, a tricyclodecanyl group, a tetracyclododecyl group, an androstanyl group or the like. It is preferred for the monovalent aliphatic hydrocarbon ring group to be a cycloalkyl group.

Each of the aryl groups represented by Ra$_1$ to Ra$_3$ is preferably an aryl group having 6 to 10 carbon atoms. As such, there can be mentioned, for example, a phenyl group, a naphthyl group or the like.

The acyl group represented by Ra$_1$ is preferably one having 2 to 20 carbon atoms. As such, there can be mentioned, for example, a formyl group, an acetyl group, a propanoyl group, a butanoyl group, a pivaloyl group, a benzoyl group or the like.

Each of the alkenyl groups represented by Ra$_2$ and Ra$_3$ is preferably an alkenyl group having 2 to 15 carbon atoms. As such, there can be mentioned, for example, a vinyl group, an allyl group, a butenyl group, a cyclohexenyl group or the like.

The ring structure that may be formed by the mutual bonding of Ra$_2$ and Ra$_3$ is preferably a group forming a 5- or 6-membered ring, especially a 5-membered ring (for example, a tetrahydrothiophene ring) in cooperation with the sulfur atom in general formula (ZI-2), in which an oxygen atom may be contained. As such, there can be mentioned, for example, the same ring as may be formed by the mutual linkage of $R_{15}$s in general formula (ZI-1).

As the monovalent group represented by Ra$_4$, there can be mentioned, for example, an alkyl group (preferably 1 to 20 carbon atoms), a monovalent aliphatic hydrocarbon ring group (preferably 3 to 20 carbon atoms, more preferably a cycloalkyl group having 3 to 20 carbon atoms), an aryl group (preferably 6 to 10 carbon atoms), an alkoxy group (preferably 1 to 20 carbon atoms), an acyl group (preferably 2 to 20 carbon atoms), an acyloxy group (preferably 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, an alkenylcarbonyl group or the like.

Ra$_1$ is preferably an alkyl group, more preferably an alkyl group having 1 to 4 carbon atoms.

Preferably, $Ra_2$ and $Ra_3$ are connected to each other to thereby form a 5- or 6-membered ring.

Substituents may further be introduced in the groups represented by $Ra_1$ to $Ra_4$. As optionally introduced further substituents, there can be mentioned those set forth above as being optionally introduced in the groups represented by $R_{13}$ to $R_{15}$ in general formula (ZI-1).

Preferred particular examples of the cation structures (ZI-2) are shown below.

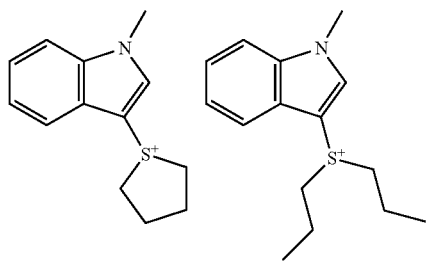

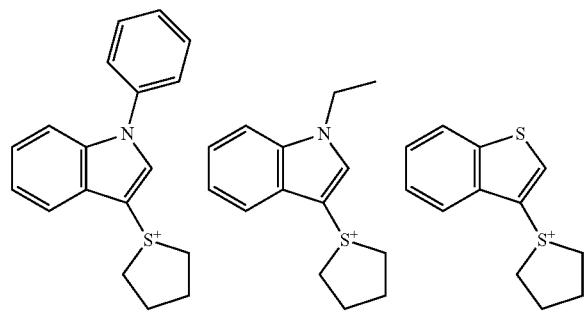

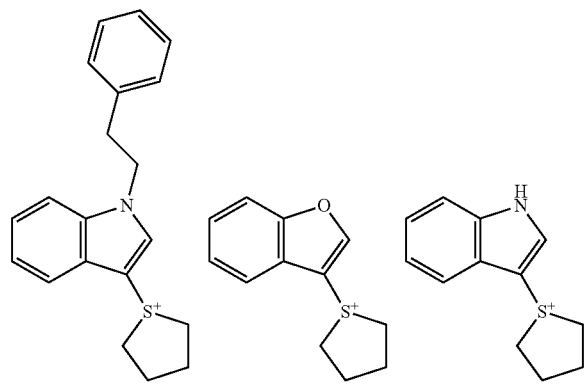

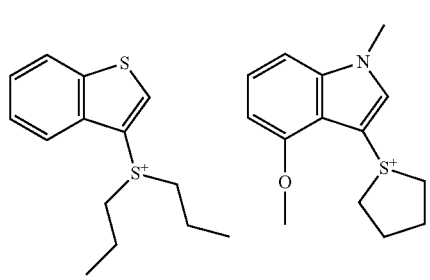

The cation structure (ZI-3) refers to the structure of general formula (ZI-3) below.

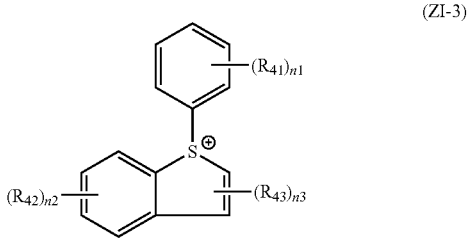

(ZI-3)

In general formula (ZI-3), each of $R_{41}$ to $R_{43}$ independently represents an alkyl group, an acetyl group, an alkoxy group, a carboxyl group, a halogen atom, a hydroxyl group or a hydroxyalkyl group.

As the alkyl group and alkoxy group represented by $R_{41}$ to $R_{43}$, there can be mentioned those set forth above in connection with $R_{13}$ to $R_{15}$ in general formula (ZI-1).

The hydroxyalkyl group is preferably any of the above alkyl groups wherein one or a plurality of hydrogen atoms are replaced by hydroxyl groups. As such, there can be mentioned a hydroxymethyl group, a hydroxyethyl group, a hydroxypropyl group or the like.

In the formula, n1 is an integer of 0 to 3, preferably 1 or 2 and more preferably 1;

n2 is an integer of 0 to 3, preferably 0 or 1 and more preferably 0; and n3 is an integer of 0 to 2, preferably 0 or 1 and more preferably 1.

Substituents may further be introduced in the groups represented by $R_{41}$ to $R_{43}$. As optionally introduced further substituents, there can be mentioned those set forth above as being optionally introduced in the groups represented by $R_{13}$ to $R_{15}$ in general formula (ZI-1).

Preferred particular examples of the cation structures (ZI-3) are shown below.

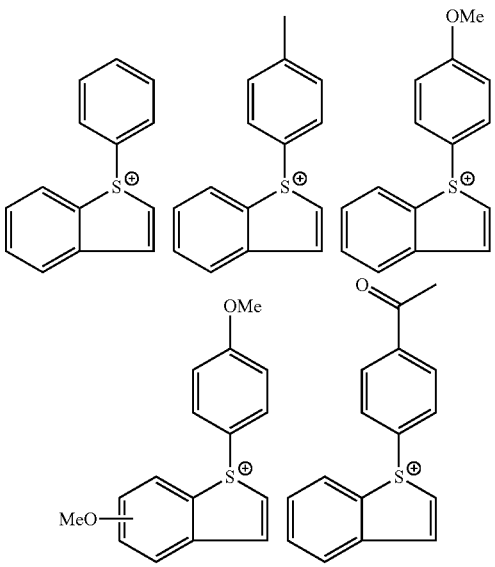

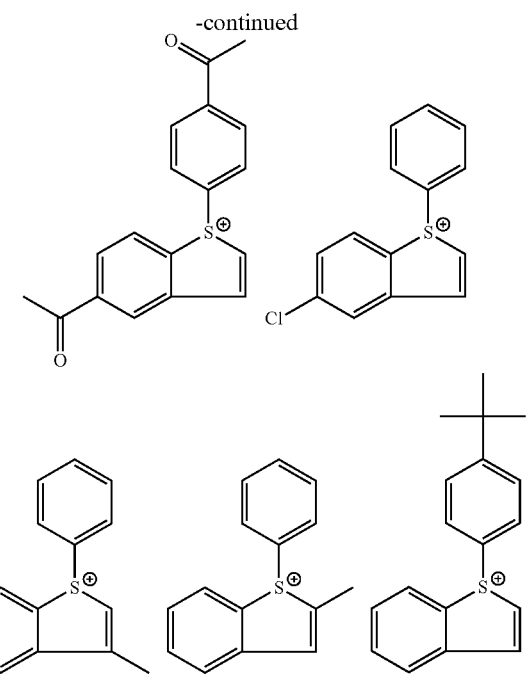

Among the cation structures of general formulae (ZI-1) to (ZI-3), the structures of general formulae (ZI-1) and (ZI-2) are preferred. The structure of general formula (ZI-1) is more preferred.

The groups (ZA-1-2) will be described below.

The groups (ZA-1-2) refer to the groups of general formula (ZA-1) wherein each of $R_{201}$ to $R_{203}$ independently represents an organic group containing no aromatic ring. Herein, the aromatic ring includes one containing a heteroatom.

Each of the organic groups containing no aromatic ring represented by $R_{201}$ to $R_{203}$ generally has 1 to 30 carbon atoms, preferably 1 to 20 carbon atoms.

Preferably, each of $R_{201}$ to $R_{203}$ independently is an alkyl group, a monovalent aliphatic hydrocarbon ring group, an allyl group or a vinyl group. A linear or branched 2-oxoalkyl group, 2-oxo aliphatic hydrocarbon ring group and alkoxycarbonylmethyl group are more preferred. A linear or branched 2-oxo aliphatic hydrocarbon ring group is most preferred.

As preferred alkyl groups and aliphatic hydrocarbon ring groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and an aliphatic hydrocarbon ring group having 3 to 10 carbon atoms (for example, a cyclopentyl group, a cyclohexyl group or a norbornyl group). The alkyl group is more preferably a 2-oxoalkyl group or an alkoxycarbonylmethyl group. The aliphatic hydrocarbon ring group is more preferably a 2-oxo aliphatic hydrocarbon ring group. It is preferred for the aliphatic hydrocarbon ring group to be a cycloalkyl group.

The 2-oxoalkyl group may be linear or branched. Preferably, it is any of the above alkyl groups in which >C=O is introduced in the 2-position thereof.

Preferably, the 2-oxo aliphatic hydrocarbon ring group is any of the above aliphatic hydrocarbon ring groups in which >C=O is introduced in the 2-position thereof. It is preferred for the 2-oxo aliphatic hydrocarbon ring group to be a 2-oxocycloalkyl group.

As preferred alkoxy groups contained in the alkoxycarbonylmethyl groups, there can be mentioned alkoxy groups each having 1 to 5 carbon atoms (a methoxy group, an ethoxy group, a propoxy group, a butoxy group and a pentoxy group).

These $R_{201}$ to $R_{203}$ may further be substituted with a halogen atom, an alkoxy group (for example, 1 to 5 carbon atoms), a hydroxyl group, a cyano group or a nitro group.

The groups (ZA-1-3) will be described below.

The groups (ZA-1-3) refer to the groups of general formula below, that each have a phenacylsulfonium cation structure.

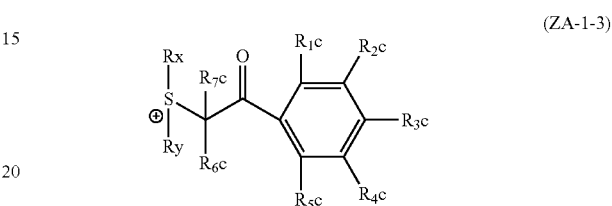

In general formula (ZA-1-3), each of $R_{1c}$ to $R_{5c}$ independently represents a hydrogen atom, an alkyl group, a monovalent aliphatic hydrocarbon ring group, an alkoxy group, a phenylthio group or a halogen atom.

Each of $R_{6c}$ and $R_{7c}$ independently represents a hydrogen atom, an alkyl group or a monovalent aliphatic hydrocarbon ring group.

Each of $R_x$ and $R_y$ independently represents an alkyl group, a monovalent aliphatic hydrocarbon ring group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond. As the group formed by bonding of any two or more of $R_{1c}$ to $R_{5c}$, and $R_{b6}$ and $R_{7c}$, and $R_x$ and $R_y$, there can be mentioned a butylene group, a pentylene group or the like.

Each of the alkyl groups represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group).

Each of the monovalent aliphatic hydrocarbon ring groups represented by $R_{1c}$ to $R_{7c}$ may be monocyclic or polycyclic. As such, there can be mentioned, for example, a monovalent aliphatic hydrocarbon ring group having 3 to 8 carbon atoms (for example, a cyclopentyl group or a cyclohexyl group). It is preferred for the monovalent aliphatic hydrocarbon ring group to be a cycloalkyl group.

Each of the alkoxy groups represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a monovalent aliphatic hydrocarbon ring group or a linear, branched or cyclic alkoxy group. More preferably, the sum of carbon atoms of $R_{1c}$ to $R_{5c}$ is in the range of 2 to 15. These contribute toward an enhancement of solvent solubility and inhibition of particle generation during storage.

As the alkyl groups and monovalent aliphatic hydrocarbon ring groups represented by $R_x$ and $R_y$, there can be mentioned the same alkyl groups and monovalent aliphatic hydrocarbon ring groups as mentioned above with respect to $R_{1c}$ to $R_{7c}$. Among them, a 2-oxoalkyl group, a 2-oxo aliphatic hydrocarbon ring group and an alkoxycarbonylmethyl group are preferred.

As the 2-oxoalkyl group and 2-oxo aliphatic hydrocarbon ring group, there can be mentioned any of the alkyl groups and aliphatic hydrocarbon ring groups represented by $R_{1c}$ to $R_{7c}$ in which $>C=O$ is introduced at the 2-position thereof.

As the alkoxy group contained in the alkoxycarbonylmethyl group, there can be mentioned any of the same alkoxy groups as set forth above with respect to $R_{1c}$ to $R_{5c}$.

Each of $R_x$ and $R_y$ is preferably an alkyl group or monovalent aliphatic hydrocarbon ring group having preferably 4 or more carbon atoms. The alkyl group or monovalent aliphatic hydrocarbon ring group more preferably has 6 or more carbon atoms, further more preferably 8 or more carbon atoms.

The ring structure that may be formed by the mutual bonding of $R_x$ and $R_y$ is a 5- or 6-membered ring, especially preferably a 5-membered ring (namely, a tetrahydrothiophene ring) formed by bivalent $R_x$ and $R_y$ (for example, a methylene group, an ethylene group, a propylene group or the like) in cooperation with the sulfur atom in general formula (ZA-1-3).

Now, general formula (ZA-2) will be described.

In general formula (ZA-2), each of $R_{204}$ and $R_{205}$ independently represents an aryl group, an alkyl group or a monovalent aliphatic hydrocarbon ring group.

Each of the aryl groups represented by $R_{204}$ and $R^{205}$ is preferably a phenyl group or a naphthyl group, more preferably a phenyl group. Each of the aryl groups represented by $R_{204}$ and $R_{205}$ may be one having a heterocyclic structure containing an oxygen atom, a nitrogen atom, a sulfur atom or the like. As the aryl group having a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like.

As preferred alkyl groups and monovalent aliphatic hydrocarbon ring groups represented by $R_{204}$ and $R_{205}$, there can be mentioned a linear or branched alkyl group having 1 to 10 carbon atoms (for example, a methyl group, an ethyl group, a propyl group, a butyl group or a pentyl group) and a monovalent aliphatic hydrocarbon ring group having 3 to 10 carbon atoms (a cyclopentyl group, a cyclohexyl group or a norbornyl group). It is preferred for the monovalent aliphatic hydrocarbon ring group to be a cycloalkyl group.

Substituents may be introduced in the aryl groups, alkyl groups and monovalent aliphatic hydrocarbon ring groups represented by $R_{204}$ and $R_{205}$. As substituents introducible in the aryl groups, alkyl groups and monovalent aliphatic hydrocarbon ring groups represented by $R_{204}$ and $R_{205}$, there can be mentioned, for example, an alkyl group (for example, 1 to 15 carbon atoms), a monovalent aliphatic hydrocarbon ring group (for example, 3 to 15 carbon atoms, preferably a cycloalkyl group having 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

It is preferred for the acid generator (A1) to be, for example, any of compounds of general formula (II) below. In general formula (II), $R^2$, n and $X^+$ are the same as $R^1$, n and $X^+$ defined above in connection with general formula (III).

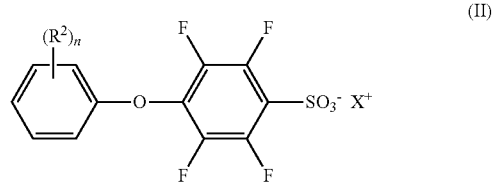

Particular examples of the cations $X^+$ constituting onium salts suitable as compounds (A1) of general formula (III) are shown below.

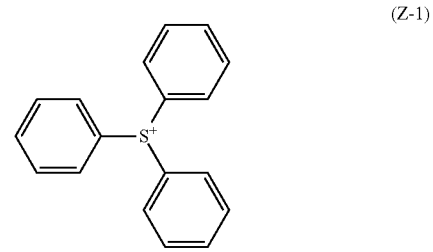

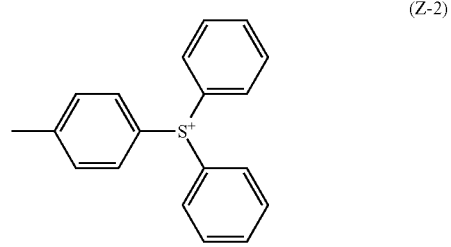

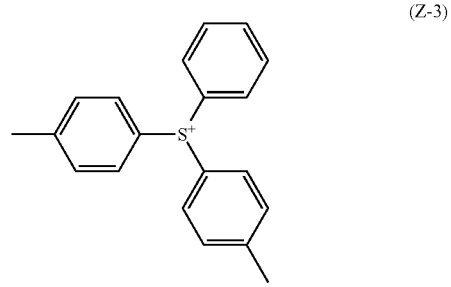

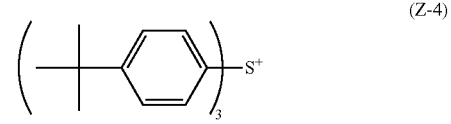

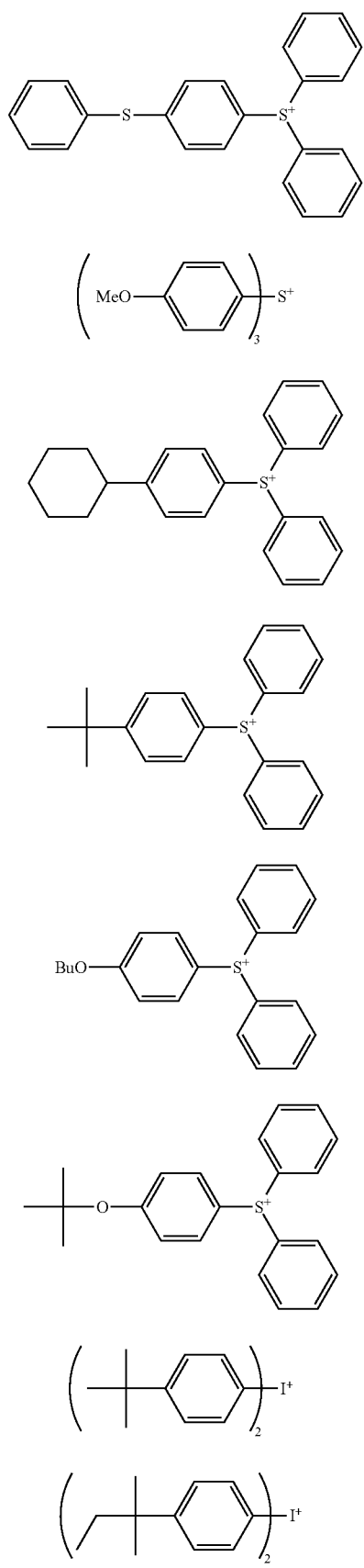
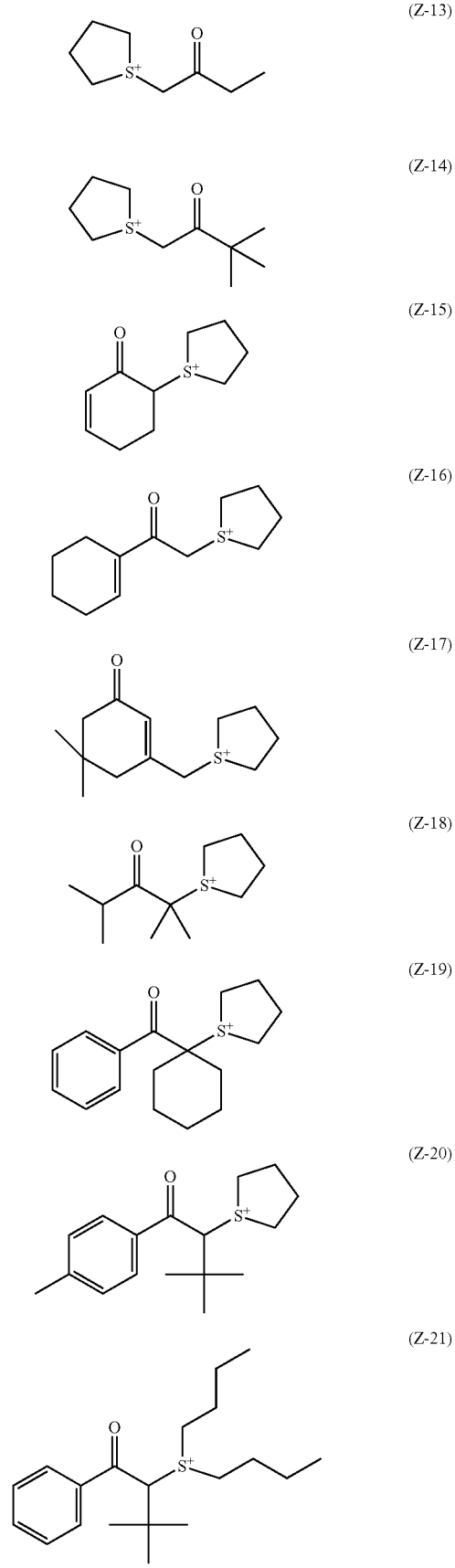

-continued
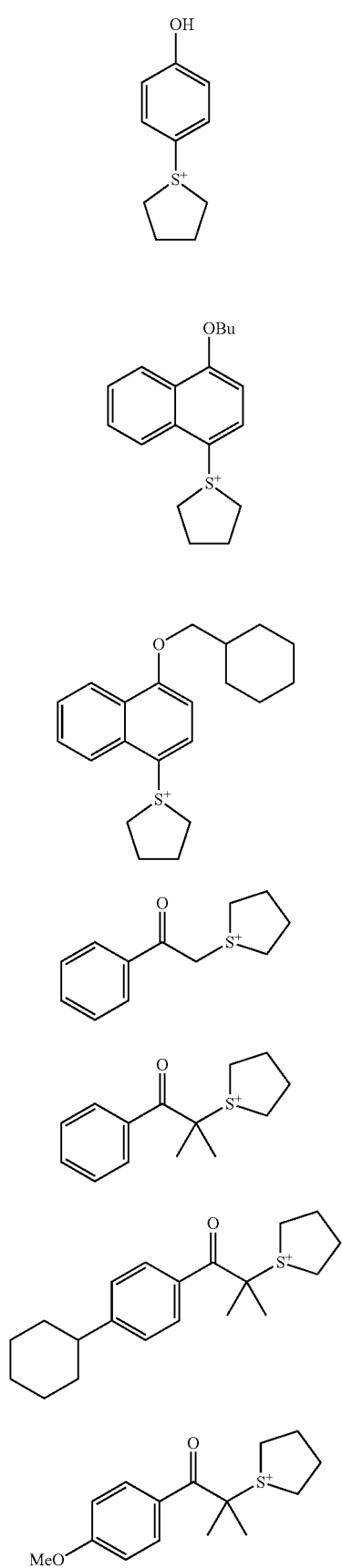
(Z-22)
(Z-23)
(Z-24)
(Z-25)
(Z-26)
(Z-27)
(Z-28)
-continued
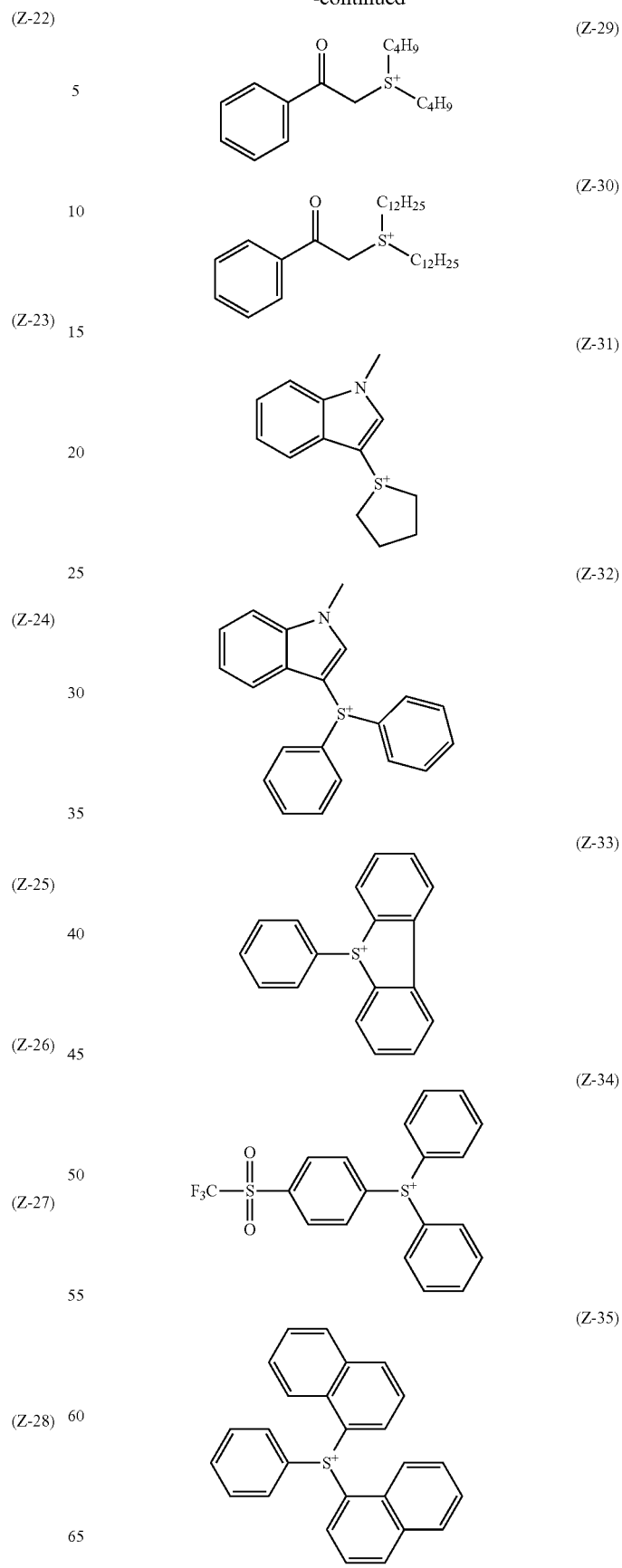
(Z-29)
(Z-30)
(Z-31)
(Z-32)
(Z-33)
(Z-34)
(Z-35)

-continued
(Z-36)
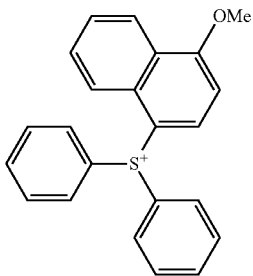
(Z-37)
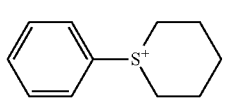
(Z-38)
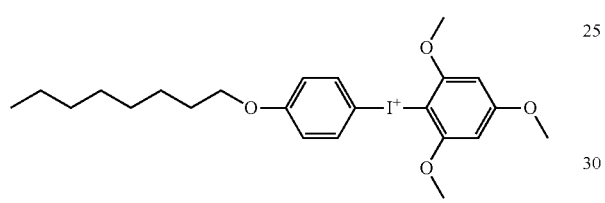
(Z-39)
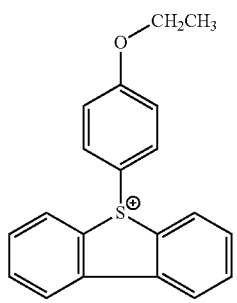
(Z-40)
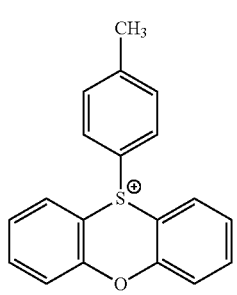
(Z-41)
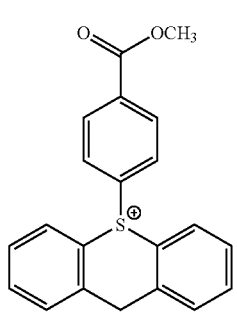
-continued
(Z-42)
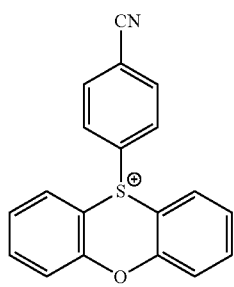
(Z-43)
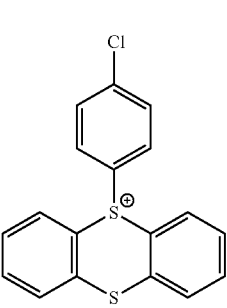
(Z-44)
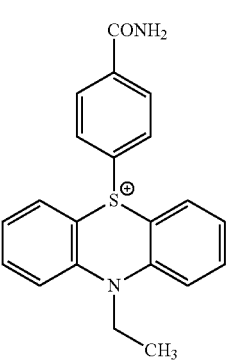
(Z-45)
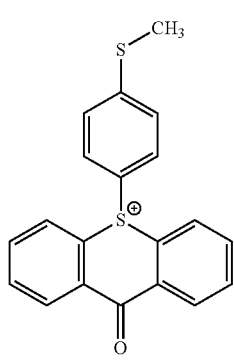

(Z-46)
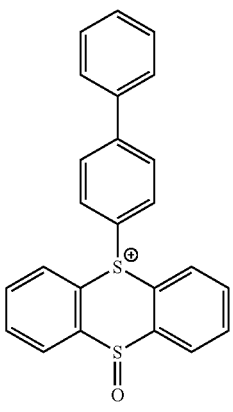
(Z-47)
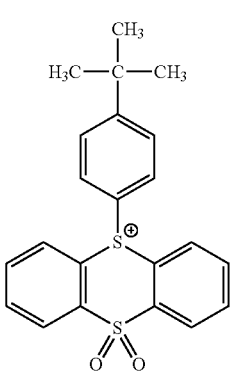
(Z-48)
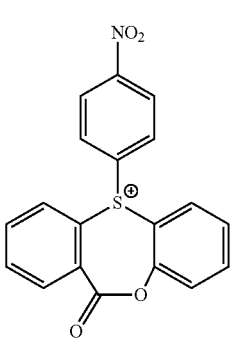
(Z-49)
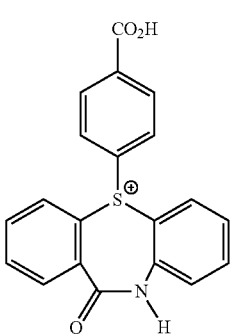
(Z-50)
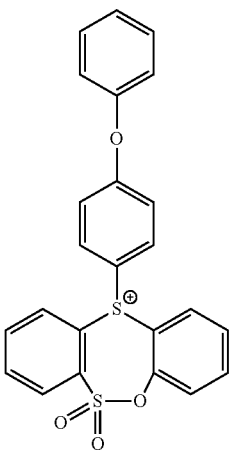
(Z-51)
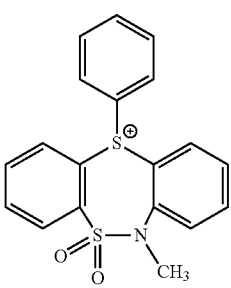
(Z-52)
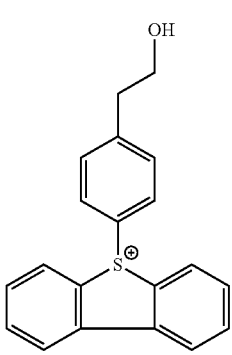
(Z-53)
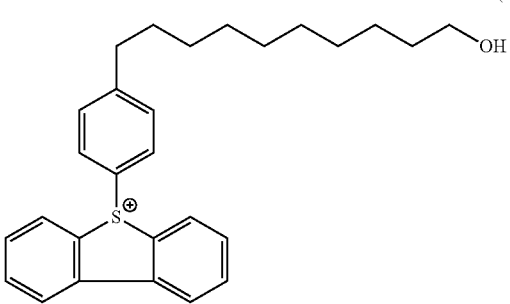

-continued
(Z-54)
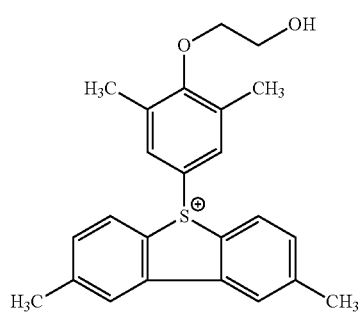
(Z-55)
(Z-58)
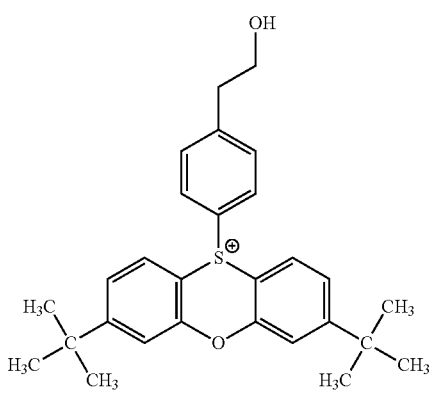
(Z-59)
(Z-56)
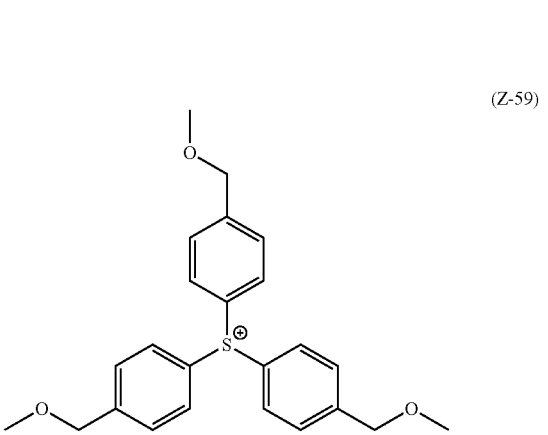
(Z-60)
(Z-61)
(Z-57)
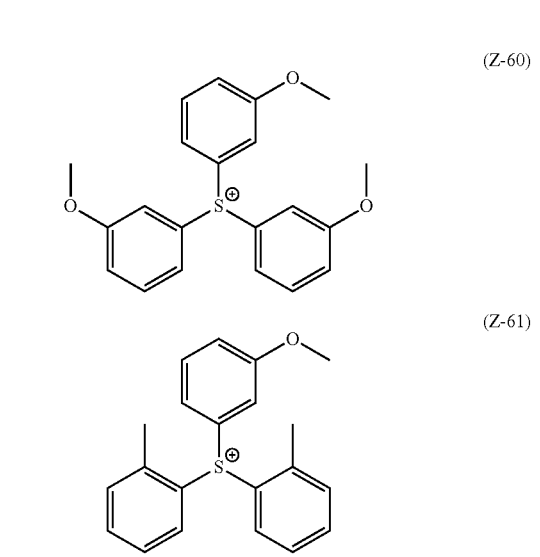
(Z-62)
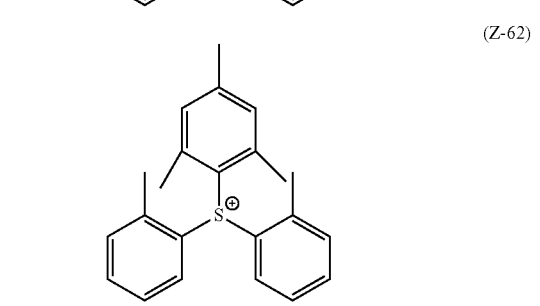

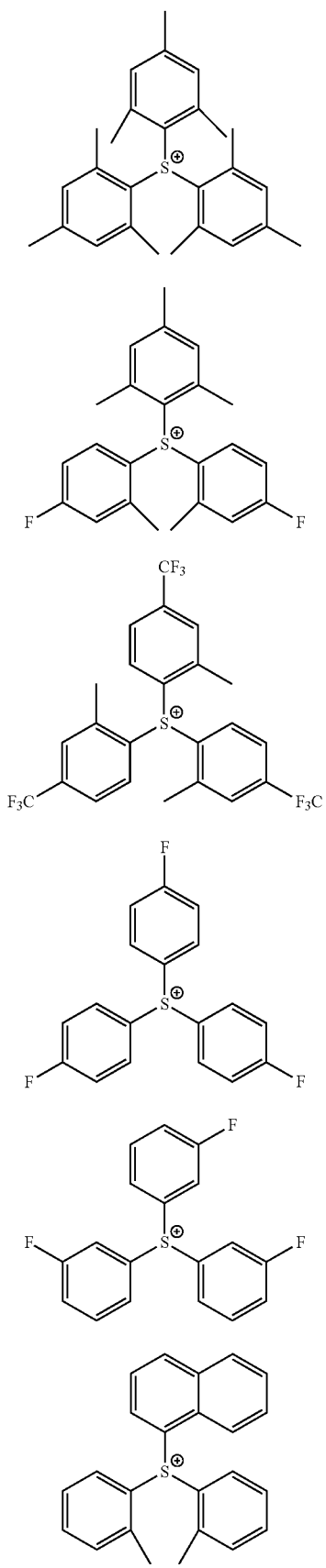
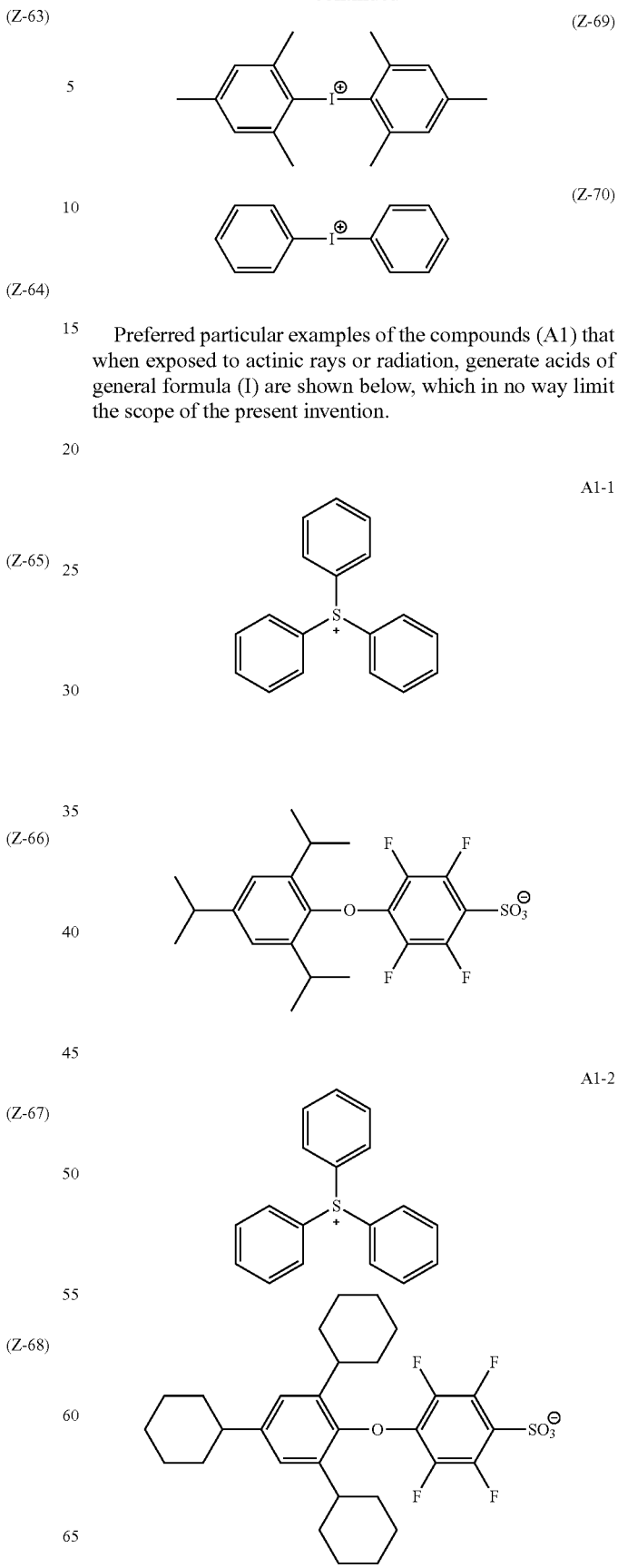
Preferred particular examples of the compounds (A1) that when exposed to actinic rays or radiation, generate acids of general formula (I) are shown below, which in no way limit the scope of the present invention.

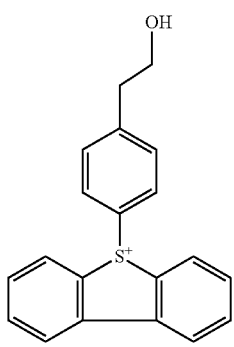
A1-3
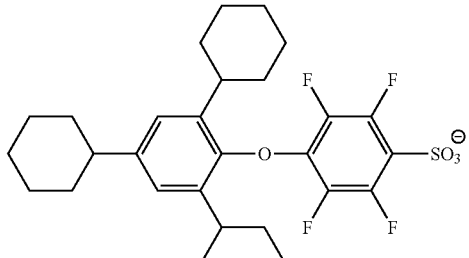
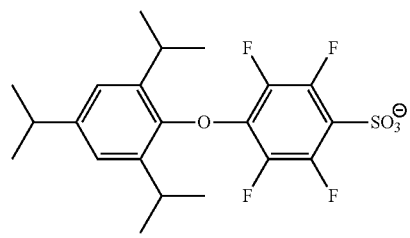
A1-7
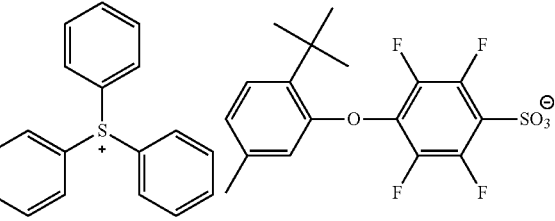
A1-4
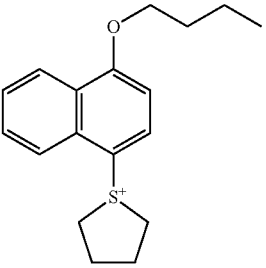
A1-8
A1-5
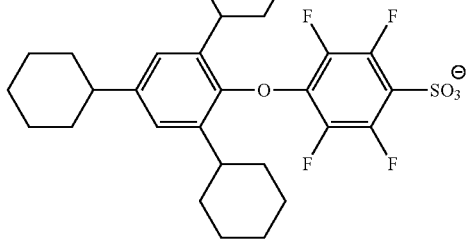
A1-6
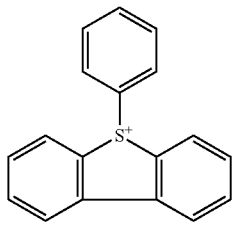
A1-9
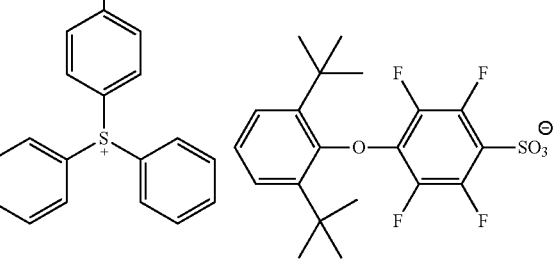

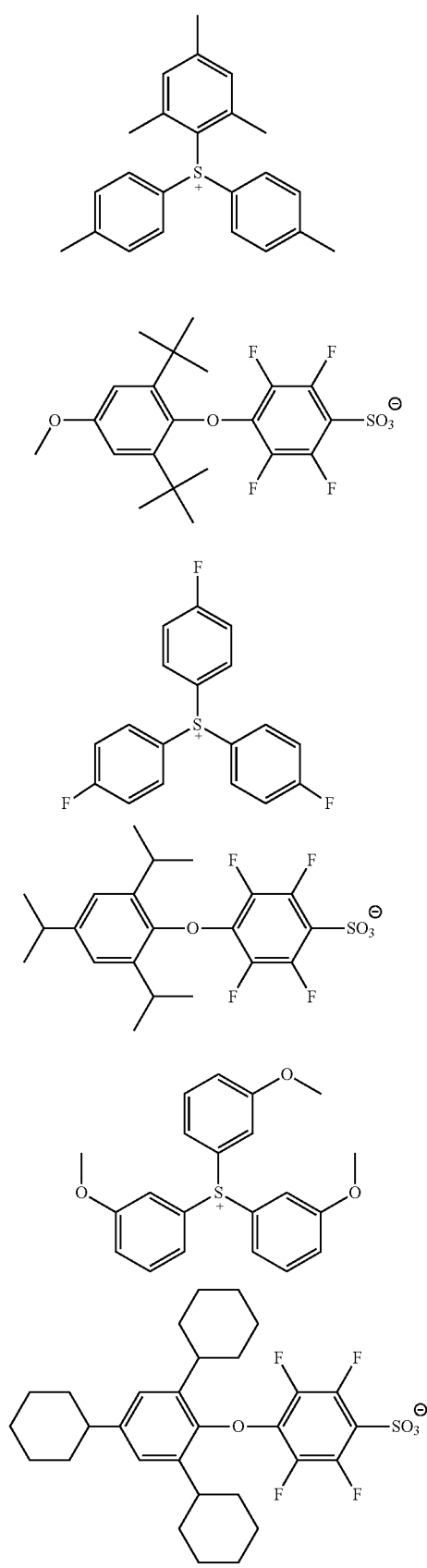
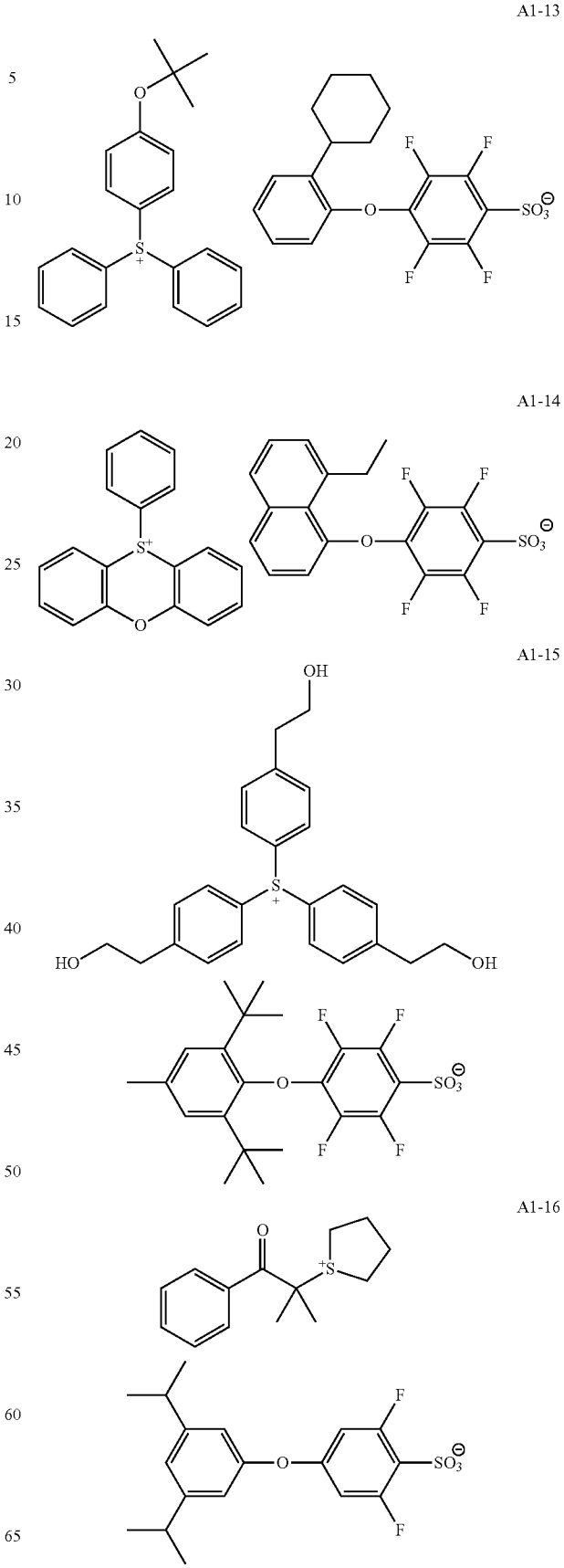

-continued
A1-17
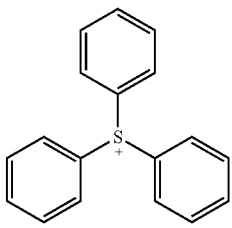
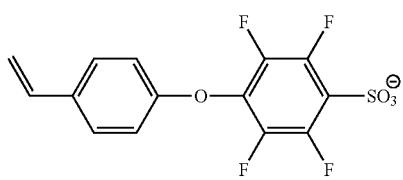
A1-18
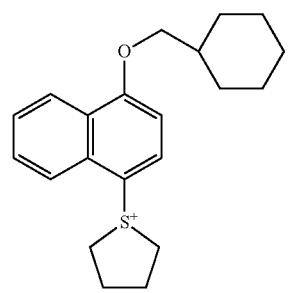
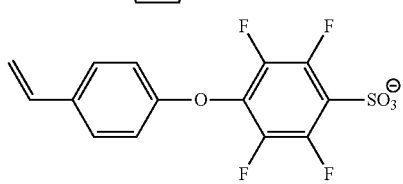
A1-19
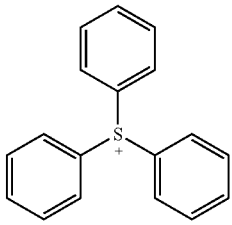
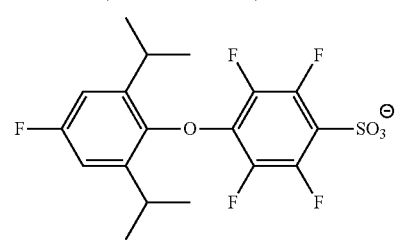
A1-20
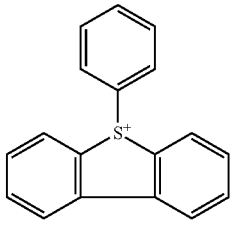
-continued
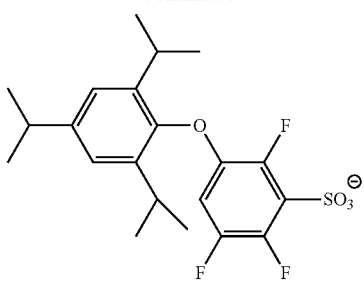
A1-21
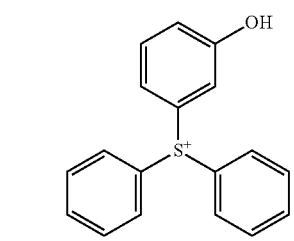
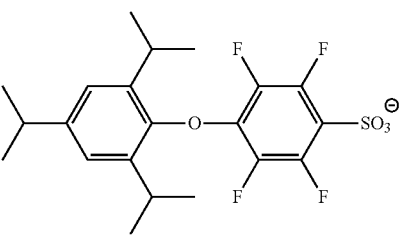
A1-22
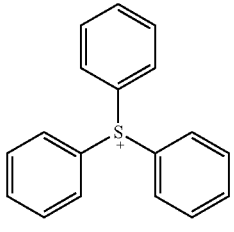
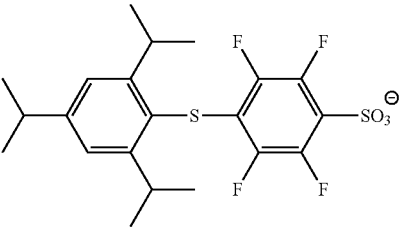
A1-23
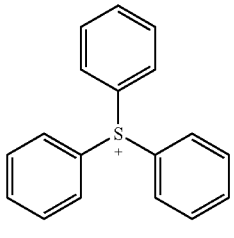

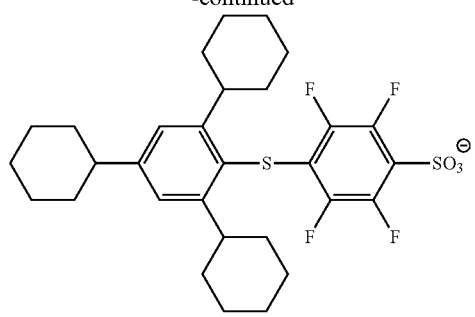
A1-24
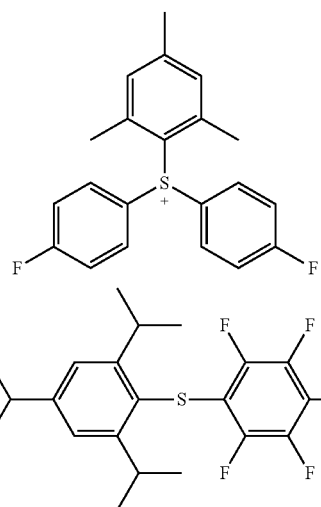
A1-25
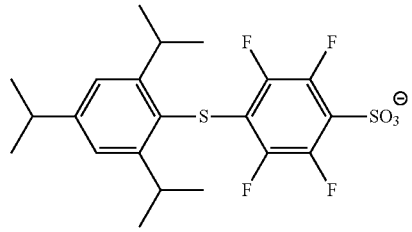
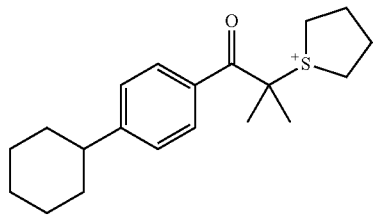
A1-26
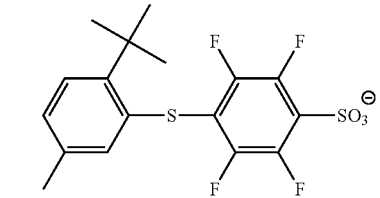
A1-27
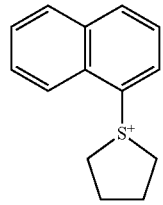
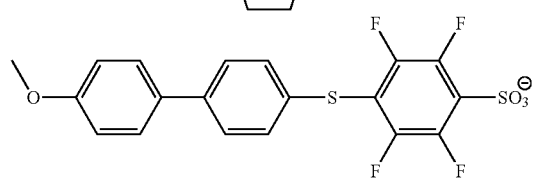
A1-28
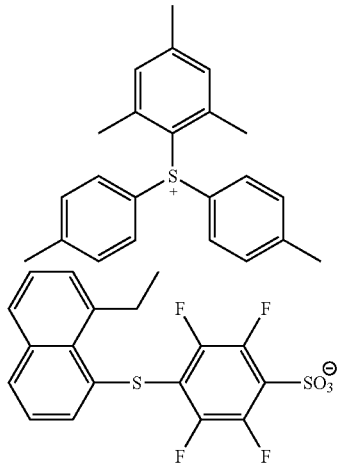
A1-29
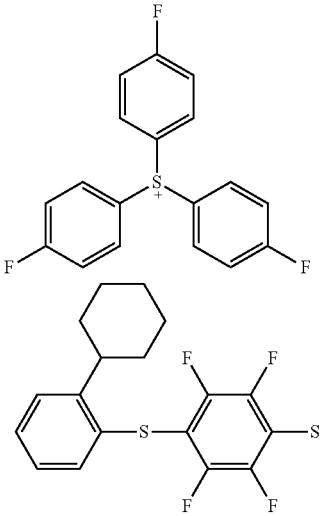
A1-30
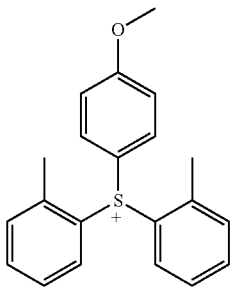

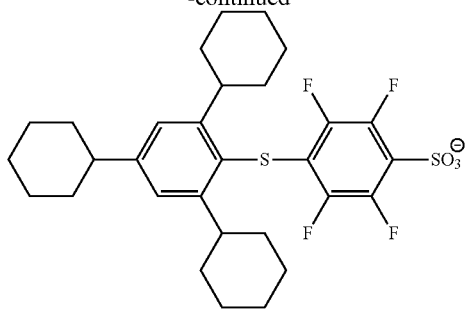
A1-31
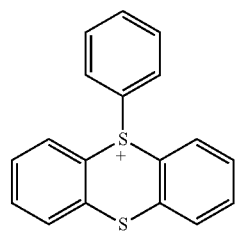
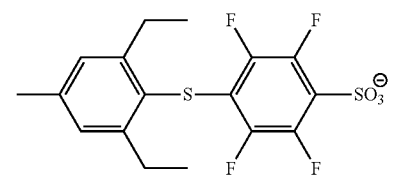
A1-32
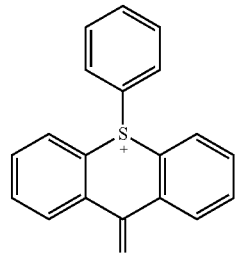
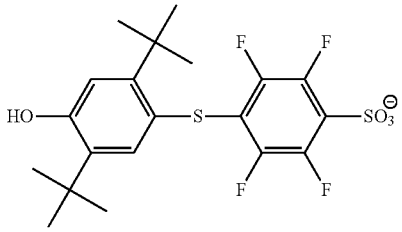
A1-33
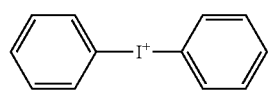
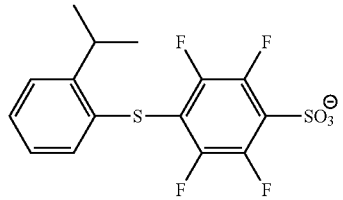
A1-34
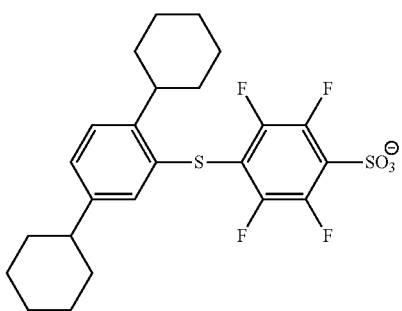
A1-35
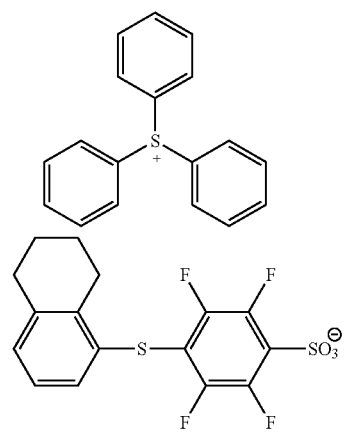
A1-36
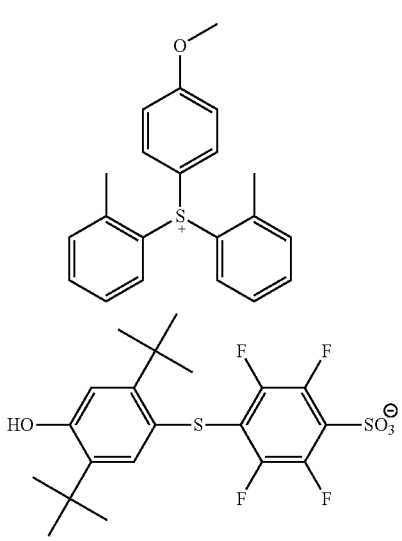

-continued

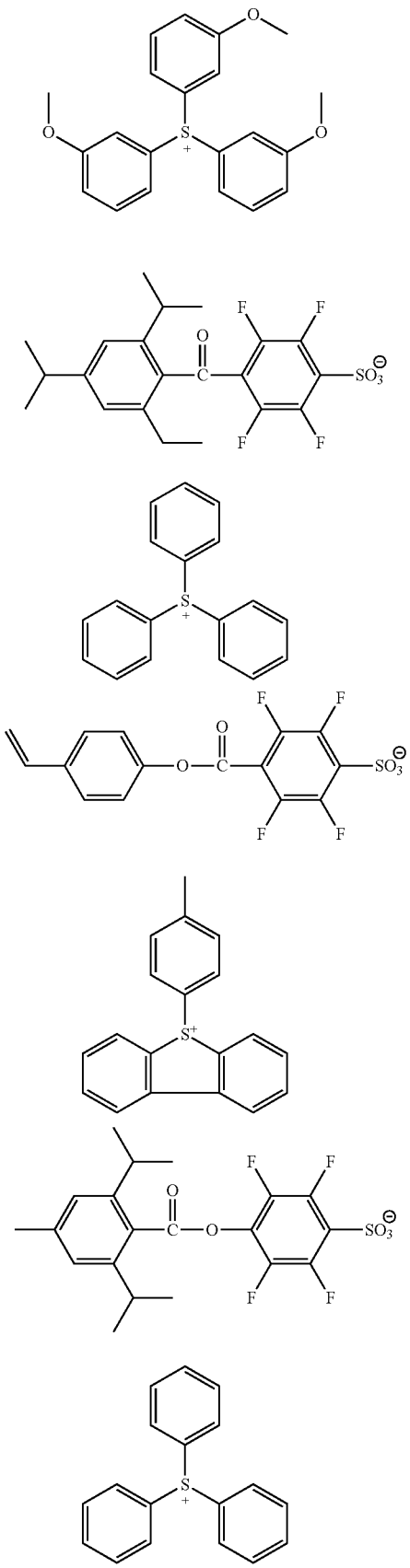

A1-37

A1-38

A1-39

A1-40

-continued

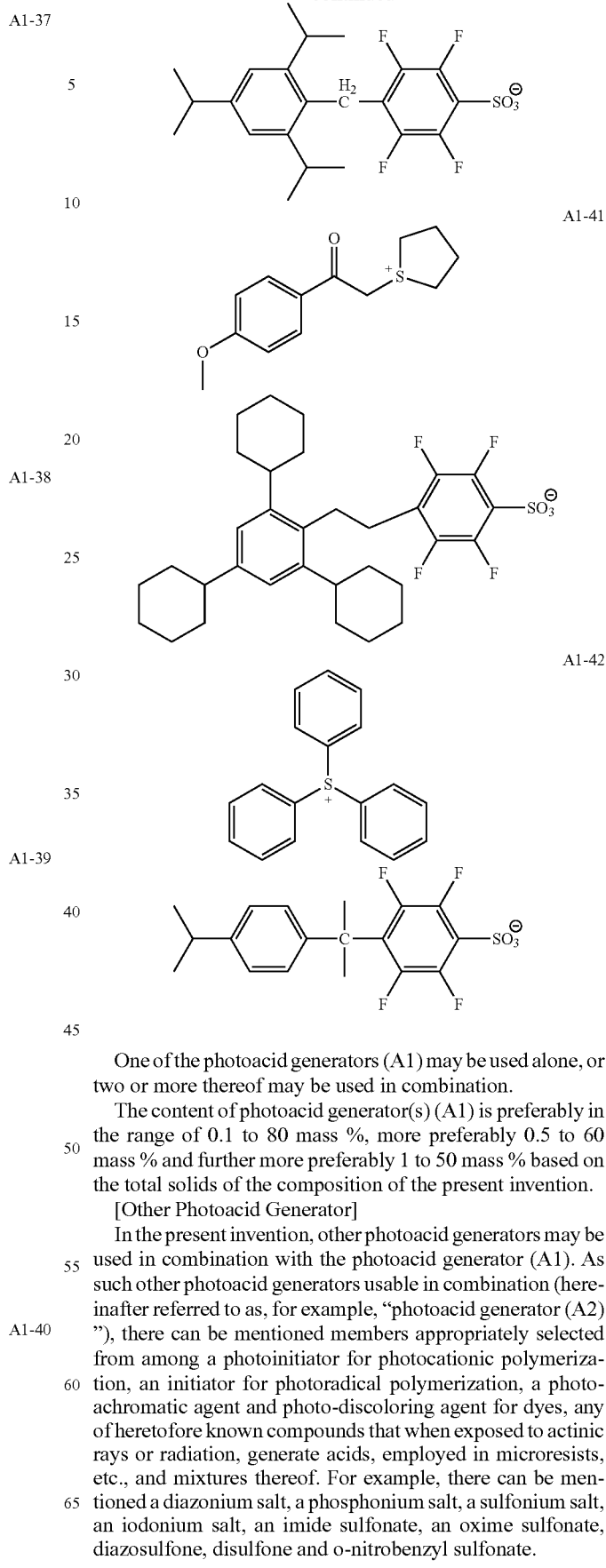

A1-41

A1-42

One of the photoacid generators (A1) may be used alone, or two or more thereof may be used in combination.

The content of photoacid generator(s) (A1) is preferably in the range of 0.1 to 80 mass %, more preferably 0.5 to 60 mass % and further more preferably 1 to 50 mass % based on the total solids of the composition of the present invention.

[Other Photoacid Generator]

In the present invention, other photoacid generators may be used in combination with the photoacid generator (A1). As such other photoacid generators usable in combination (hereinafter referred to as, for example, "photoacid generator (A2)"), there can be mentioned members appropriately selected from among a photoinitiator for photocationic polymerization, an initiator for photoradical polymerization, a photo-achromatic agent and photo-discoloring agent for dyes, any of heretofore known compounds that when exposed to actinic rays or radiation, generate acids, employed in microresists, etc., and mixtures thereof. For example, there can be mentioned a diazonium salt, a phosphonium salt, a sulfonium salt, an iodonium salt, an imide sulfonate, an oxime sulfonate, diazosulfone, disulfone and o-nitrobenzyl sulfonate.

[2] Resin that when Acted on by an Acid, is Decomposed to Thereby Increase its Solubility in an Alkali Developer The positive actinic-ray- or radiation-sensitive resin composition of the present invention may contain a resin (hereinafter also referred to as, for example, "acid-decomposable resin" or "resin (B)") that when acted on by an acid, is decomposed to thereby increase its solubility in an alkali developer. This resin (B) typically contains a group (hereinafter also referred to as an acid-decomposable group) that is decomposed by the action of an acid to thereby generate an alkali soluble group. This resin may contain the acid-decomposable group in either its principal chain or side chain, or both thereof. The resin containing the acid-decomposable group in its side chain is preferred.

The acid-decomposable group is preferably a group resulting from replacement of the hydrogen atom of an alkali-soluble group, such as a —COOH group or an —OH group, with a group leaving under the action of an acid. The group leaving under the action of an acid is most preferably an acetal group or a tertiary ester group.

As the matrix resin to which the acid-decomposable group is bonded as a side chain, there can be mentioned, for example, an alkali-soluble resin containing an —OH or —COOH group in its side chain. For example, such an alkali-soluble resin is as follows.

The alkali dissolution rate of the alkali-soluble resin as measured in a 0.261 N tetramethylammonium hydroxide (TMAH) (23° C.) is preferably 17 nm/sec or greater. The alkali dissolution rate is especially preferably 33 nm/sec or greater.

The alkali-soluble resins especially preferred from this viewpoint include alkali-soluble resins having hydroxystyrene structural units, such as o-, m- or p-poly(hydroxystyrene) and copolymers thereof, hydrogenated poly(hydroxystyrene), halogenated or alkylated poly(hydroxystyrene), poly(hydroxystyrene) having its part O-alkylated or O-acylated, styrene-hydroxystyrene copolymer, α-methylstyrene-hydroxystyrene copolymer and hydrogenated novolak resin and include alkali-soluble resins having carboxylated repeating units, such as those of (meth)acrylic acid and norbornene carboxylic acid.

As repeating units having an acid-decomposable group preferred in the present invention, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl (meth)acrylate and a dialkyl(1-adamantyl)methyl (meth)acrylate are more preferred.

The resin decomposed by the action of an acid to thereby increase its solubility in an alkali developer can be obtained by, for example, reaction of a precursor of a group leaving under the action of an acid with a resin, or by copolymerization of an alkali-soluble resin monomer to which a group leaving under the action of an acid is bonded with any of various monomers, as disclosed in, for example, European Patent 254853 and JP-A's H2-25850, H3-223860 and H4-251259.

When the composition of the present invention is to be exposed to KrF excimer laser beams, electron beams, X-rays or high-energy light rays of wavelength 50 nm or less (for example, EUV), it is preferred for the resin to contain a hydroxystyrene repeating unit. More preferably, the resin is a copolymer of hydroxystyrene/hydroxystyrene protected by a group leaving under the action of an acid, or a copolymer of hydroxystyrene/(meth)acrylic acid tertiary alkyl ester.

As such resins, there can be mentioned, for example, the resins containing repeating units of general formula (A) below.

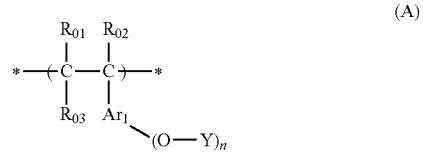

(A)

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group.

$Ar^1$ represents, for example, an aromatic ring group. Alternatively, $R_{03}$ and $Ar_1$ may be simultaneously alkylene groups and bonded to each other so as to form a 5-membered or 6-membered ring in cooperation with —C—C—.

In the formula, each of n Y's independently represents a hydrogen atom or a group that is eliminated by the action of an acid, provided that at least one of the Y's is a group that is eliminated by the action of an acid.

In the formula, n is an integer of 1 to 4, preferably 1 or 2 and more preferably 1.

As preferred alkyl groups represented by $R_{01}$ to $R_{03}$, there can be mentioned, for example, alkyl groups having up to 20 carbon atoms, such as a methyl group, an ethyl group, a propyl group, an isopropyl group, an n-butyl group, a sec-butyl group, a hexyl group, a 2-ethylhexyl group, an octyl group and a dodecyl group. Alkyl groups having up to 8 carbon atoms are more preferred. These alkyl groups may have a substituent.

The alkyl groups contained in the alkoxycarbonyl groups are preferably the same as the above-mentioned alkyl groups represented by $R_{01}$ to $R_{03}$.

The cycloalkyl groups may be monocyclic or polycyclic. As preferred examples thereof, there can be mentioned monocyclic alkyl groups having 3 to 8 carbon atoms, such as a cyclopropyl group, a cyclopentyl group and a cyclohexyl group. These cycloalkyl groups may have a substituent.

As the halogen atom, there can be mentioned a fluorine atom, a chlorine atom, a bromine atom or an iodine atom. A fluorine atom is preferred.

As preferred alkylene groups represented by $R_{03}$, there can be mentioned those having 1 to 8 carbon atoms, such as a methylene group, an ethylene group, a propylene group, a butylene group, a hexylene group and an octylene group.

The aromatic ring group represented by $Ar_1$ is preferably aromatic ring group having 6 to 14 carbon atoms. In particular, there can be mentioned a benzene ring, a toluene ring, a naphthalene ring or the like. These aromatic ring groups may have a substituent.

As the group (Y) that is eliminated by the action of an acid, there can be mentioned, for example, —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), —CH($R_{36}$)(Ar) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl groups represented by $R_{36}$ to $R_{39}$ and $R_{01}$ and $R_{02}$ each preferably have 1 to 8 carbon atoms. For example, there can be mentioned a methyl group, an ethyl group, a propyl group, an n-butyl group, a sec-butyl group, a hexyl group, an octyl group and the like.

The cycloalkyl groups represented by $R_{36}$ to $R_{39}$ and $R_{01}$ and $R_{02}$ may be monocyclic or polycyclic. The monocyclic alkyl groups are preferably cycloalkyl groups having 3 to 8 carbon atoms. As such, there can be mentioned, for example, a cyclopropyl group, a cyclobutyl group, a cyclopentyl group, a cyclohexyl group, a cyclooctyl group and the like. The polycyclic alkyl groups are preferably cycloalkyl groups having 6 to 20 carbon atoms. As such, there can be mentioned, for example, an adamantyl group, a norbornyl group, an isobornyl group, a camphonyl group, a dicyclopentyl group, an α-pinanyl group, a tricyclodecanyl group, a tetracyclododecyl group, an androstanyl group and the like. With respect to these, the carbon atoms of each of the cycloalkyl groups may be partially substituted with a heteroatom, such as an oxygen atom.

The aryl groups represented by $R_{36}$ to $R_{39}$, $R_{01}$ and $R_{02}$ and Ar each preferably have 6 to 10 carbon atoms. For example, there can be mentioned a phenyl group, a naphthyl group, an anthryl group and the like.

The aralkyl groups represented by $R_{36}$ to $R_{39}$, $R_{01}$ and $R_{02}$ each preferably have 7 to 12 carbon atoms. For example, there can be mentioned a benzyl group, a phenethyl group, a naphthylmethyl group and the like.

The alkenyl groups represented by $R_{36}$ to $R_{39}$, $R_{01}$ and $R_{02}$ each preferably have 2 to 8 carbon atoms. For example, there can be mentioned a vinyl group, an allyl group, a butenyl group, a cyclohexenyl group and the like.

The ring formed by mutual bonding of $R_{36}$ and $R_{37}$ may be monocyclic or polycyclic. The monocyclic structure is preferably a cycloalkane structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably a cycloalkane structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the ring structure may be partially substituted with a heteroatom, such as an oxygen atom.

Each of the groups may have a substituent. As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group or the like. Preferably, the number of carbon atoms of each of the substituents is up to 8.

The group (Y) that is eliminated by the action of an acid more preferably has any of the structures of general formula (B) below.

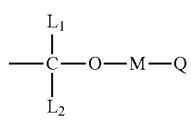

(B)

In the formula, each of $L_1$ and $L_2$ independently represents a hydrogen atom, an alkyl group, a cycloalkyl group, an aryl group or an aralkyl group.

M represents a single bond or a bivalent connecting group.

Q represents an alkyl group, a cycloalkyl group, an alicyclic group, a aromatic ring group, an amino group, an ammonium group, a mercapto group, a cyano group or an aldehyde group. The alicyclic group and the aromatic ring group may contain a heteroatom.

At least two of Q, M and $L_1$ may be bonded to each other to thereby form a 5-membered or 6-membered ring.

The alkyl groups represented by $L_1$ and $L_2$ are, for example, alkyl groups having 1 to 8 carbon atoms. As preferred examples thereof, there can be mentioned a methyl group, an ethyl group, a propyl group, an n-butyl group, a sec-butyl group, a hexyl group and an octyl group.

The cycloalkyl groups represented by $L_1$ and $L_2$ are, for example, cycloalkyl groups having 3 to 15 carbon atoms. As preferred examples thereof, there can be mentioned a cyclopentyl group, a cyclohexyl group, a norbornyl group and an adamantyl group.

The aryl groups represented by $L_1$ and $L_2$ are, for example, aryl groups having 6 to 15 carbon atoms. As preferred examples thereof, there can be mentioned a phenyl group, a tolyl group, a naphthyl group, an anthryl group and the like.

The aralkyl groups represented by $L_1$ and $L_2$ are, for example, those having 6 to 20 carbon atoms. There can be mentioned a benzyl group, a phenethyl group and the like.

The bivalent connecting group represented by M is, for example, an alkylene group (e.g., a methylene group, an ethylene group, a propylene group, a butylene group, a hexylene group, an octylene group, etc.), a cycloalkylene group (e.g., a cyclopentylene group, a cyclohexylene group, etc.), an alkenylene group (e.g., an ethylene group, a propenylene group, a butenylene group, etc.), an arylene group (e.g., a phenylene group, a tolylene group, a naphthylene group, etc.), —S—, —O—, —CO—, —SO$_2$—, —N($R_0$)— or a bivalent connecting group resulting from a combination of two or more of these groups. $R_0$ represents a hydrogen atom or an alkyl group. The alkyl group represented by $R_0$ is, for example, an alkyl group having 1 to 8 carbon atoms; in particular, there can be mentioned a methyl group, an ethyl group, a propyl group, an n-butyl group, a sec-butyl group, a hexyl group, an octyl group and the like.

The alkyl group and cycloalkyl group represented by Q are the same as those mentioned above as $L_1$ and $L^2$.

As the alicyclic group and aromatic ring group represented by Q, there can be mentioned, for example, the cycloalkyl group and aryl group mentioned above as $L_1$ and $L_2$. Preferably, each of the alicyclic group and aromatic ring group has 3 to 15 carbon atoms.

As the alicyclic group containing a heteroatom and aromatic ring group containing a heteroatom represented by Q, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, triazole and pyrrolidone. However, the alicyclic groups and aromatic ring groups are not limited to these as long as the ring is formed by carbon and a heteroatom or by heteroatoms.

As the ring structure, that may be formed by mutual bonding of at least two of Q, M and $L_1$, there can be mentioned the 5-membered or 6-membered ring resulting from mutual bonding of at least two of Q, M and $L_1$ so as to form, for example, a propylene group or a butylene group and subsequent formation of a ring containing an oxygen atom.

In general formula (B), each of the groups represented by $L_1$, $L_2$, M and Q may have a substituent. As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group and the like. Preferably, the number of carbon atoms of each of the substituents is up to 8.

The groups of the formula -M-Q are preferably groups having 1 to 30 carbon atoms, more preferably groups having 5 to 20 carbon atoms. From the viewpoint of outgas suppression, it is especially preferred for the number of carbon atoms to be 6 or greater.

As preferred other resins, there can be mentioned the resin containing a repeating unit of general formula (X) below.

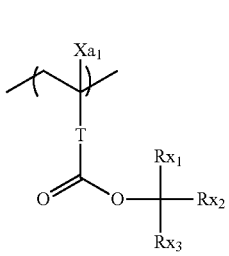

(X)

In general formula (X), $Xa_1$ represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a monocyclic or polycyclic alkyl group. At least two of $Rx_1$ to $Rx_3$ may be bonded to each other to thereby form a monocyclic or polycyclic alkyl group.

As the bivalent connecting group represented by T, there can be mentioned, for example, an alkylene group, a group of the formula —COO-Rt-, a group of the formula —O-Rt- and the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

The cycloalkyl group formed by bonding of at least two of $Rx_1$ to $Rx_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

In a preferred mode, $Rx_1$ is a methyl group or an ethyl group, and $Rx_2$ and $Rx_3$ are bonded to each other to thereby form any of the above-mentioned cycloalkyl groups.

Specific examples of the repeating units of general formula (X) will be shown below, which however in no way limit the scope of the present invention.

In the following formulae, Rx represents H, $CH_3$, $CF_3$ or $CH_2OH$. Each of Rxa and Rxb independently represents an alkyl group having 1 to 4 carbon atoms.

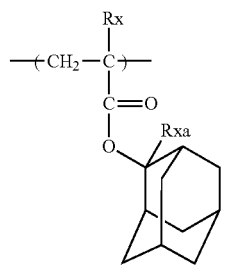

1

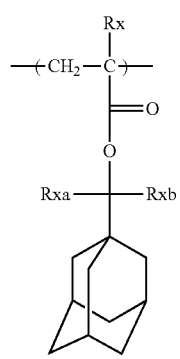

2

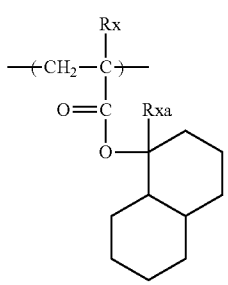

3

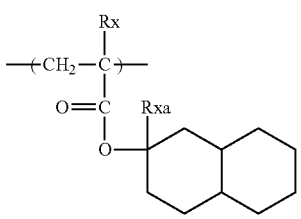

4

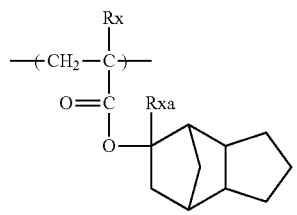

5

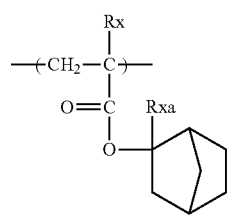
6
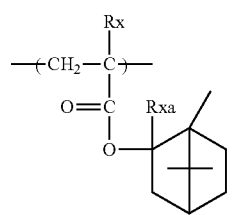
7
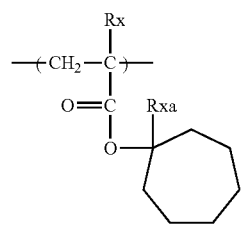
8
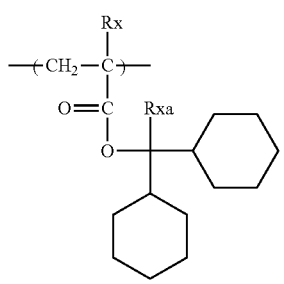
9
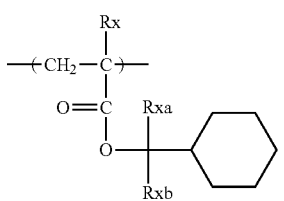
10
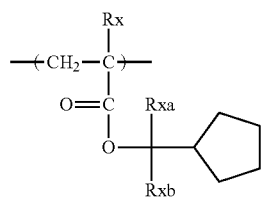
11
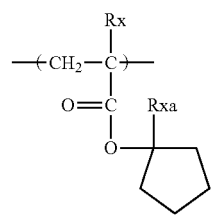
12
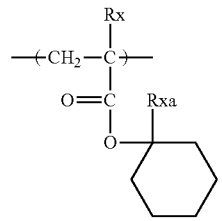
13
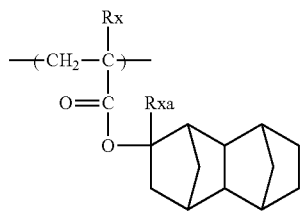
14
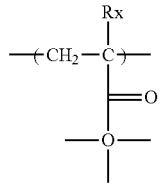
15
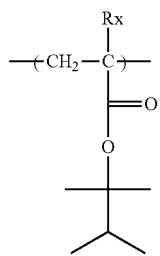
16
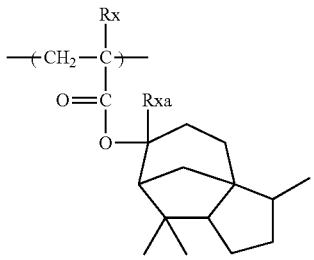
17
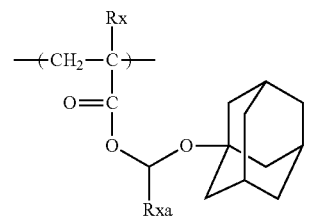
18
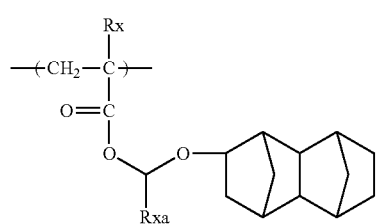
19

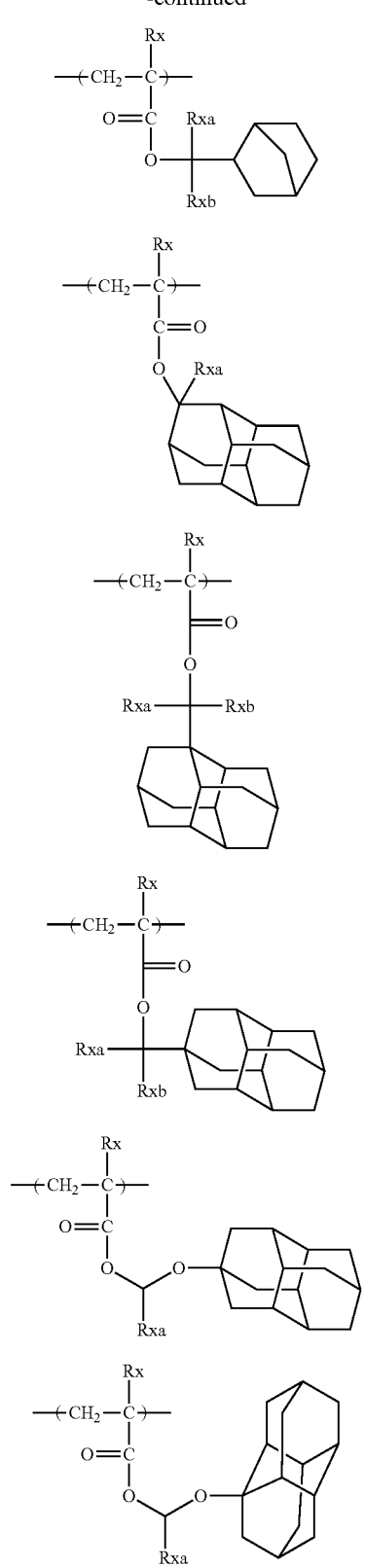

The content of repeating unit expressed by general formula (X) in the resin, based on all the repeating units of the resin, is preferably in the range of 3 to 90 mol %, more preferably 5 to 80 mol % and most preferably 7 to 70 mol %.

The content of group decomposable by the action of an acid is calculated by the formula B/(B+S) wherein B refers to the number of groups decomposable by the action of an acid in a resin and S refers to the number of alkali-soluble groups not protected by any group leaving under the action of an acid. The content is preferably in the range of 0.01 to 0.7, more preferably 0.05 to 0.50 and further more preferably 0.05 to 0.40.

When the composition of the present invention is to be exposed to an ArF excimer laser light, it is preferred for the resin to have a monocyclic or polycyclic aliphatic hydrocarbon structure. Hereinafter, this resin is referred to as an "alicyclic hydrocarbon based acid-decomposable resin."

Preferably, the alicyclic hydrocarbon based acid-decomposable resin is a resin comprising at least one member selected from the group consisting of repeating units with the partial structures containing alicyclic hydrocarbons expressed by general formulae (pI) to (pV) below and repeating units of general formula (II-AB) below.

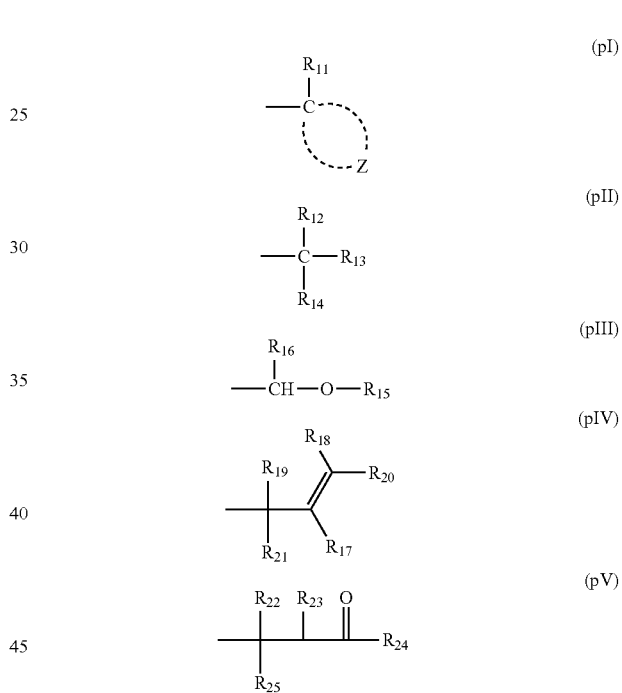

In general formulae (pI) to (pV), $R_{11}$ represents a methyl group, an ethyl group, an n-propyl group, an isopropyl group, an n-butyl group, an isobutyl group or a sec-butyl group, and Z represents an atomic group required for formation of a cycloalkyl group in cooperation with a carbon atom.

Each of $R_{12}$ to $R_{16}$ independently represents a linear or branched alkyl group having 1 to 4 carbon atoms or a cycloalkyl group, provided that at least one of $R_{12}$ to $R_{14}$ represents a cycloalkyl group and at least either $R_{15}$ or $R_{16}$ represents a cycloalkyl group.

Each of $R_{17}$ to $R_{21}$ independently represents a hydrogen atom or a cycloalkyl group or a linear or branched alkyl group having 1 to 4 carbon atoms, provided that at least one of $R_{17}$ to $R_{21}$ represents a cycloalkyl group and at least either $R_{19}$ or $R_{21}$ represents a cycloalkyl group or a linear or branched alkyl group having 1 to 4 carbon atoms.

Each of $R_{22}$ to $R_{25}$ independently represents a hydrogen atom or a cycloalkyl group or a linear or branched alkyl group having 1 to 4 carbon atoms, provided that at least one of $R_{22}$ to $R_{25}$ represents a cycloalkyl group. $R_{23}$ and $R_{24}$ may be bonded to each other to thereby form a ring.

(II-AB)

In general formula (II-AB), each of $R_{11}'$ and $R_{12}'$ independently represents a hydrogen atom, a cyano group, a halogen atom or an alkyl group.

Z' represents an atomic group for formation of an alicyclic structure in cooperation with two bonded carbon atoms (C—C).

Further preferably, general formula (II-AB) is either general formula (II-AB1) or general formula (II-AB2) below.

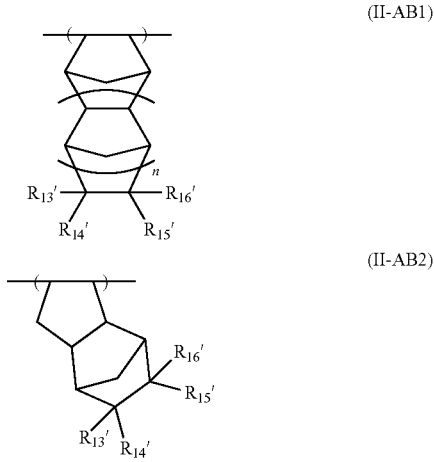

In general formulae (II-AB1) and (II-AB2), each of $R_{13}'$ to $R_{16}'$ independently represents a hydrogen atom, a halogen atom, a cyano group, a hydroxyl group, —COOH, —COOR$_5$, a group that is decomposed by the action of an acid, —C(=O)—X-A'-R$_{17}'$, an alkyl group or a cycloalkyl group. In the above formula, $R_5$ represents an alkyl group, a cycloalkyl group or a group with a lactone structure. X represents an oxygen atom, a sulfur atom, —NH—, —NHSO$_2$— or —NHSO$_2$NH—. A' represents a single bond or a bivalent connecting group. $R_{17}'$ represents —COOH, —COOR$_5$, —CN, a hydroxyl group, an alkoxy group, —CO—NH—R$_6$, —CO—NH—SO$_2$—R$_6$ or a group with a lactone structure. $R_6$ represents an alkyl group or a cycloalkyl group. At least two of $R_{13}'$ to $R_{16}'$ may be bonded to each other to thereby form a ring.

n is 0 or 1.

In general formulae (pI) to (pV), each of the alkyl groups represented by $R_{12}$ to $R_{25}$ is preferably a linear or branched alkyl group having 1 to 4 carbon atoms. As such, there can be mentioned, for example, a methyl group, an ethyl group, a propyl group, an n-butyl group, a sec-butyl group, a t-butyl group and the like.

The cycloalkyl groups represented by $R_{12}$ to $R_{25}$ and the cycloalkyl group formed by Z and a carbon atom may be monocyclic or polycyclic. In particular, there can be mentioned groups of a monocyclo, bicyclo, tricyclo or tetracyclo structure or the like having 5 or more carbon atoms. The number of carbon atoms thereof is preferably in the range of 6 to 30, especially preferably 7 to 25.

As preferred cycloalkyl groups, there can be mentioned an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. As more preferred cycloalkyl groups, there can be mentioned an adamantyl group, a norbornyl group, a cyclohexyl group, a cyclopentyl group, a tetracyclododecanyl group and a tricyclodecanyl group.

These alkyl groups and cycloalkyl groups may further have substituents. As substituents, there can be mentioned an alkyl group (1 to 4 carbon atoms), a halogen atom, a hydroxyl group, an alkoxy group (1 to 4 carbon atoms), a carboxyl group and an alkoxycarbonyl group (2 to 6 carbon atoms). These substituents may further have substituents. As substituents that can be further introduced in the alkyl groups, alkoxy groups, alkoxycarbonyl groups, etc., there can be mentioned a hydroxyl group, a halogen atom and an alkoxy group.

The structures of the general formulae (pI) to (pV) can be used for the protection of the alkali-soluble groups. As the alkali-soluble groups, there can be mentioned various groups generally known in this technical field.

In particular, there can be mentioned, for example, structures resulting from replacement of a hydrogen atom of a carboxylic acid group, sulfonic acid group, phenol group or thiol group with any of the structures of the general formulae (pI) to (pV). Structures resulting from replacement of a hydrogen atom of a carboxylic acid group or sulfonic acid group with any of the structures of the general formulae (pI) to (pV) are preferred.

As preferred repeating units having any of the alkali-soluble groups protected by the structures of the general formulae (pI) to (pV), there can be mentioned those of general formula (pA) below.

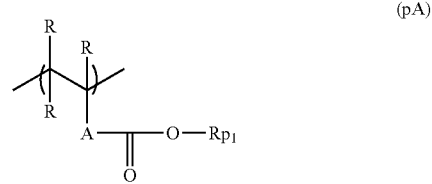

(pA)

In general formula (pA), R represents a hydrogen atom, a halogen atom or a linear or branched alkyl group having 1 to 4 carbon atoms. Two or more R's may be identical to or different from each other.

A represents any one or a combination of two or more groups selected from the group consisting of a single bond, an alkylene group, an ether group, a thioether group, a carbonyl group, an ester group, an amido group, a sulfonamido group, a urethane group and a urea group. A single bond is preferred.

Pp1 represents any of the groups of the above general formulae (pI) to (pV).

The repeating units of the general formula (pA) are most preferably those derived from a 2-alkyl-2-adamantyl (meth) acrylate and a dialkyl(1-adamantyl)methyl (meth)acrylate.

Specific examples of the repeating units of the general formula (pA) will be shown below.

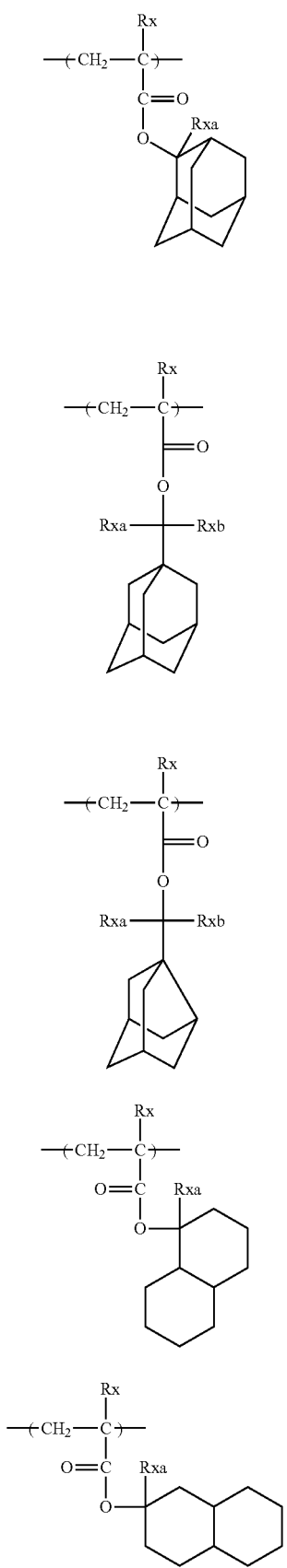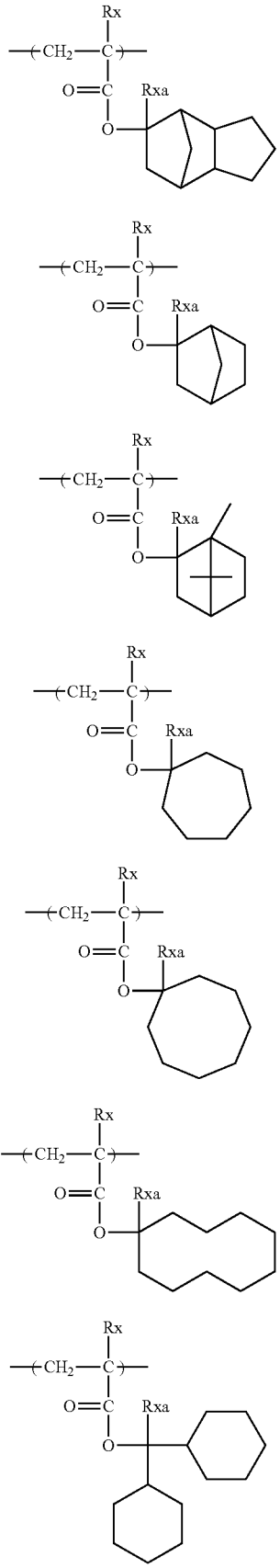

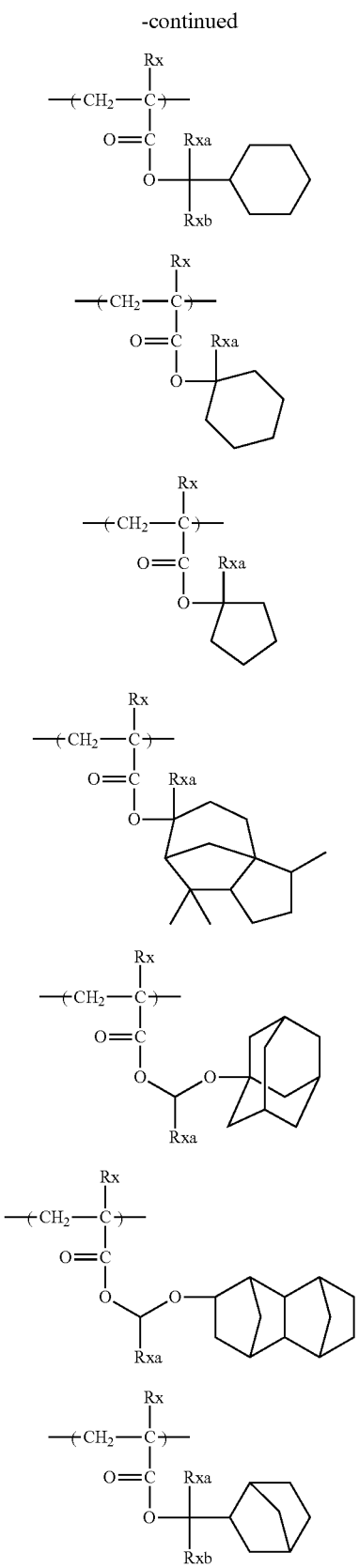

In the above structural formulae, Rx represents H, CH$_3$, CF$_3$ or CH$_2$OH. Each of Rxa and Rxb independently represents an alkyl group having 1 to 4 carbon atoms.

In the general formula (II-AB), the halogen atoms represented by R$_{11}$' and R$_{12}$' include a chlorine atom, a bromine atom, a fluorine atom, an iodine atom, etc.

The alkyl groups represented by R$_{11}$' and R$_{12}$' are preferably linear or branched alkyl groups each having 1 to 10 carbon atoms. For example, there can be mentioned a methyl group, an ethyl group, an n-propyl group, an isopropyl group, a linear or branched butyl, pentyl, hexyl or heptyl group, and the like.

The atomic group represented by Z' is one capable of providing the resin with a repeating unit of optionally substituted alicyclic hydrocarbon. The atomic group is preferably one capable of providing a bridged alicyclic structure for formation of a bridged alicyclic hydrocarbon repeating unit.

The provided alicyclic hydrocarbon skeleton can be the same as that of the cycloalkyl groups represented by R$_{12}$ to R$_{25}$ in the general formulae (pI) to (pV).

The alicyclic hydrocarbon skeleton may have a substituent. As the substituent, there can be mentioned any of the atoms or groups represented by R$_{13}$' to R$_{16}$' in the general formulae (II-AB1) and (II-AB2).

In the alicyclic hydrocarbon acid-decomposable resin, at least one repeating unit selected from among the repeating units having partial structures containing the alicyclic hydrocarbons of general formulae (pI) to (pV), the repeating units of general formula (II-AB) and the repeating units of copolymer components to be described below may contain the group that is decomposed by the action of an acid.

Any of the various substituents that can be introduced in R$_{13}$' to R$_{16}$' in general formulae (II-AB1) and (II-AB2) can be a substituent for the atomic groups Z' for formation of the alicyclic structures or the bridged alicyclic structures of general formula (II-AB).

Specific examples of the repeating units of general formulae (II-AB1) and (II-AB2) will be shown below, which however in no way limit the scope of the present invention.

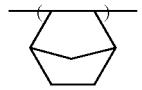

[II-1]

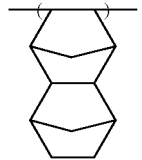

[II-2]

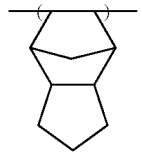

[II-3]

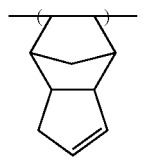

[II-4]

[II-5]
[II-6]
[II-7]
[II-8]
[II-9]
[II-10]
[II-11]
[II-12]
[II-13]

[II-14]
[II-15]
[II-16]
[II-17]
[II-18]
[II-19]
[II-20]
[II-21]

-continued

[II-22] 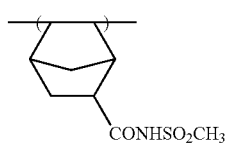

[II-23] 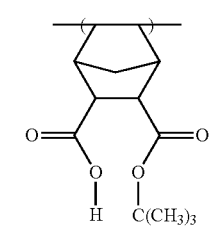

[II-24] 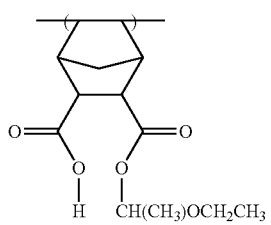

[II-25] 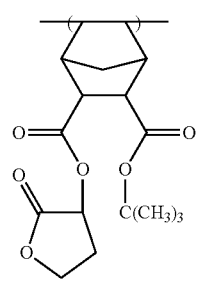

[II-26] 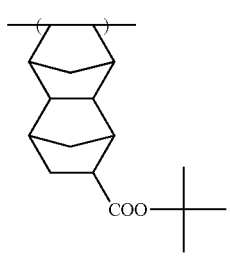

[II-27] 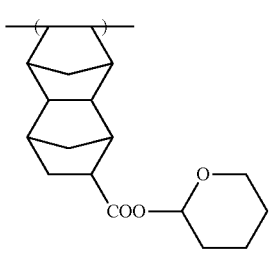

-continued

[II-28] 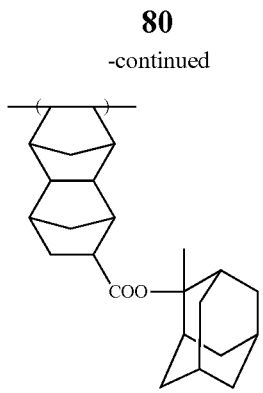

[II-29] 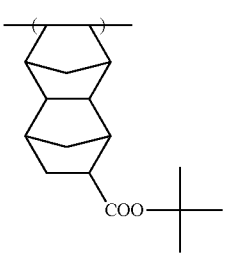

[II-30] 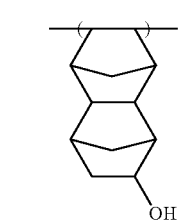

[II-31] 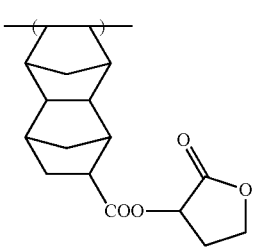

[II-32] 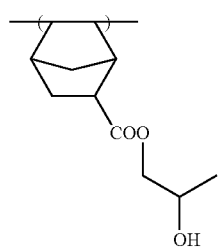

It is preferred for the alicyclic hydrocarbon acid-decomposable resin to contain a repeating unit containing a lactone group. The lactone group is preferably a group having a 5- to 7-membered ring lactone structure, more preferably one in which a 5- to 7-membered ring lactone structure is condensed with another cyclic structure in a fashion to form a bicyclo structure or spiro structure.

This alicyclic hydrocarbon acid-decomposable resin further more preferably contains a repeating unit containing a group with any of the lactone structures of general formulae (LC1-1) to (LC1-17) below. The groups with lactone structures may be directly bonded to the principal chain of the resin. Preferred lactone structures are those of formulae (LC1-1), (LC1-4), (LC1-5), (LC1-6), (LC1-13), (LC1-14)

and (LC1-17). Using these specified lactone structures enhances the line edge roughness and development defect reduction.
LC1-1
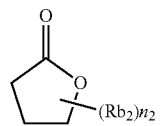
LC1-2
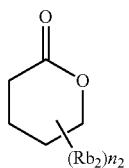
LC1-3
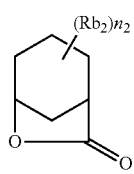
LC1-4
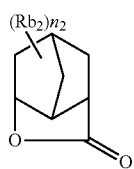
LC1-5
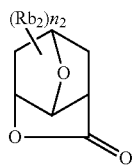
LC1-6
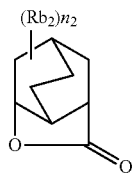
LC1-7
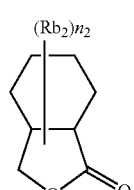
LC1-8
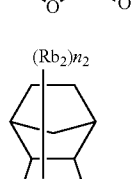
-continued
LC1-9
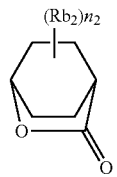
LC1-10
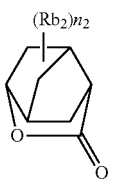
LC1-11
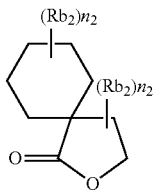
LC1-12
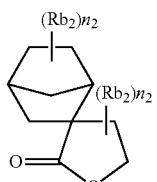
LC1-13
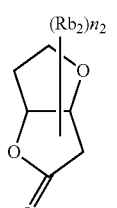
LC1-14
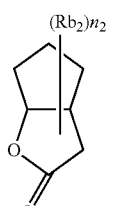
LC1-15
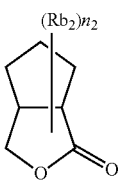
LC1-16
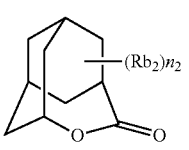

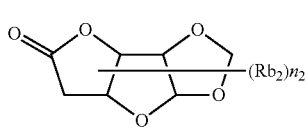

LC1-17

The presence of a substituent ($Rb_2$) on the portion of the lactone structure is optional. As preferred substituents ($Rb_2$), there can be mentioned, for example, an alkyl group having 1 to 8 carbon atoms, a cycloalkyl group having 3 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like.

In the formulae, $n_2$ is an integer of 0 to 4. When $n_2$ is an integer of 2 or greater, the plurality of present substituents ($Rb_2$) may be identical to or different from each other. Further, the plurality of present substituents ($Rb_2$) may be bonded to each other to thereby form a ring structure.

As the repeating units containing the groups with lactone structures of any of general formulae (LC1-1) to (LC1-17) above, there can be mentioned, for example, the repeating units of general formulae (II-AB1) and (II-AB2) above wherein at least one of $R_{13}'$ to $R_{16}'$ contains any of the groups of general formulae (LC1-1) to (LC1-17) and the repeating units of general formula (AI) below. As examples of the former repeating units, there can be mentioned the structures in which $R_5$ in —$COOR_5$ represents any of the groups of general formulae (LC1-1) to (LC1-17).

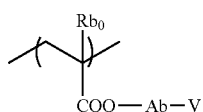

(AI)

In general formula (AI), $Rb_0$ represents a hydrogen atom, a halogen atom or an alkyl group having 1 to 4 carbon atoms.

As the alkyl group represented by $Rb_0$, there can be mentioned, for example, a methyl group, an ethyl group, a propyl group, an n-butyl group, a sec-butyl group, a t-butyl group and the like. The alkyl group represented by $Rb_0$ may have a substituent. As preferred substituents that may be introduced in the alkyl group represented by $Rb_0$, there can be mentioned, for example, a hydroxyl group and a halogen atom.

As the halogen atom represented by $Rb_0$, there can be mentioned a fluorine atom, a chlorine atom, a bromine atom or an iodine atom. The $Rb_0$ is preferably a hydrogen atom or a methyl group.

Ab represents an alkylene group, a bivalent connecting group with an alicyclic hydrocarbon structure of a single ring or multiple rings, a single bond, an ether group, an ester group, a carbonyl group, a carboxyl group or a bivalent connecting group resulting from combination of these. A single bond and a connecting group of the formula -$Ab_1$-$CO_2$— are preferred.

$Ab_1$ is a linear or branched alkylene group or a monocyclic or polycyclic alkylene group, being preferably a methylene group, an ethylene group, a cyclohexylene group, an adamantylene group or a norbornylene group.

V represents any of the groups of the general formulae (LC1-1) to (LC1-17).

The repeating unit having a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The following repeating units can be mentioned as repeating units each containing an especially preferred lactone group. Selecting the most appropriate lactone group enhances the pattern profile and iso/dense bias. In the formulae, each of Rx and R represents H, $CH_3$, $CH_2OH$ or $CF_3$.

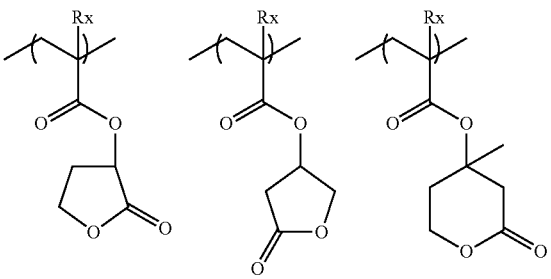

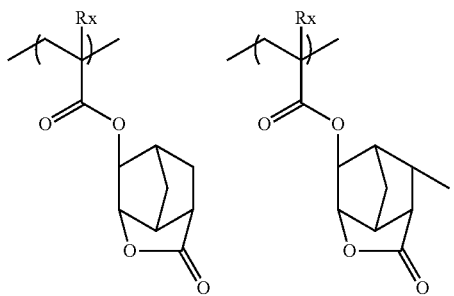

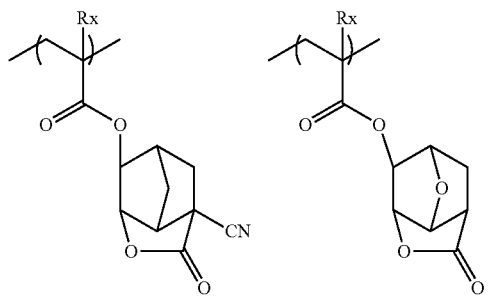

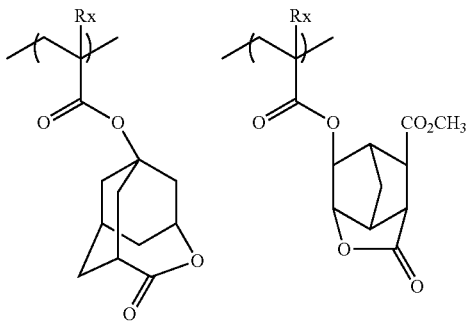

85
-continued
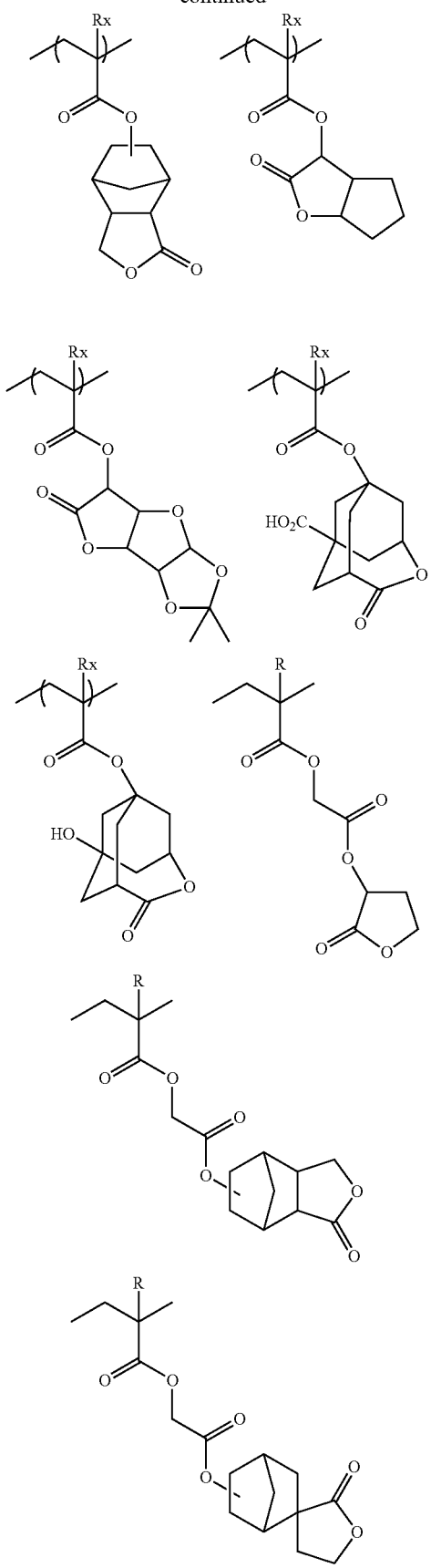
86
-continued
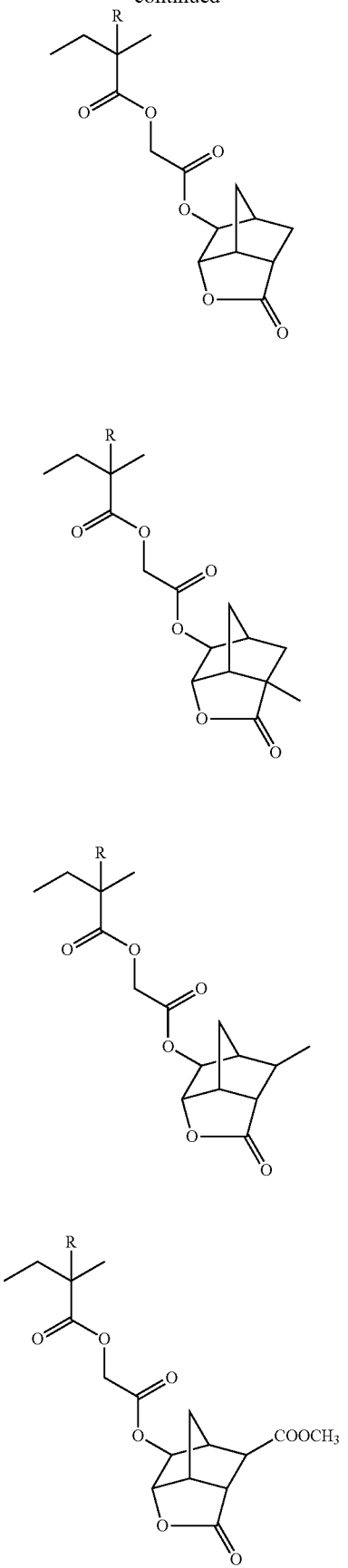

87
-continued
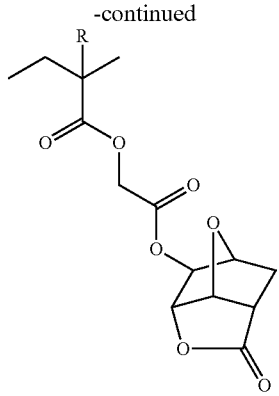
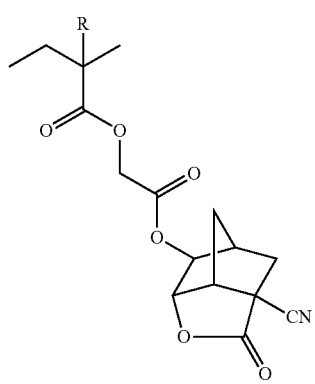
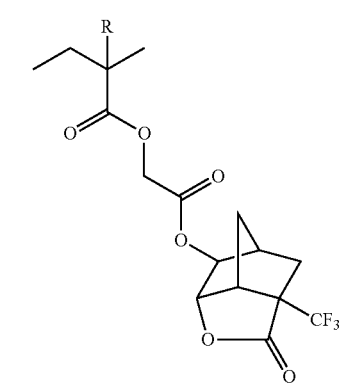
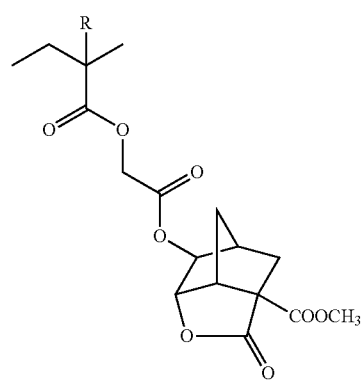
88
-continued
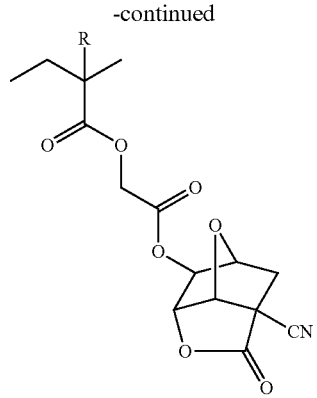
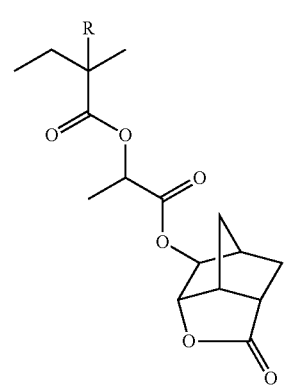
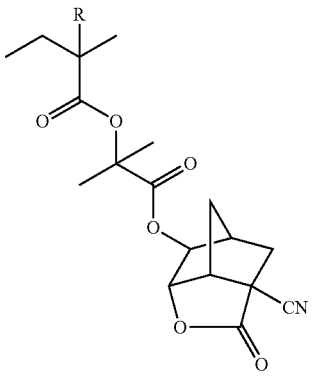
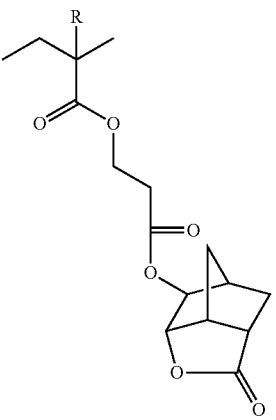

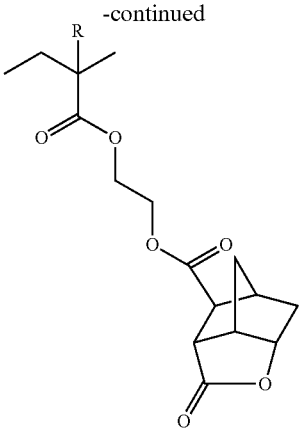
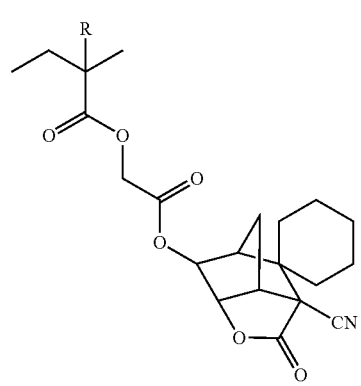
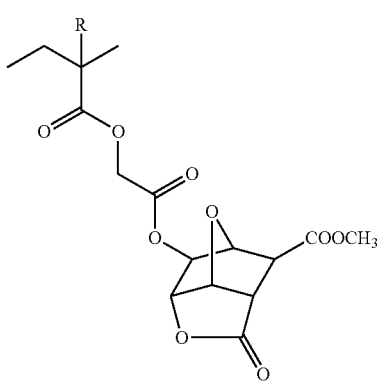
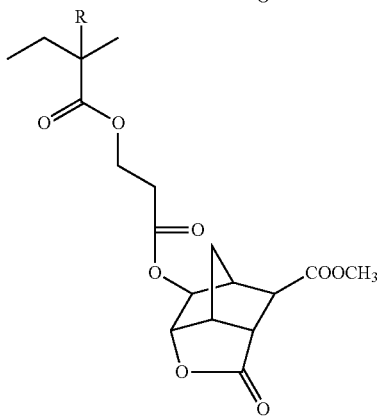

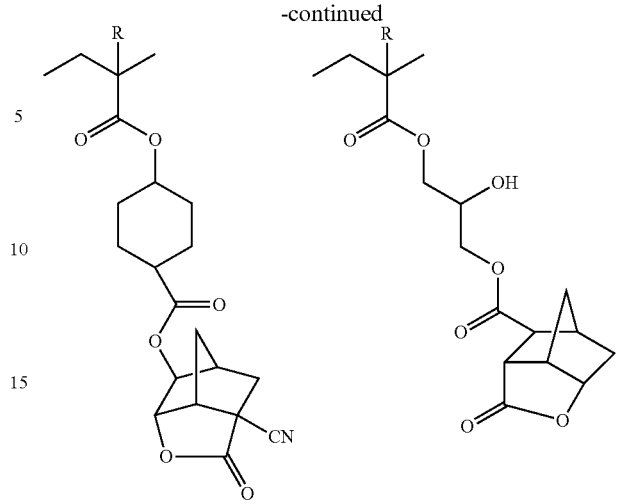
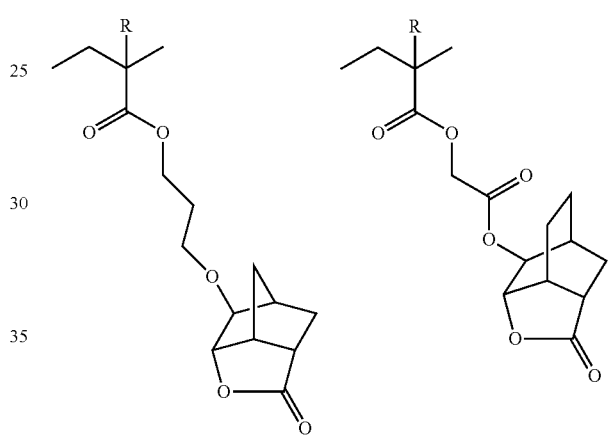

The alicyclic hydrocarbon based acid-decomposable resin may contain a plurality of repeating units each containing a lactone group. In this case, it is preferred for the acid-decomposable resin to contain either (1) any one of those of general formula (AI) in which Ab is a single bond together with any one of those of general formula (AI) in which Ab is -$Ab_1$-$CO_2$—, or (2) a combination of two of those of general formula (AI) in which Ab is -$Ab_1$-$CO_2$—.

The content of repeating unit containing a lactone group (when there are a plurality of repeating units each containing a lactone group, the sum thereof), based on all the repeating units of the resin (B), is preferably in the range of 10 to 70 mol %, more preferably 20 to 60 mol %.

It is preferred for the alicyclic hydrocarbon based acid-decomposable resin to contain a repeating unit with an alicyclic hydrocarbon structure substituted with a polar group. The adhesion to substrate and developer affinity can be enhanced by the incorporation of this repeating unit. The polar group is preferably a hydroxyl group or a cyano group. The hydroxyl group as a polar group constitutes an alcoholic hydroxyl group.

As the alicyclic hydrocarbon structure substituted with a polar group, there can be mentioned, for example, any of the structures of general formulae (VIIa) and (VIIb) below.

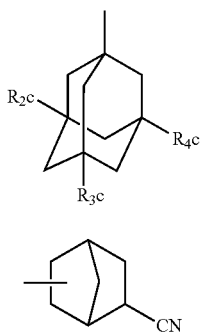

(VIIa)

(VIIb)

In general formula (VIIa), each of $R_2c$ to $R_4c$ independently represents a hydrogen atom, a hydroxyl group or a cyano group, provided that at least one of the $R_2c$ to $R_4c$ represents a hydroxyl group or a cyano group. Preferably, one or two of the $R_2c$ to $R_4c$ are hydroxyl groups and the remainder is a hydrogen atom. More preferably, two of the $R_2c$ to $R_4c$ are hydroxyl groups and the remainder is a hydrogen atom.

The groups of general formula (VIIa) preferably have a dihydroxy form or monohydroxy form, more preferably a dihydroxy form.

As the repeating units containing any of the groups of general formulae (VIIa) and (VIIb) above, there can be mentioned, for example, the repeating units of general formulae (II-AB1) and (II-AB2) above wherein at least one of $R_{13}'$ to $R_{16}'$ contains any of the groups of general formulae (VIIa) and (VIIb) above and the repeating units of general formulae (AIIa) and (AIIb) below. As examples of the former repeating units, there can be mentioned the structures in which $R_5$ in —$COOR_5$ represents any of the groups of general formulae (VIIa) and (VIIb).

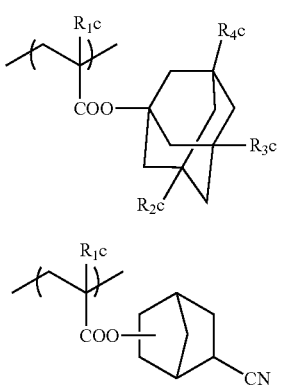

(AIIa)

(AIIb)

In general formulae (AIIa) and (AIIb), $R_1c$ represents a hydrogen atom, a methyl group, a trifluoromethyl group or a hydroxymethyl group.

$R_2c$ to $R_4c$ are as defined above in connection with general formula (VIIa).

Specific examples of the repeating units of general formula (AIIa) and (AIIb) are shown below, which in no way limit the scope of the present invention.

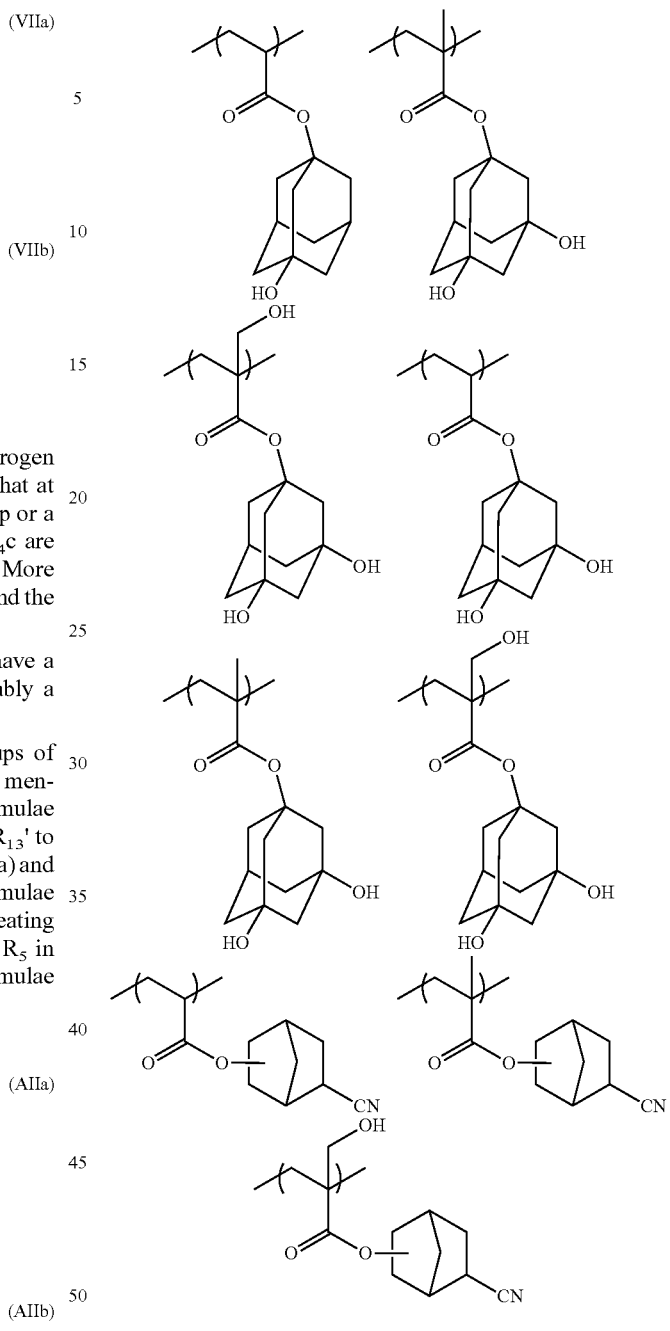

The content of any of these repeating units (when there are a plurality of relevant repeating units, the sum thereof), based on all the repeating units of the resin (B), is preferably in the range of 3 to 30 mol %, more preferably 5 to 25 mol %.

The resin according to the present invention may contain a repeating unit that contains neither a hydroxyl group nor a cyano group and is stable against acids, aside from the foregoing repeating units.

As such a repeating unit, there can be mentioned, for example, any of repeating units of general formula as shown below in which a side chain of acrylic structure has a non-acid-decomposable aryl structure or cycloalkyl structure. The regulation of contrast, enhancement of etching resistance, etc. can be expected by the introduction of this structure.

This repeating unit may be introduced in the above-mentioned resin containing a hydroxystyrene repeating unit, or alicyclic hydrocarbon based acid-decomposable resin. When this repeating unit is introduced in the alicyclic hydrocarbon based acid-decomposable resin, from the viewpoint of 193 nm light absorption, it is preferred for the repeating unit to contain no aromatic ring structure.

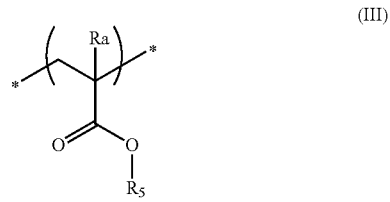

(III)

In general formula (III), $R_5$ represents a hydrocarbon group.

Ra represents a hydrogen atom, an alkyl group (preferably a methyl group), a hydroxyalkyl group (preferably a hydroxymethyl group) or a trifluoromethyl group.

It is preferred for the hydrocarbon group represented by $R_5$ to contain a ring structure therein. As particular examples of the hydrocarbon groups containing a ring structure, there can be mentioned a mono- or polycycloalkyl group (preferably 3 to 12 carbon atoms, more preferably 3 to 7 carbon atoms), a mono- or polycycloalkenyl group (preferably 3 to 12 carbon atoms), an aryl group (preferably 6 to 20 carbon atoms, more preferably 6 to 12 carbon atoms), an aralkyl group (preferably 7 to 20 carbon atoms, more preferably 7 to 12 carbon atoms) and the like.

The above cycloalkyl groups include ring-assembly hydrocarbon groups and crosslinked-ring hydrocarbon groups. As crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed rings, for example, those resulting from the condensation of a plurality of 5- to 8-membered cycloalkane rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

As preferred examples of the aryl groups, there can be mentioned a phenyl group, a naphthyl group, a biphenyl group and the like. As preferred examples of the aralkyl groups, there can be mentioned a phenylmethyl group, a phenylethyl group, a naphthylmethyl group and the like.

Substituents may be introduced in these hydrocarbon groups. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. A substituent may further be introduced in this alkyl group. As an optionally further introduced substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an acyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content of any of repeating units of general formula (III) based on all the repeating units of the resin (B) is preferably in the range of 0 to 40 mol %, more preferably 0 to 20 mol %.

Specific examples of the repeating units of general formula (III) are shown below, which in no way limit the scope of the present invention. In the formulae, Ra represents H, $CH_3$, $CH_2OH$ or $CF_3$.

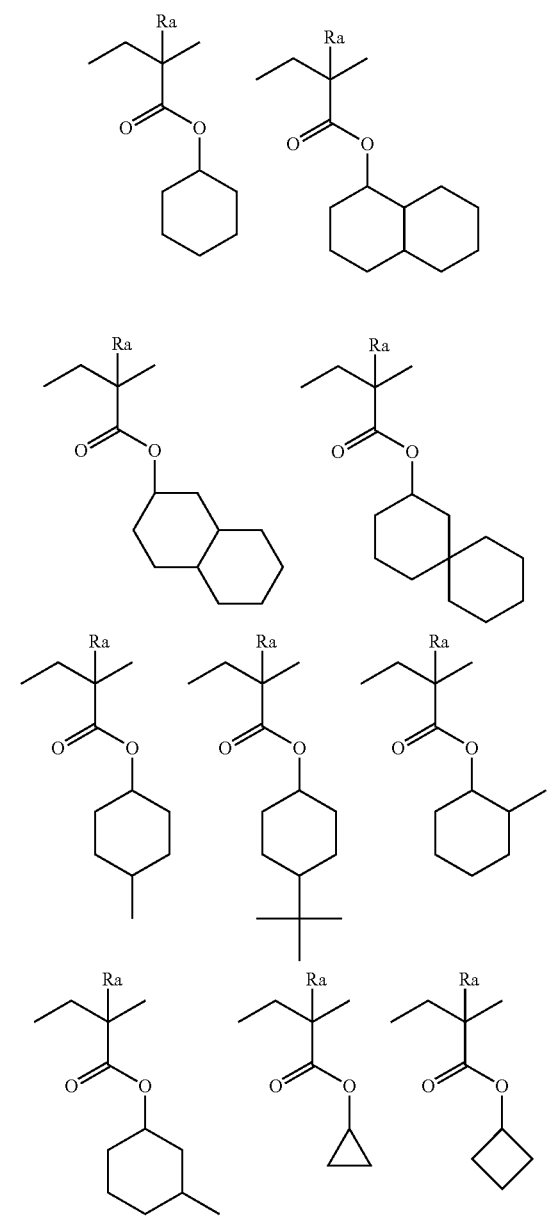

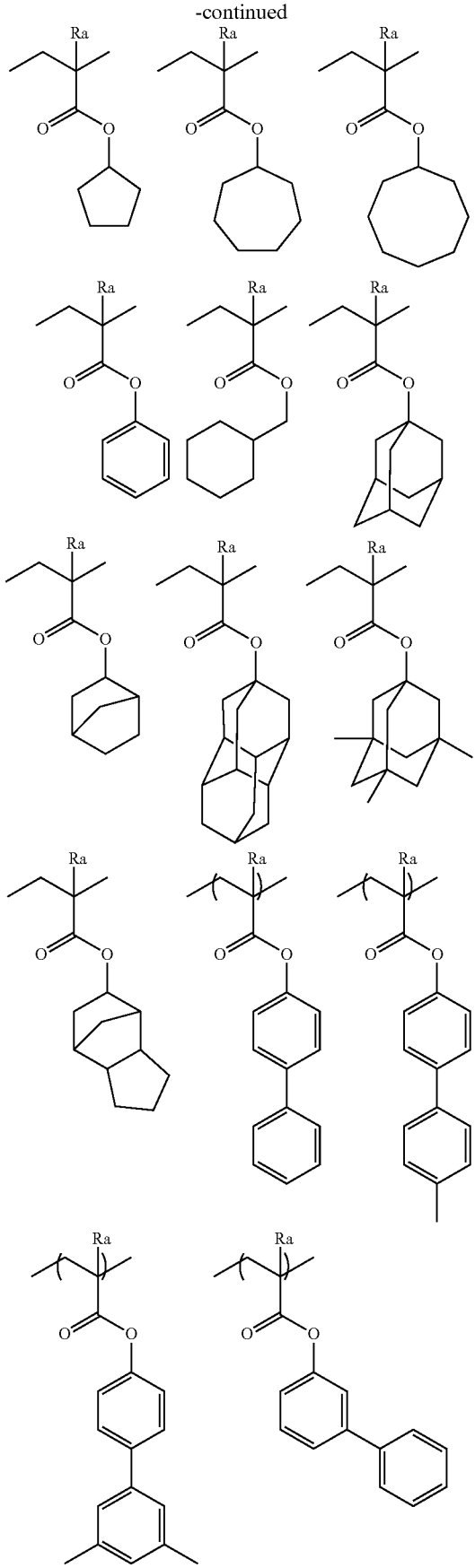
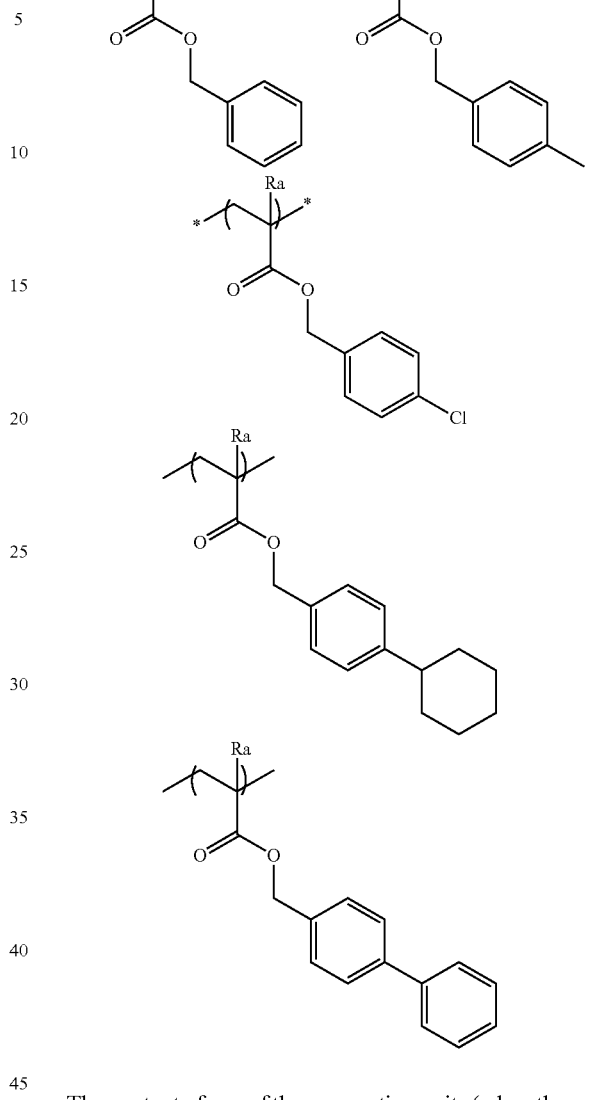

The content of any of these repeating units (when there are a plurality of relevant repeating units, the sum thereof), based on all the repeating units of the resin, is preferably in the range of 0 to 30 mol %, more preferably 1 to 20 mol %.

The alicyclic hydrocarbon based acid-decomposable resin may contain any of the repeating units of general formula (VIII) below.

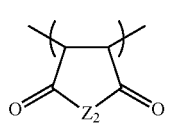

(VIII)

In general formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl groups represented by $R_{41}$ and $R_{42}$ may be substituted with, for example, a halogen atom. In that instance, the halogen atom is preferably a fluorine atom.

Specific examples of the repeating units of general formula (VIII) are shown below, which in no way limit the scope of the present invention.

Particular examples of the resins set forth above are shown below, which in no way limit the scope of the present invention.

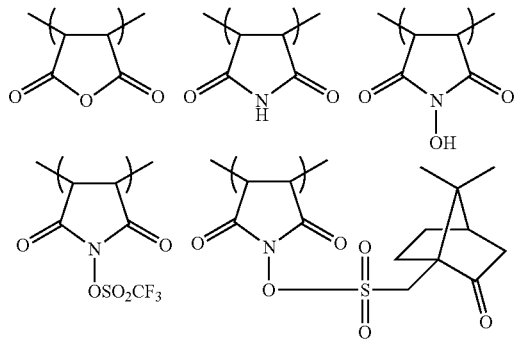

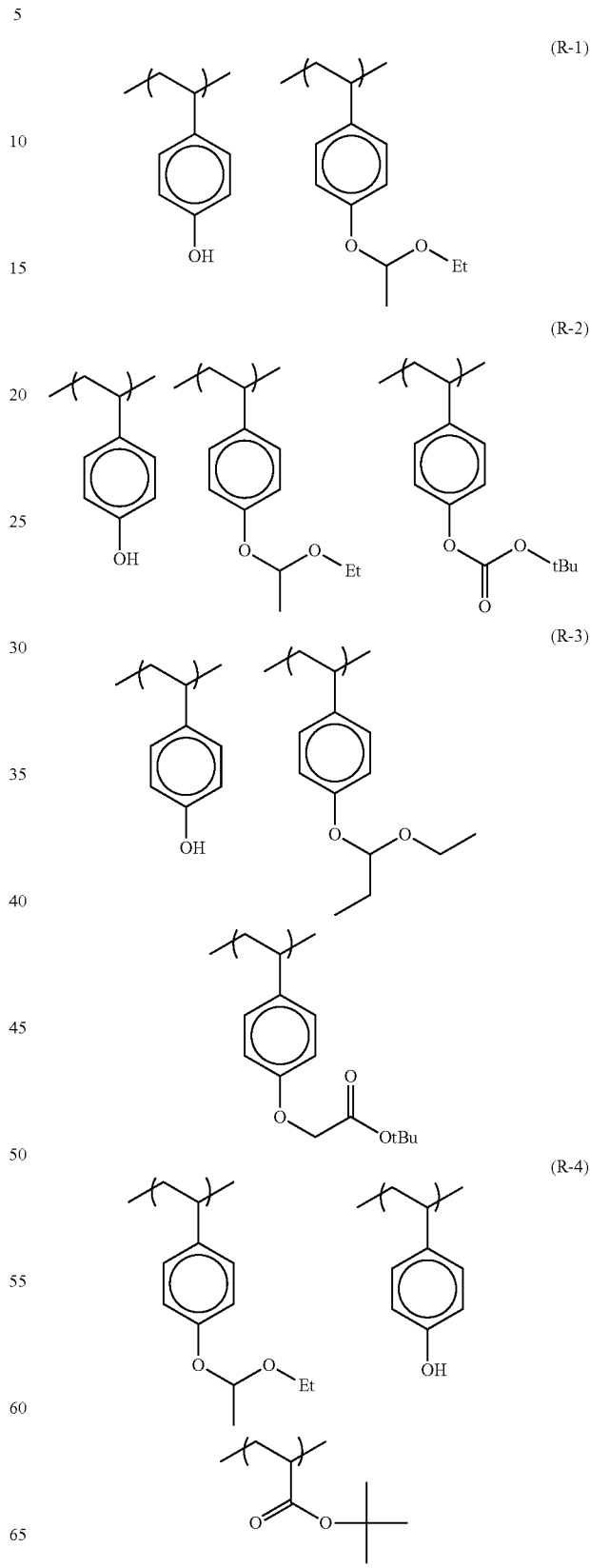

It is preferred for the alicyclic hydrocarbon based acid-decomposable resin to contain a repeating unit containing an alkali-soluble group, especially a repeating unit containing a carboxyl group. The resolution in contact hole usage can be enhanced by the incorporation of this repeating unit.

Both a repeating unit wherein the carboxyl group is directly bonded to the principal chain of the resin and a repeating unit wherein the carboxyl group is bonded via a connecting group to the principal chain of the resin are preferred as the repeating unit containing a carboxyl group.

As the former repeating unit, there can be mentioned, for example, an acrylic acid or methacrylic acid repeating unit. In the latter repeating unit, the connecting group may have a mono- or polycycloalkyl structure.

The repeating unit containing a carboxyl group is most preferably an acrylic acid or methacrylic acid repeating unit.

With respect to the resin that when acted on by an acid, is decomposed to thereby increase its solubility in an alkali developer, the weight average molecular weight thereof in terms of polystyrene-equivalent value as determined by GPC is preferably in the range of 2000 to 200,000. In particular, the heat resistance and dry etching resistance can be enhanced by regulating the weight average molecular weight to 2000 or greater. Not only can the developability be particularly enhanced but also, through lowering of the viscosity of the composition, the film forming property can be enhanced by regulating the weight average molecular weight to 200,000 or less.

More preferred molecular weight is in the range of 2500 to 50,000. Further more preferred molecular weight is in the range of 3000 to 20,000. In the formation of a nanopattern using electron beams, X-rays or high-energy rays of wavelength 50 nm or shorter (for example, EUV), it is most preferred for the weight average molecular weight to fall within the range of 3000 to 10,000. The enhancements of heat resistance and resolving power, reduction of development defects, etc. of the composition can be simultaneously attained by regulating the molecular weight.

With respect to the resin that when acted on by an acid, is decomposed to thereby increase its solubility in an alkali developer, the polydispersity index (Mw/Mn) thereof is preferably in the range of 1.0 to 3.0, more preferably 1.2 to 2.5 and further more preferably 1.2 to 1.6. For example, the line edge roughness performance can be enhanced by regulating this polydispersity index.

(R-5)
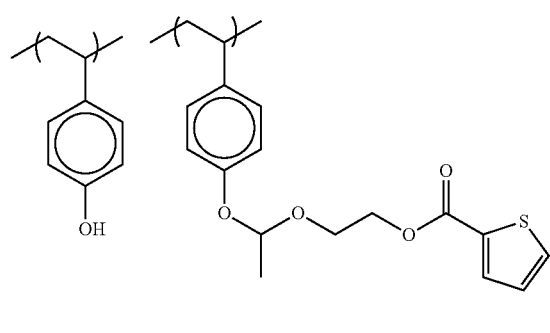
(R-6)
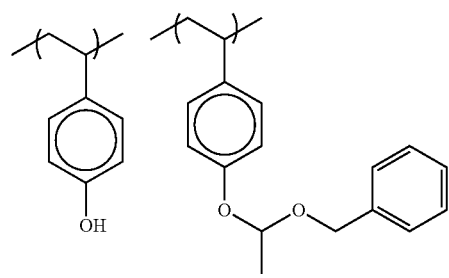
(R-7)
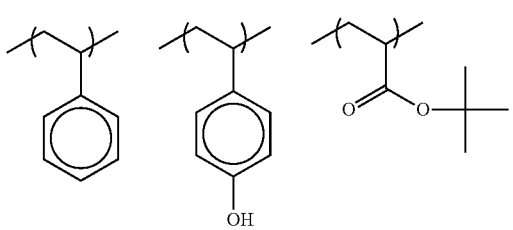
(R-8)
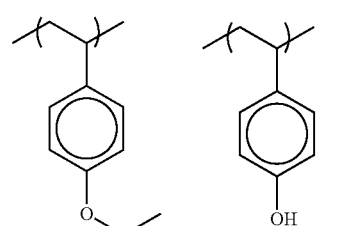
(R-9)
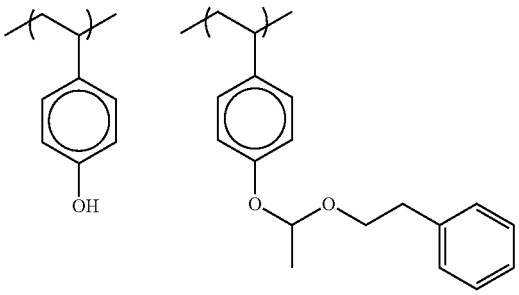
(R-10)
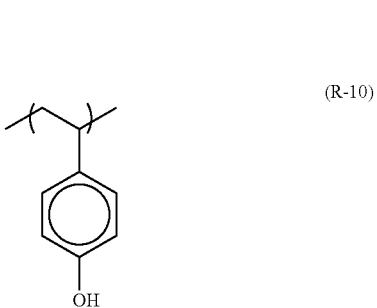
(R-11)
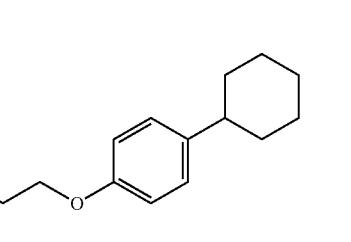
(R-12)
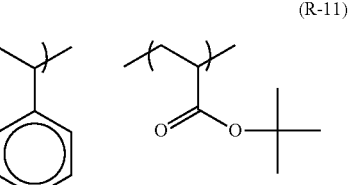
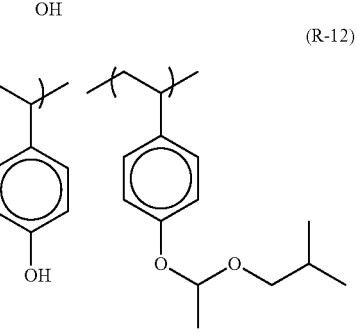

101
-continued
102
-continued
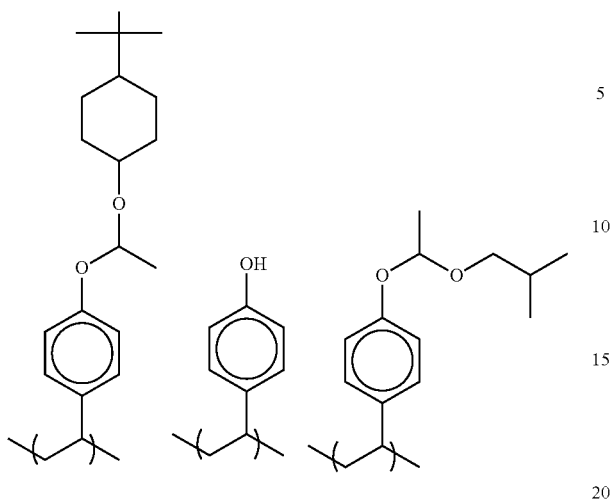
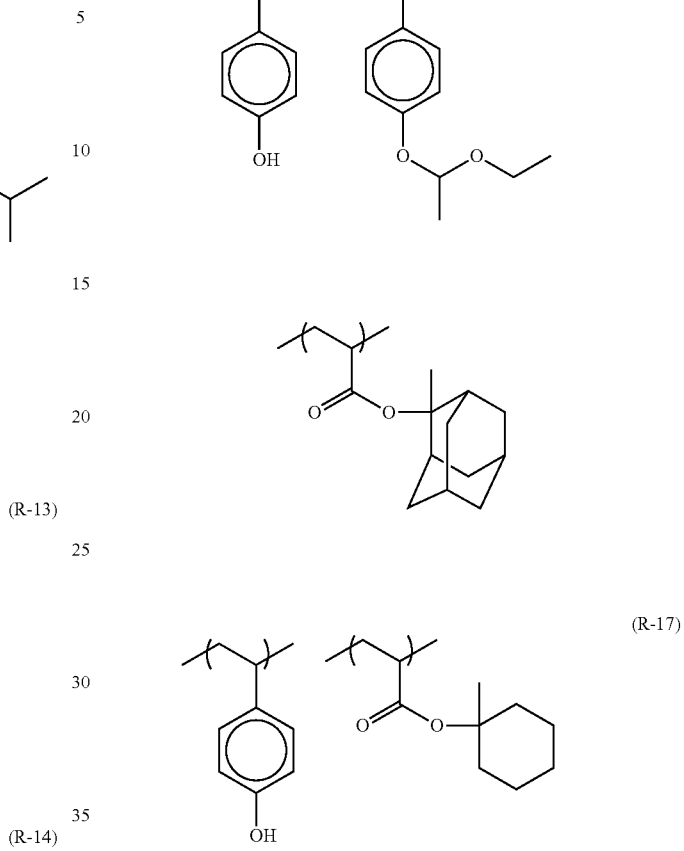
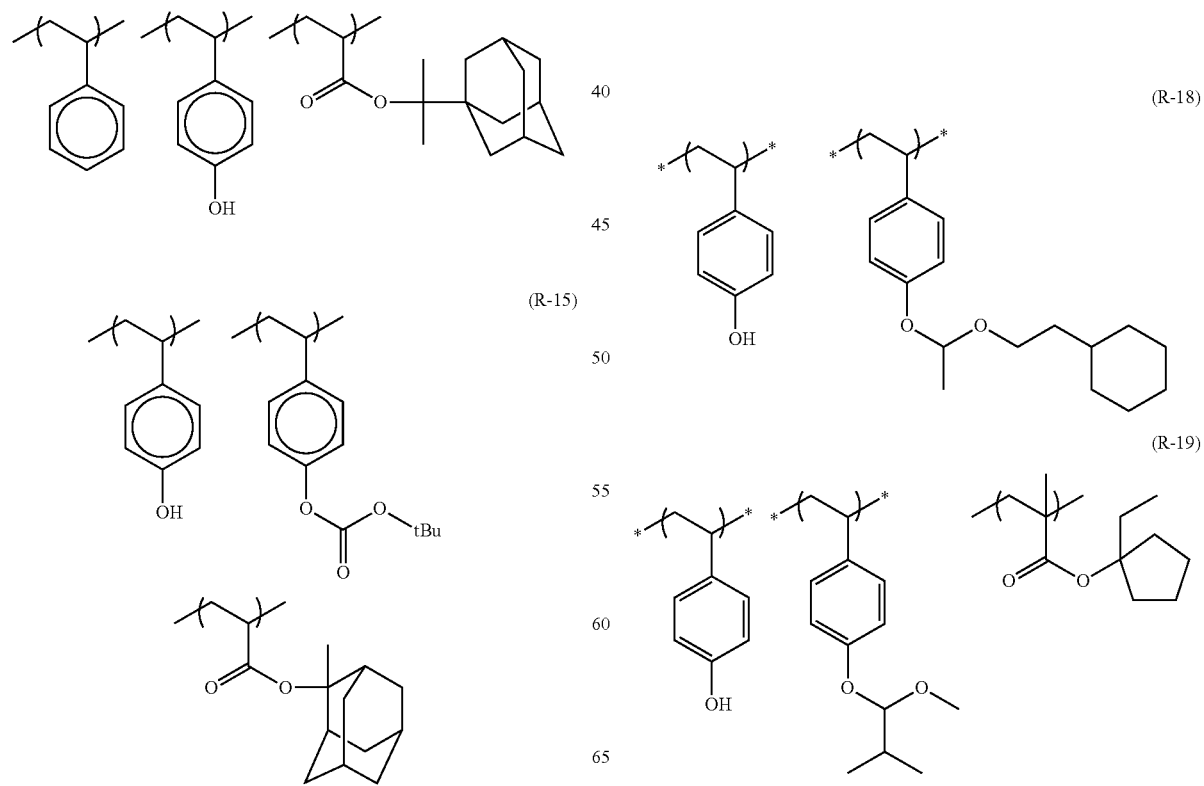

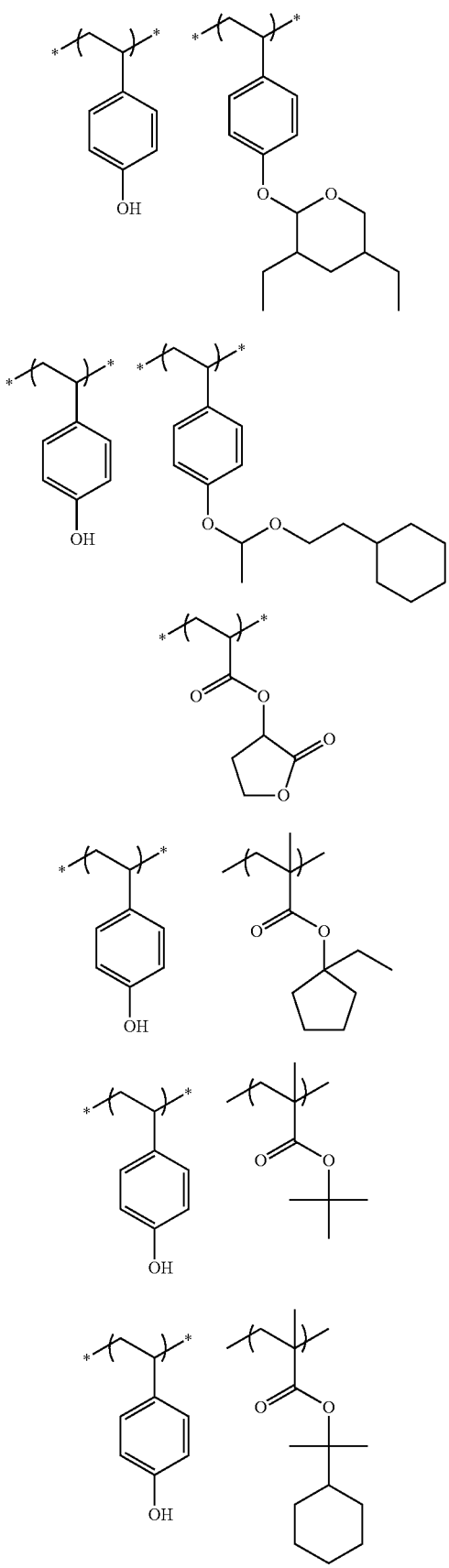
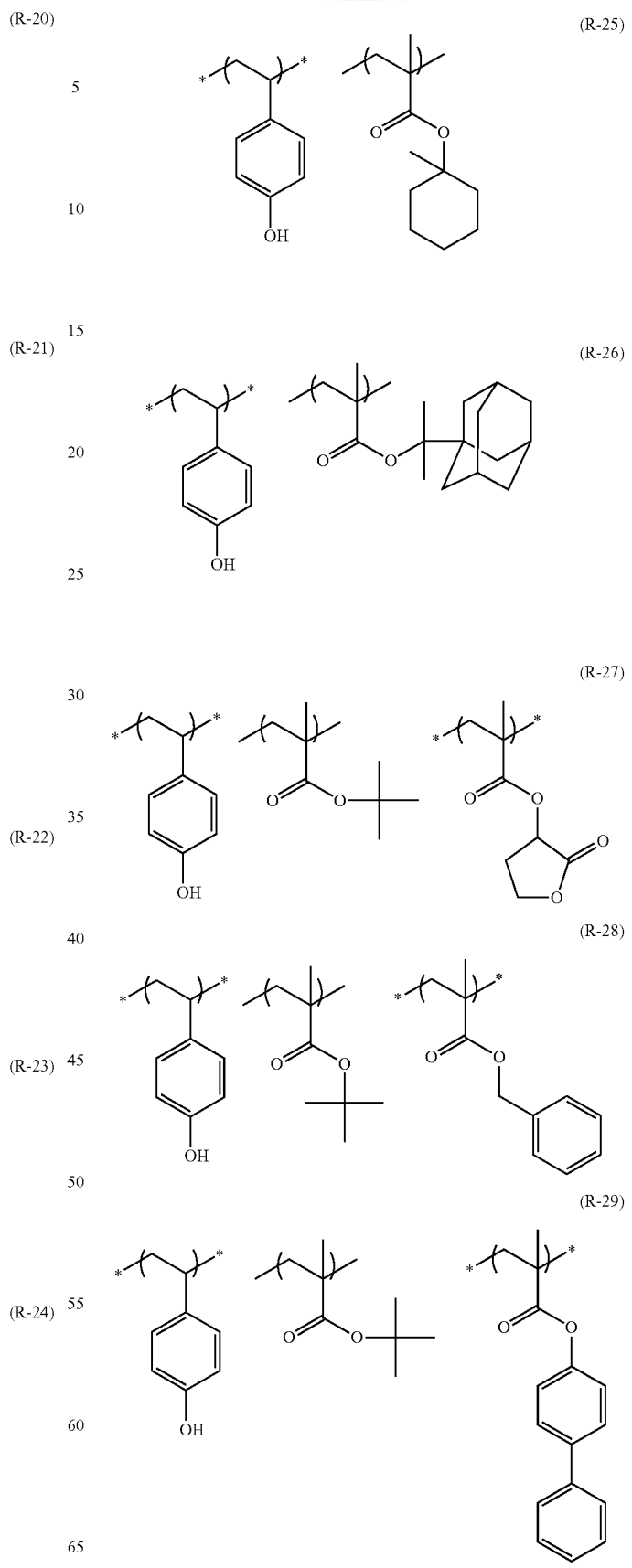

(R-30) 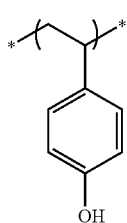 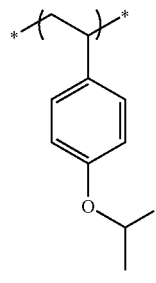

(R-33) 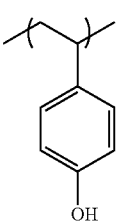 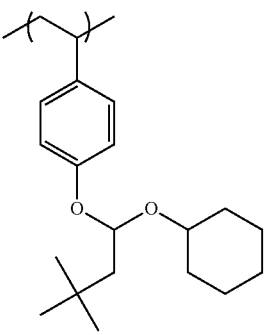

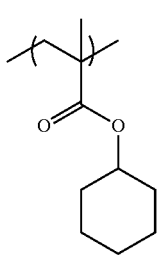

(R-34) 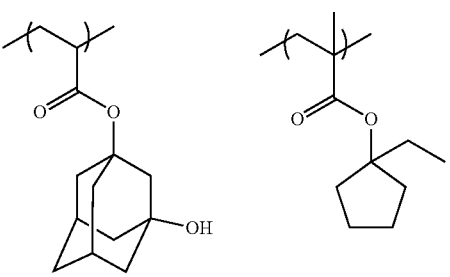

(R-31) 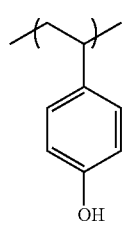 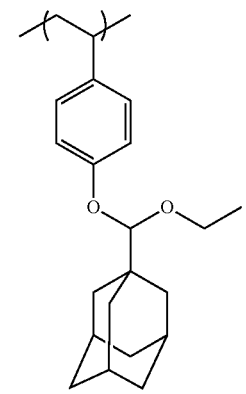

(R-32) 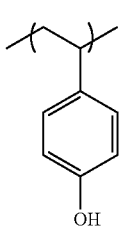 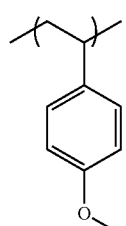

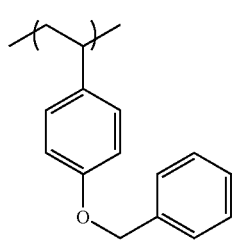

In the above particular examples, tBu represents a t-butyl group.

The content of resin (B) in the composition of the present invention, based on the total solids of the composition, is preferably in the range of 5 to 99.9 mass %, more preferably 40 to 95 mass % and most preferably 50 to 93 mass %.

[3] Resin Soluble in Alkali Developer

The negative actinic-ray- or radiation-sensitive resin composition of the present invention may contain a resin soluble in an alkali developer (hereinafter also referred to as, for example, "alkali-soluble resin" or "resin (C)") and further, according to necessity, an acid crosslinking agent (D). The alkali dissolution rate of the alkali-soluble resin (C) as measured in a 0.261 N tetramethylammonium hydroxide (TMAH) (23° C.) is preferably 2 nm/sec or higher, most preferably 20 nm/sec or higher.

As the alkali-soluble resin, there can be mentioned, for example, a novolak resin, a hydrogenated novolak resin, an acetone-pyrogallol resin, o-polyhydroxystyrene, m-polyhydroxystyrene, p-polyhydroxystyrene, a hydrogenated polyhydroxystyrene, a halogenated or alkylated polyhydroxystyrene, a hydroxystyrene-N-substituted maleimide copolymer, an o/p- and m/p-hydroxystyrene copolymer, a partial O-alkylation product of hydroxyl of polyhydroxystyrene (for example, a 5 to 30 mol % O-methylation product, O-(1-methoxy)ethylation product, O-(1-ethoxy)ethylation product, O-2-tetrahydropyranylation product, or O-(t-butoxycarbonyl)methylation product), an O-acylation product thereof (for example, a 5 to 30 mol % O-acetylation product, or O-(t-butoxy)carbonylation product), a styrene-maleic anhydride copolymer, a styrene-hydroxystyrene copolymer, an α-methylstyrene-hydroxystyrene copolymer, a carboxylated methacrylic resin or its derivative, or a polyvinyl alcohol derivative. However, the alkali-soluble resins are not limited to these.

Preferred alkali-soluble resins are a novolak resin, o-polyhydroxystyrene, m-polyhydroxystyrene, p-polyhydroxystyrene, a copolymer of these polyhydroxystyrenes, an alkylated polyhydroxystyrene, a partial O-alkylation product or O-acylation product of polyhydroxystyrene, a styrene-hydroxystyrene copolymer and an α-methylstyrene-hydroxystyrene copolymer.

Resins with hydroxystyrene structures are especially preferred in the present invention. Among the hydroxystyrene structures, a m-hydroxystyrene structure is especially preferred.

The above novolak resin can be obtained by the addition condensation of a given monomer as a main component with an aldehyde conducted in the presence of an acid catalyst.

The weight average molecular weight of the alkali-soluble resin is 2000 or greater, preferably from 5000 to 200,000 and more preferably 5000 to 100,000. Herein, the weight average molecular weight refers to a polystyrene-equivalent value determined by GPC (gel permeation chromatography).

In the present invention, two or more of these alkali-soluble resins (C) may be used in combination.

The amount of alkali-soluble resin (C) added is in the range of, for example, 40 to 97 mass %, preferably 60 to 90 mass %, based on the total solids of the composition.

[4] Acid Crosslinking Agent Capable of Crosslinking with the Alkali-Soluble Resin by the Action of an Acid The negative actinic-ray- or radiation-sensitive resin composition of the present invention may further contain an acid crosslinking agent (D).

Any compound capable of crosslinking the above alkali-soluble resin (C) by the action of an acid can be used as the acid crosslinking agent (D). The following compounds (1) to (3) are preferred.

(1) A hydroxymethylated form, alkoxymethylated form or acyloxymethylated form of phenol derivative;

(2) a compound containing an N-hydroxymethyl group, an N-alkoxymethyl group or an N-acyloxymethyl group; and (3) a compound containing an epoxy group.

The alkoxymethyl group preferably has 6 or less carbon atoms, and the acyloxymethyl group preferably has 6 or less carbon atoms.

Those especially preferred among these crosslinking agents are shown below.

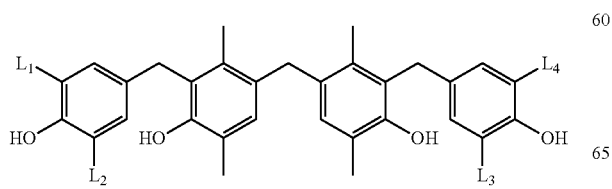

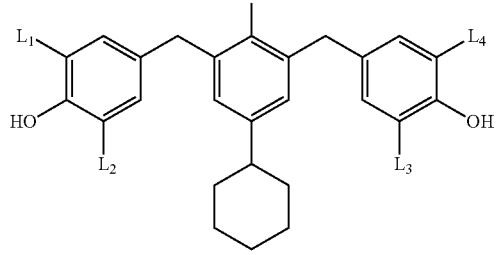

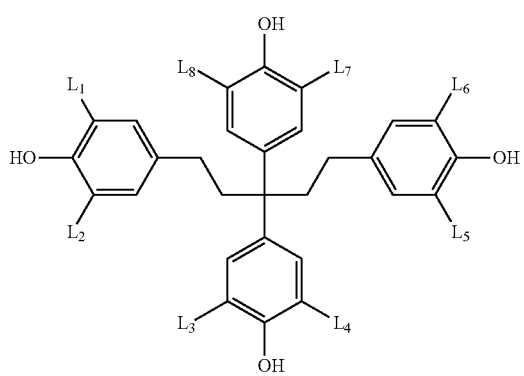

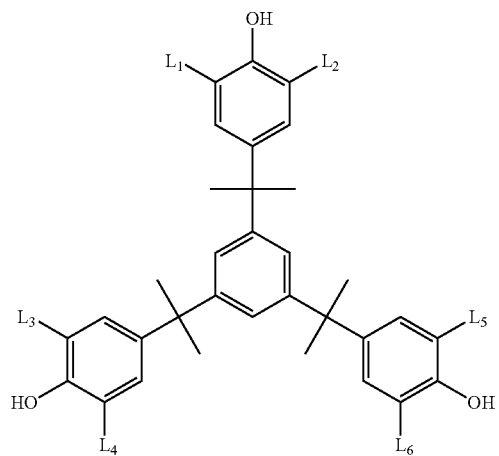

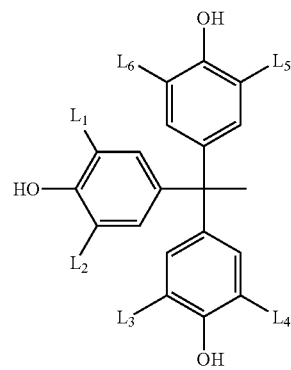

-continued

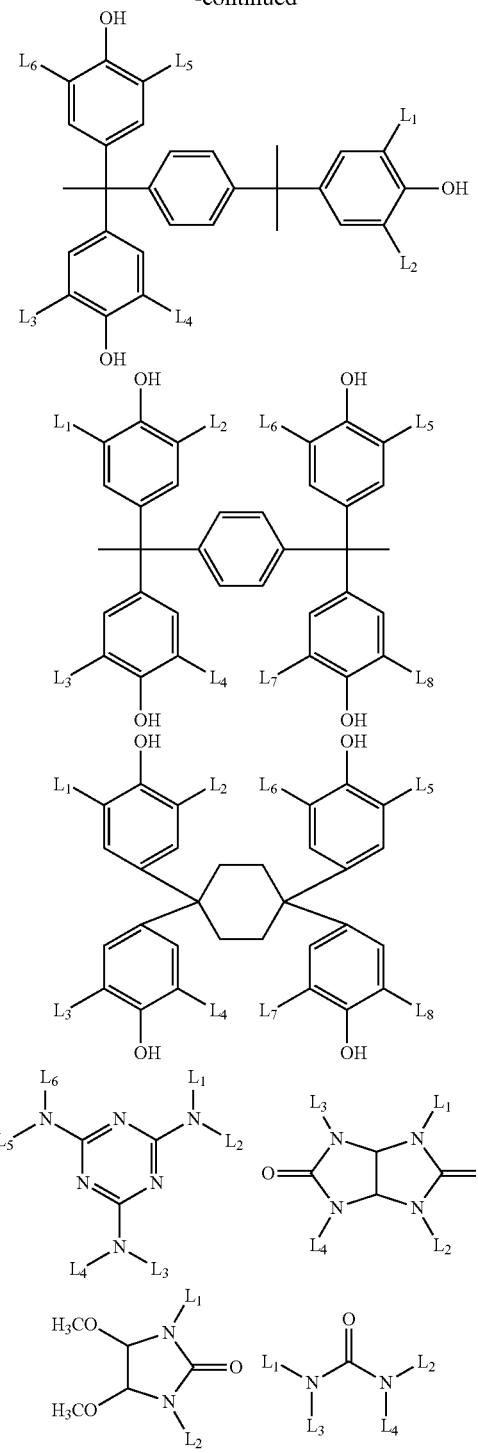

In the formulae, $L_1$ to $L_8$ may be identical to or different from each other, and each thereof represents a hydrogen atom, a hydroxymethyl group, an alkoxymethyl group (preferably a methoxymethyl group or an ethoxymethyl group), or an alkyl group having 1 to 6 carbon atoms.

The acid crosslinking agent is generally added in an amount of 3 to 70 mass %, preferably 5 to 50 mass %, based on the total solids of the actinic-ray- or radiation-sensitive resin composition.

Dissolution Inhibiting Compound

The positive actinic-ray- or radiation-sensitive resin composition of the present invention may further contain a dissolution inhibiting compound. Here the "dissolution inhibiting compound" means compound having 3000 or less molecular weight that is decomposed by the action of an acid to increase the solubility in an alkali developer. From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). Particular examples of the acid-decomposable groups are the same as set forth above in connection with the acid-decomposable units.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

The content of the dissolution inhibiting compound based on the total solids of the composition is preferably in the range of 3 to 50 mass %, more preferably 5 to 40 mass %.

Specific examples of the dissolution inhibiting compound will be shown below, which however in no way limit the scope of the present invention.

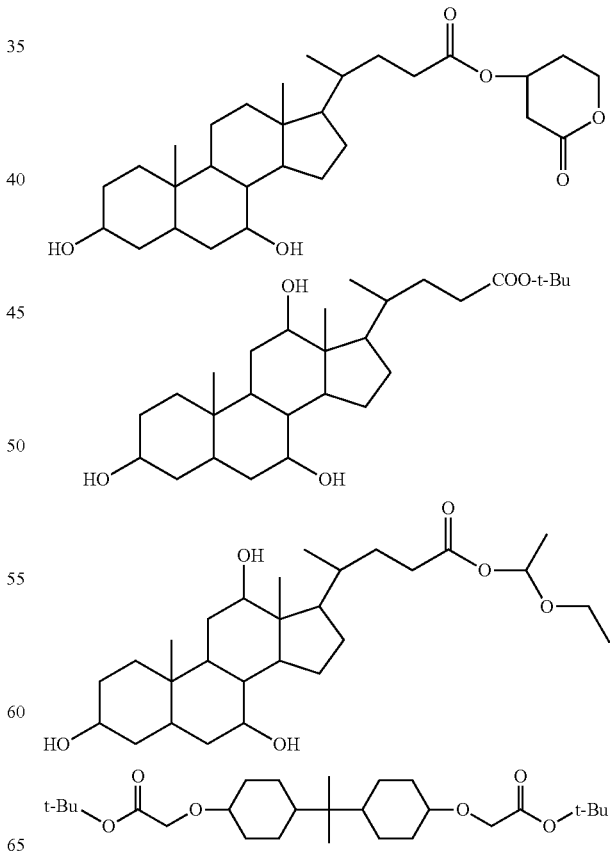

-continued

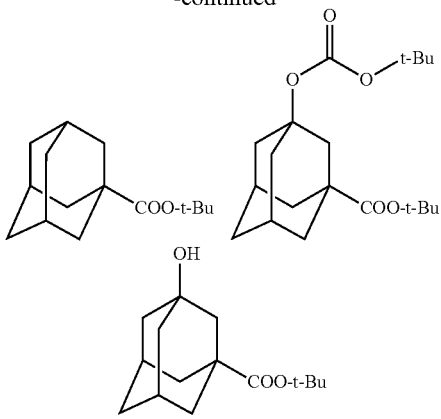

[6] Other Component

The positive or negative actinic-ray- or radiation-sensitive resin composition of the present invention may further comprise a basic compound, an organic solvent, a surfactant, a dye, a plasticizer, a photosensitizer, a compound capable of increasing the solubility in a developer, a compound containing a functional group as a proton acceptor, etc.

[Basic Compound]

The composition of the present invention may further contain a basic compound. Any change over time of performance during the period from exposure to baking (postbake) can be reduced by further containing a basic compound. Moreover, if so, the in-film diffusion of an acid generated upon exposure can be controlled.

The basic compound is preferably a nitrogen-containing organic compound. Useful compounds are not particularly limited. However, for example, the compounds of categories (1) to (4) below can be used.

(1) Compounds of General Formula (BS-1) Below

(BS-1)

In general formula (BS-1), each of R's independently represents a hydrogen atom or an organic group, provided that at least one of three R's is an organic group. The organic group is a linear or branched alkyl group, a mono- or polycycloalkyl group, an aryl group or an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds of general formula (BS-1), preferably, at least two of R's are organic groups.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(t-butyl)aniline.

As preferred basic compounds of general formula (BS-1), there can be mentioned those in which at least one of R's is a hydroxylated alkyl group. In particular, there can be mentioned, for example, triethanolamine and N,N-dihydroxyethylaniline.

With respect to the alkyl group represented by R, an oxygen atom may be present in the alkyl chain. Namely, an oxyalkylene chain may be formed. The oxyalkylene chain is preferably —CH$_2$CH$_2$O—. In particular, there can be mentioned, for example, tris(methoxyethoxyethyl)amine and compounds shown by way of example in column 3 line 60 et seq. of U.S. Pat. No. 6,040,112.

(2) Compound with Nitrogen-Containing Heterocyclic Structure

The nitrogen-containing heterocycle may be aromatic or nonaromatic. It may contain a plurality of nitrogen atoms, and also may contain a heteroatom other than nitrogen. For example, there can be mentioned compounds with an imidazole structure (2-phenylbenzimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. In particular, there can be mentioned, for example, 1,5-diazabicyclo[4.3.0]non-5-ene and 1,8-diazabicyclo[5.4.0]-undec-7-ene.

(3) Amine Compound with Phenoxy Group

The amine compounds with a phenoxy group are those having a phenoxy group at the end of the alkyl group of each of the amine compounds opposite to the nitrogen atom. A substituent may be introduced in the phenoxy group. The substituent is, for example, an alkyl group, an alkoxy group, a halogen atom, a cyano group, a nitro group, a carboxyl group, a carboxylic ester group, a sulfonic ester group, an aryl group, an aralkyl group, an acyloxy group or an aryloxy group.

Each of these compounds preferably contains at least one oxyalkylene chain between the phenoxy group and the nitrogen atom. The number of oxyalkylene chains in each molecule is preferably in the range of 3 to 9, more preferably 4 to 6. Among the oxyalkylene chains, —CH$_2$CH$_2$O— is most preferred.

Particular examples thereof include 2-[2-{2-(2,2-dimethoxy-phenoxyethoxy)ethyl}-bis-(2-methoxyethyl)]-amine and compounds (C1-1) to (C3-3) shown by way of example in section [0066] of US Patent Application Publication No. 2007/0224539 A1.

(4) Ammonium Salt

Ammonium salts can also be appropriately used. Ammonium hydroxides and carboxylates are preferred. Particular preferred examples thereof are tetraalkylammonium hydroxides, such as tetrabutylammonium hydroxide.

As other basic compounds usable in the positive or negative actinic-ray- or radiation-sensitive resin composition of the present invention, there can be mentioned compounds synthesized in Examples of JP-A-2002-363146, compounds described in section [0108] of JP-A-2007-298569 and the like.

Further, photosensitive basic compounds may be used as the basic compound. As photosensitive basic compounds, use can be made of, for example, the compounds described in Jpn. PCT National Publication No. 2003-524799, J. Photopolym. Sci&Tech. Vol. 8, pp. 543-553 (1995), etc.

The molecular weight of each of these basic compounds is preferably in the range of 250 to 2000, more preferably 400 to 1000.

One of these basic compounds may be used alone, or two or more thereof may be used in combination.

The content of the basic compounds based on the total solids of the composition is preferably in the range of 0.01 to 8.0 mass %, more preferably 0.1 to 5.0 mass % and most preferably 0.2 to 4.0 mass %.

[Surfactant]

The composition according to the present invention may further contain a surfactant. The surfactant is most preferably a fluorinated and/or siliconized surfactant.

As such a surfactant, there can be mentioned, for example, Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., or polysiloxane polymer KP-341 produced by Shin-Etsu Chemical Co., Ltd.

Surfactants other than these fluorinated and/or siliconized surfactants can also be used. In particular, the other surfactants include polyoxyethylene alkyl ethers, polyoxyethylene alkyl aryl ethers and the like.

Moreover, heretofore known surfactants can also be appropriately used. As useful surfactants, there can be mentioned, for example, those described in section [0273] et seq of US Patent Application Publication No. 2008/0248425 A1.

These surfactants may be used alone or in combination.

The content of the surfactant is preferably in the range of 0 to 2 mass %, more preferably 0.0001 to 2 mass % and still more preferably 0.001 to 1 mass %, based on the total solids of the composition.

[Solvent]

The solvent that is usable in the preparation of the composition is not particularly limited as long as it can dissolve the components of the composition. For example, use can be made of an alkylene glycol monoalkyl ether carboxylate (propylene glycol monomethyl ether acetate (PGMEA, also known as 1-methoxy-2-acetoxypropane) or the like), an alkylene glycol monoalkyl ether (propylene glycol monomethyl ether (PGME, also known as 1-methoxy-2-propanol) or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (preferably ethyl ethoxypropionate) or the like. As other useful solvents, there can be mentioned, for example, those described in section [0244] et seq. of US 2008/0248425 A1 and the like.

Among the above solvents, an alkylene glycol monoalkyl ether carboxylate, an alkylene glycol monoalkyl ether, and ethyl lactate are especially preferred.

These solvents may be used alone or in combination. When two or more types of solvents are mixed together before use, it is preferred to mix a hydroxylated solvent with a non-hydroxylated solvent. The mass ratio of hydroxylated solvent to non-hydroxylated solvent is in the range of, for example, 1/99 to 99/1. The mass ratio is preferably 10/90 to 90/10, more preferably 20/80 to 60/40.

The hydroxylated solvent is preferably an alkylene glycol monoalkyl ether or an alkyl lactate. The non-hydroxylated solvent is preferably an alkylene glycol monoalkyl ether carboxylate.

The amount of solvent used is not particularly limited. However, the amount is generally so regulated that the total solid concentration of the composition falls in the range of preferably 0.5 to 30 mass %, more preferably 1.0 to 10 mass %. In particular when an electron beam or EUV lithography is carried out using the composition of the present invention, the amount is so regulated that the concentration falls in the range of preferably 2.0 to 6.0 mass %, more preferably 2.0 to 4.5 mass %.

[Other Additive]

According to necessity, the positive or negative actinic-ray- or radiation-sensitive resin composition of the present invention may further comprise a dye, a plasticizer, a photosensitizer, a light absorber, a compound capable of accelerating the dissolution in a developer (for example, a phenolic compound of 1000 or less molecular weight, or a carboxylated alicyclic or aliphatic compound), etc. Furthermore, appropriate use can be made of compounds containing a functional group with proton acceptor properties as described in, for example, JP-A's 2006-208781 and 2007-286574.

[7] Method of Forming Pattern

The positive or negative actinic-ray- or radiation-sensitive resin composition of the present invention is typically used in the following manner. Namely, the composition of the present invention is typically applied onto a support, such as a substrate, thereby forming a film. The thickness of the film is preferably in the range of 0.02 to 10.0 μm. The method of application onto a substrate is preferably a spin coating. The spin coating is performed at a rotating speed of preferably 1000 to 3000 rpm.

For example, the composition is applied onto, for example, any of substrates (e.g., silicon/silicon dioxide coating, silicon nitride and chromium-vapor-deposited quartz substrate, etc.) for use in, for example, the production of precision integrated circuit devices, etc. by appropriate application means, such as a spinner or a coater. The thus applied composition is dried, thereby obtaining an actinic-ray- or radiation-sensitive film (hereinafter also referred to as a photosensitive film). The application of the composition can be preceded by the application of a heretofore known antireflection film.

The resultant photosensitive film is exposed to actinic rays or radiation, preferably baked (heated), and developed. A pattern of enhanced quality can be obtained by baking. From the viewpoint of sensitivity and stability, the baking temperature is preferably in the range of 80 to 150° C., more preferably 90 to 130° C.

As the actinic rays or radiation, there can be mentioned, for example, infrared light, visible light, ultraviolet light, far-ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays or electron beams. As especially preferred actinic rays or radiation, there can be mentioned an ArF excimer laser, $F_2$ excimer laser, EUV-rays (13 nm) or electron beams.

The exposure performed in the condition that the interstice between the photosensitive film and a lens is filled with a liquid (for example, pure water) whose refractive index is higher than that of air, namely, liquid-immersion exposure may be carried out in the stage of the exposure to actinic rays or radiation. This liquid-immersion exposure can enhance the resolution. At the liquid-immersion exposure, for the prevention of any contact of the resist film with the immersion liquid, a film that is highly insoluble in the immersion liquid (also referred to as a "top coat") may be disposed on the film and between the film and the immersion liquid. As another means for the prevention of any contact of the film with the immersion liquid, a hydrophobic resin (HR) may be added to the above composition in advance.

The hydrophobic resin (HR) will be described in detail below.

In the exposure of the film of the composition of the present invention via the liquid immersion medium, a hydrophobic resin (HR) may be further added according to necessity. This would bring about uneven localization of the hydrophobic resin (HR) on the surface layer of the film. When the liquid immersion medium is water, there would be attained an improvement of receding contact angle on the surface of the film with reference to water upon formation of the film, and accordingly an enhancement of the liquid immersion water tracking property. By the addition of the hydrophobic resin (HR), the improvement of the receding contact angle on the surface of the film is realized. The receding contact angle of the film is preferably in the range of 60° to 90°, more preferably 70° or higher. Although the hydrophobic resin (HR) is unevenly localized on the interface as aforementioned, differing from the surfactant, the hydrophobic resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the resist film in dynamic condition is important, and it is required for the resist to be capable of tracking the high-speed scanning of the exposure head without leaving any droplets.

As the hydrophobic resin (HR) is unevenly distributed in a surface of the film, it is preferred for the hydrophobic resin to contain a fluorine atom or a silicon atom. The fluorine atom or silicon atom of the hydrophobic resin (HR) may be present in the principal chain of the resin or may be a substituent on the side chain thereof.

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a monocyclic or polycyclic alkyl group having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

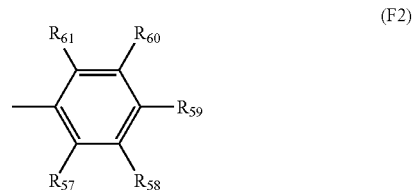

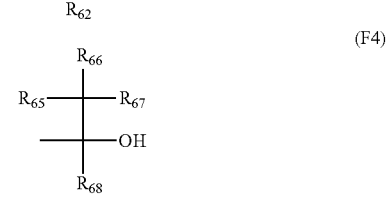

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R^{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R^{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

Specific examples of the repeating units having a fluorine atom will be shown below, which however in no way limit the scope of the present invention.

In the specific examples, X$_1$ represents a hydrogen atom, —CH$_3$, —F or —CF$_3$. X$_2$ represents —F or —CF$_3$.

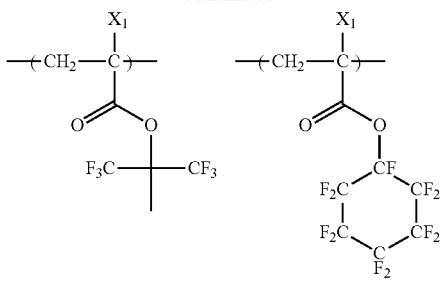

-continued

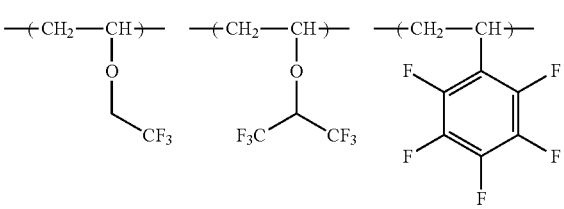

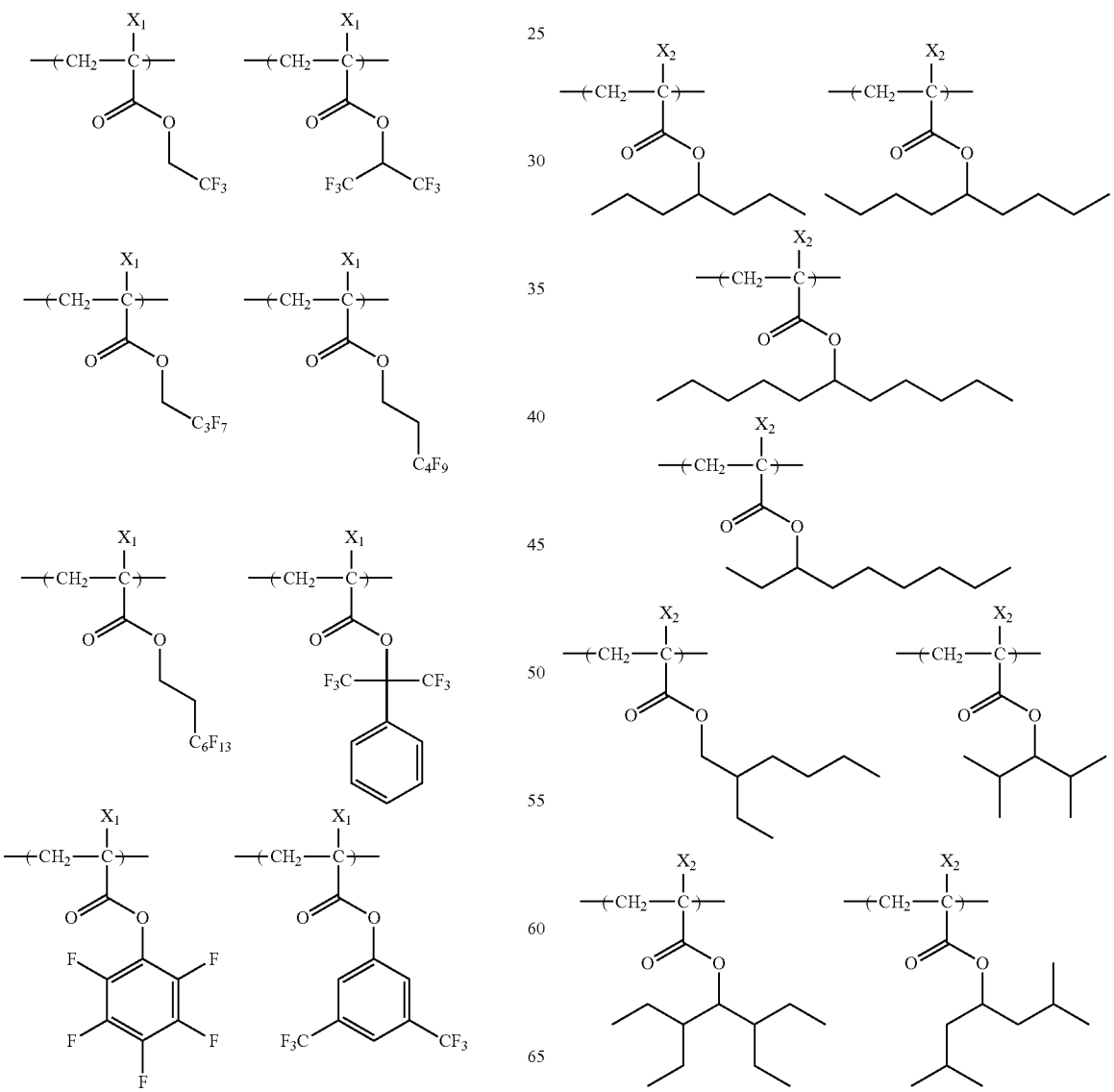

-continued

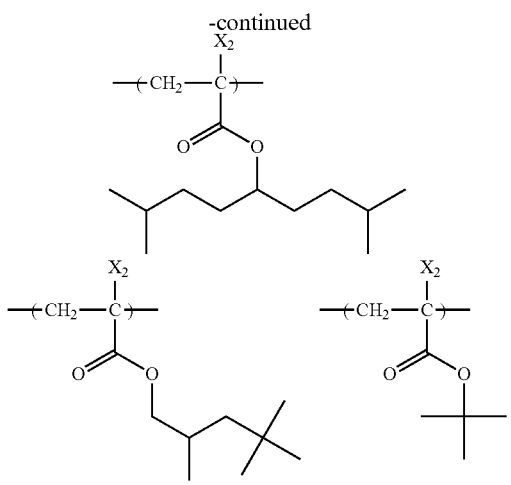

The hydrophobic resin (HR) may contain a silicon atom. The hydrophobic resin (HR) is preferably a resin having an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

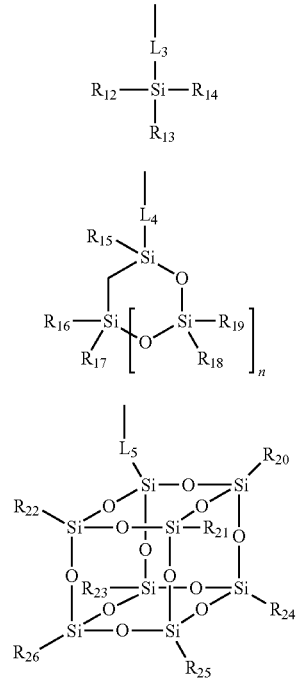

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

Specific examples of the repeating units having the groups of the general formulae (CS-1) to (CS-3) will be shown below, which however in no way limit the scope of the present invention.

In the specific examples, $X_1$ represents a hydrogen atom, —$CH_3$, —F or —$CF_3$.

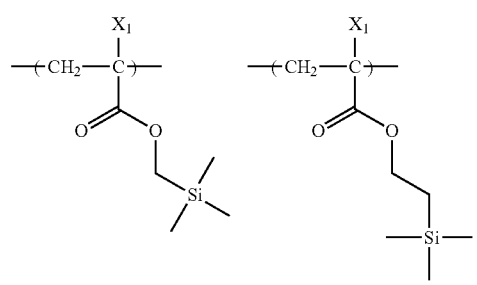

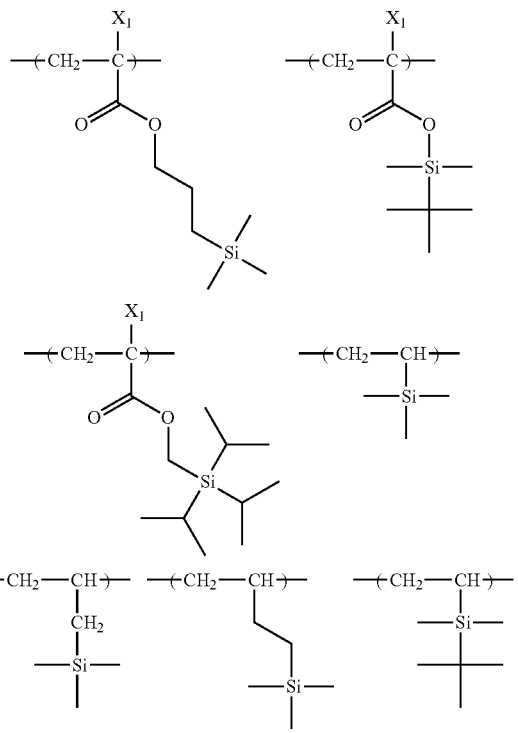

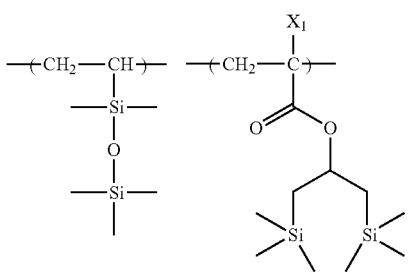

-continued

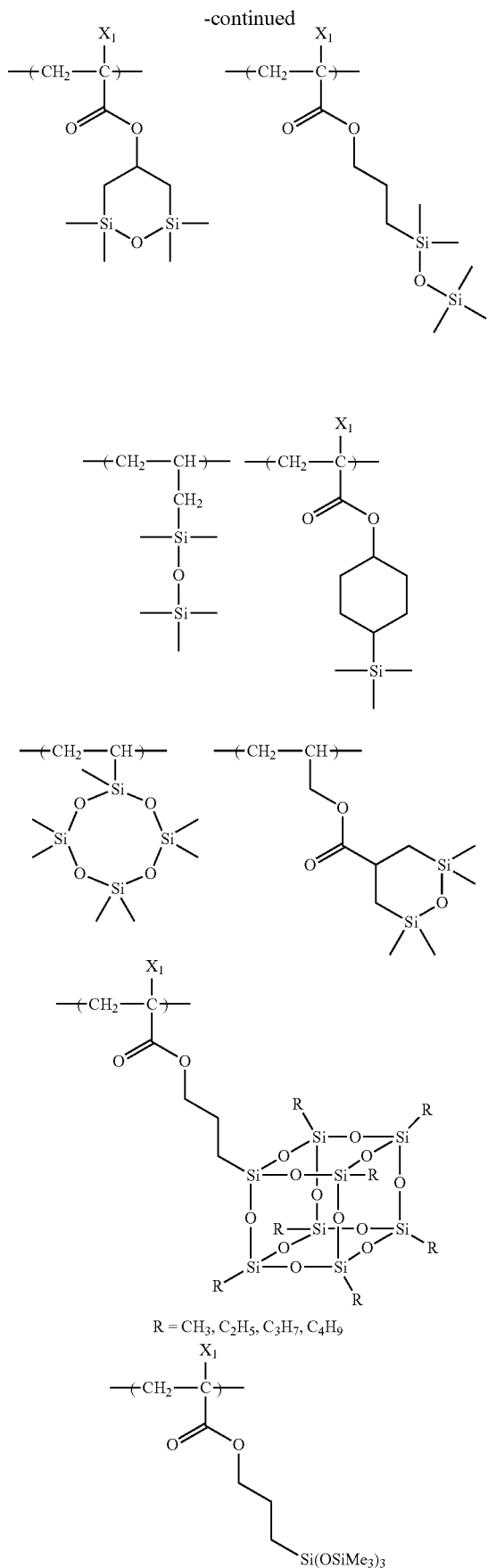

Moreover, the hydrophobic resin (HR) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content of repeating units having an alkali soluble group (x) is preferably in the range of 1 to 50 mol %, more preferably 3 to 35 mol % and still more preferably 5 to 20 mol % based on all the repeating units of the polymer.

Specific examples of the repeating units having an alkali soluble group (x) will be shown below, which however in no way limit the scope of the present invention.

In the formulae, Rx represents H, $CH_3$, $CF_3$ or $CH_2OH$.

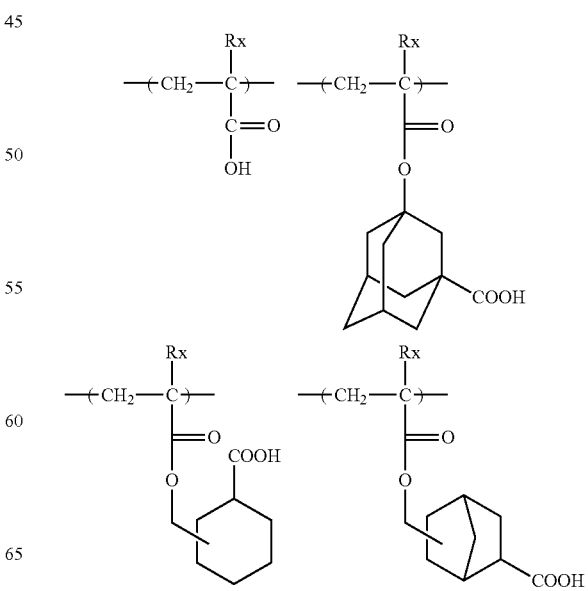

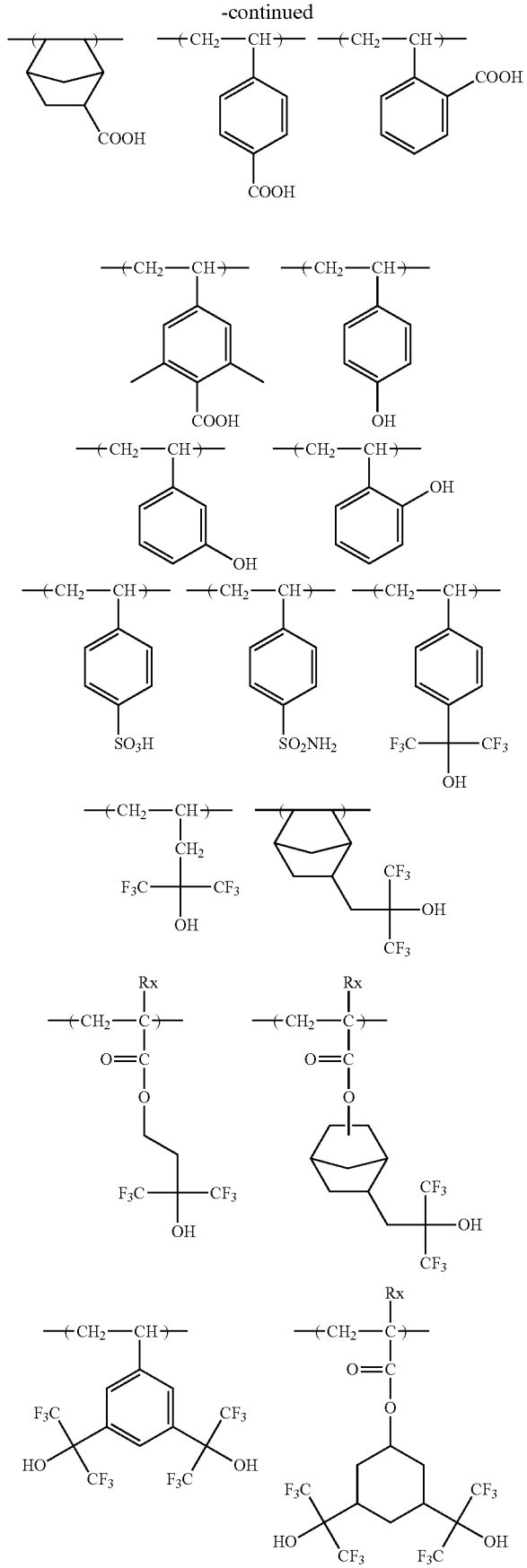
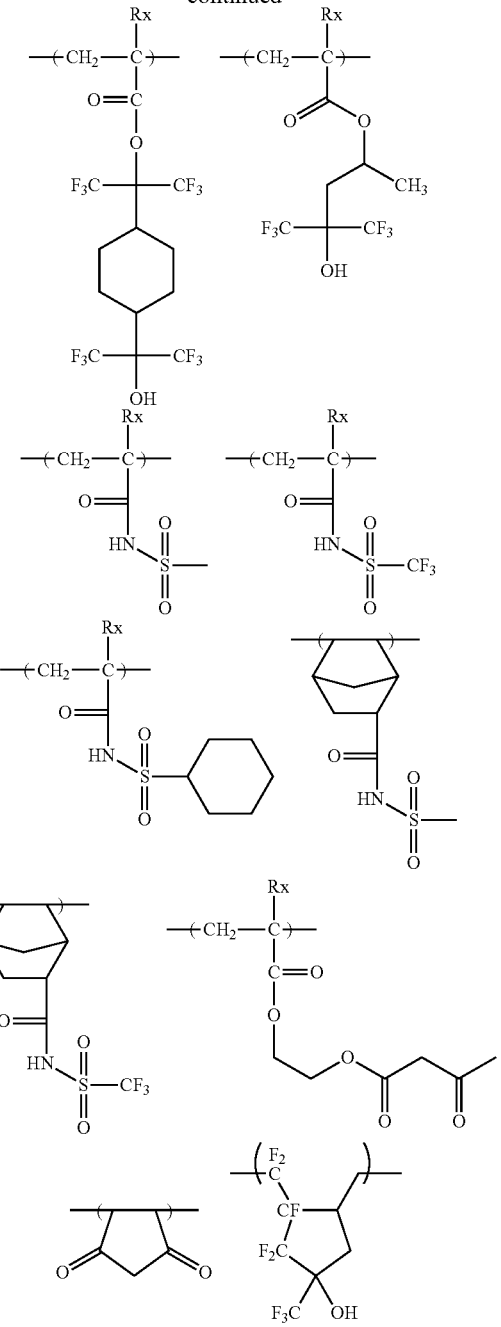

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 40 mol %, more preferably 3 to 30 mol % and still more preferably 5 to 15 mol % based on all the repeating units of the polymer.

As specific examples of the repeating units having a group (y) resulting in an increase of solubility in an alkali developer, there can be mentioned those similar to the repeating units having a lactone structure set forth with respect to the resins as the component (B).

As the repeating unit having a group (z) that is decomposed by the action of an acid in the hydrophobic resin (HR), there can be mentioned those similar to the repeating units having an acid decomposable group set forth with respect to the resin (B). The content of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the polymer.

The hydrophobic resin (HR) may further have any of the repeating units of the following general formula (III).

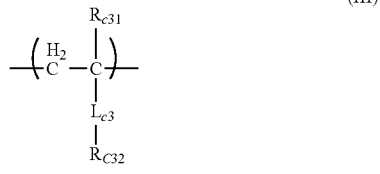

In the general formula (III), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a silicon atom.

$L_{c3}$ represents a single bond or a bivalent connecting group.

In the general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, such as a phenyl group or a naphthyl group. These groups may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

Further, the hydrophobic resin (HR) may preferably have any of the repeating units of general formula (CII-AB) below.

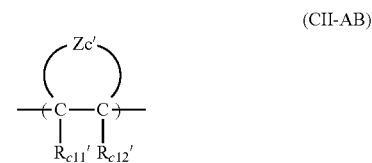

In the general formula (CII-AB), each of $R_{c11}'$ and $R_{c12}'$, independently represents a hydrogen atom, a cyano group, a halogen atom or an alkyl group.

$Zc'$ represents an atomic group for forming an alicyclic structure which contains two bonded carbon atoms (C—C).

Specific examples of the repeating units of the general formula (III) and general formula (CII-AB) will be shown below, which however in no way limit the scope of the present invention. In the formulae, Ra represents H, $CH_3$, $CH_2OH$, $CF_3$ or CN.

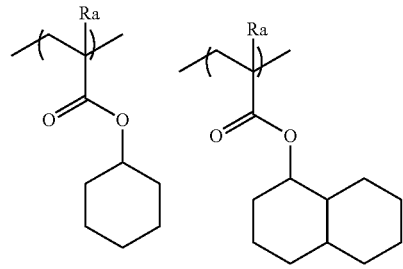
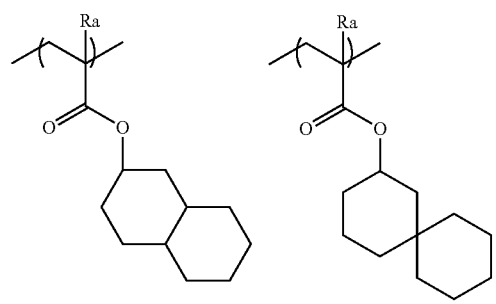
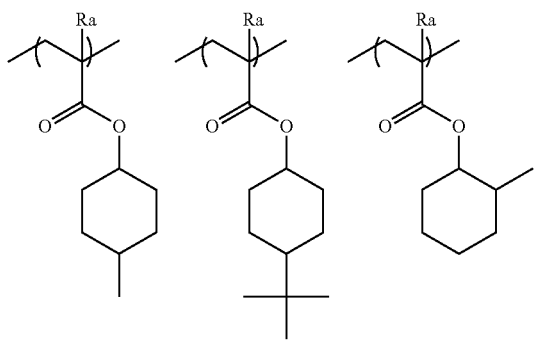

-continued

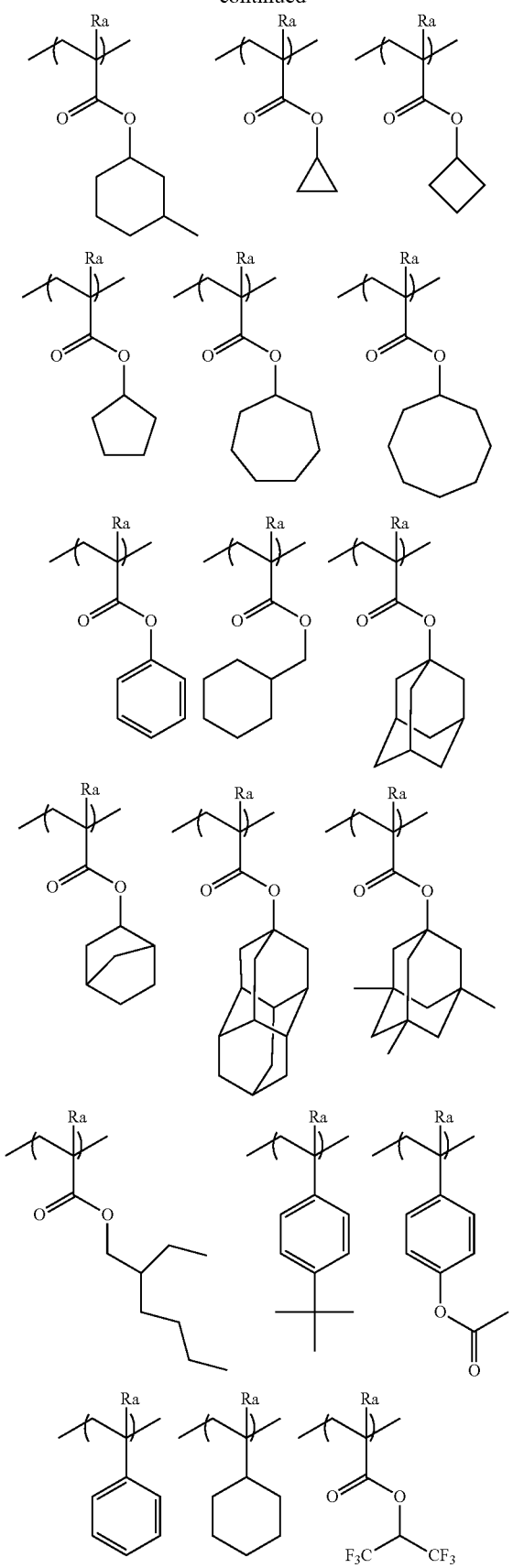

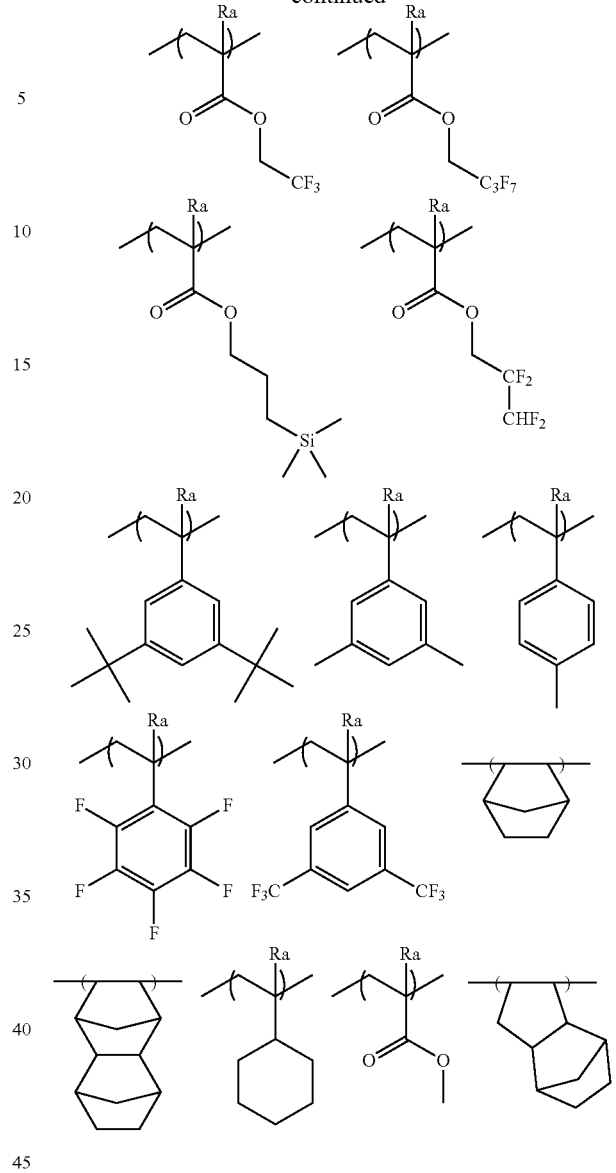

When the hydrophobic resin (HR) has a fluorine atom, the content of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %.

When the hydrophobic resin (HR) has a silicon atom, the content of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 100 mass %, more preferably 20 to 100 mass %.

The weight average molecular weight of the hydrophobic resin (HR) in terms of standard polystyrene molecular weight is preferably in the range of 1,000 to 100,000, more preferably 1,000 to 50,000 and still more preferably 2,000 to 15,000.

The content of the hydrophobic resin (HR) in the composition is preferably in the range of 0.01 to 10 mass %, more preferably 0.05 to 8 mass % and still more preferably 0.1 to 5 mass % based on the total solid of the composition of the present invention.

Impurities, such as metals, should naturally be of low quantity in the hydrophobic resin (HR), as for the resin (B). The content of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the polydispersity) thereof is preferably in the range of 1 to 5, more preferably 1 to 3 and still more preferably 1 to 2.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the aforementioned solvent capable of dissolving the composition of the present invention, such as propylene glycol monomethyl ether acetate, propylene glycol monomethyl ether or cyclohexanone. Preferably, the polymerization is carried out with the use of the same solvent as that used in the composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.

(HR-1) 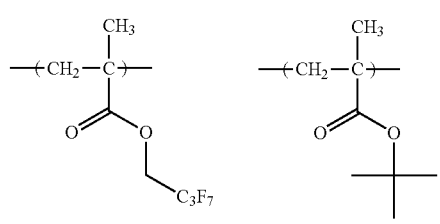
(HR-2) 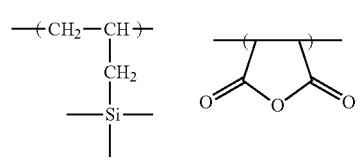
(HR-3) 
(HR-4) 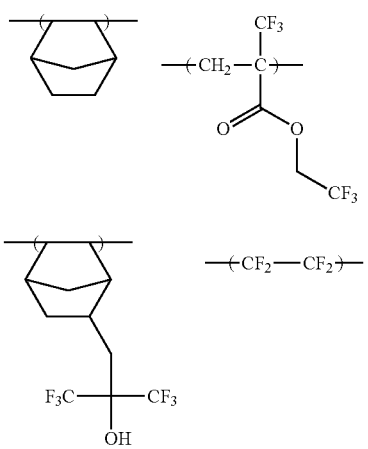
(HR-5) 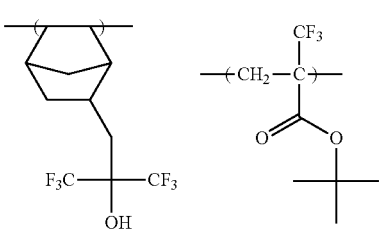
(HR-6) 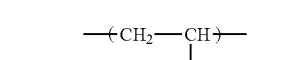
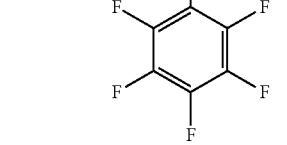
(HR-7) 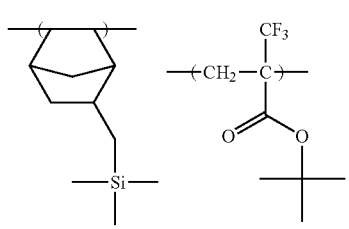
-continued
(HR-8) 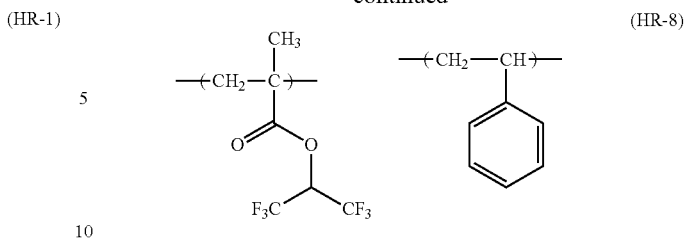
(HR-9) 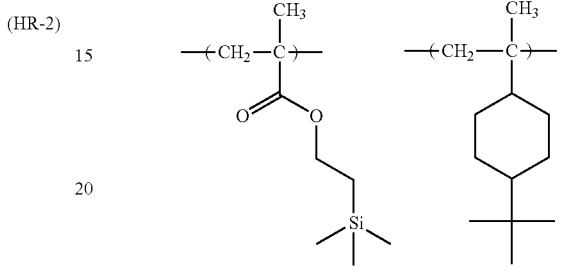
(HR-10) 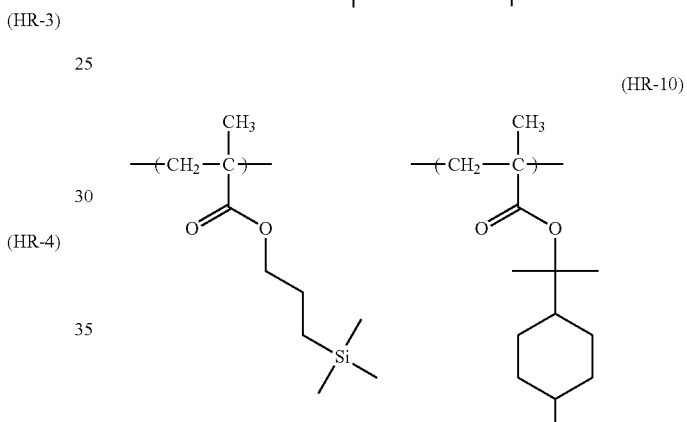
(HR-11) 
(HR-12) 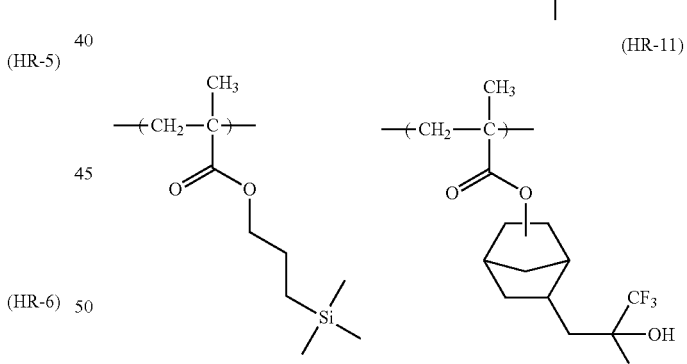

(HR-13)
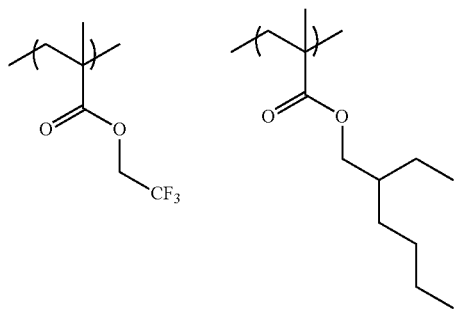
(HR-14)
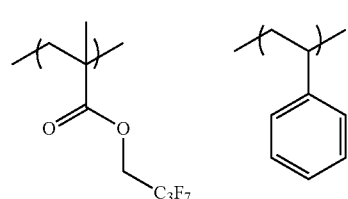
(HR-15)
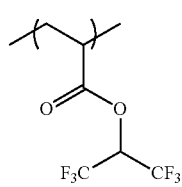
(HR-16)
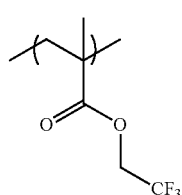
(HR-17)
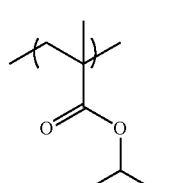
(HR-18)
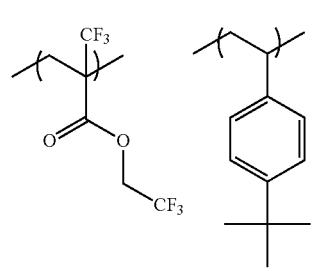
(HR-19)
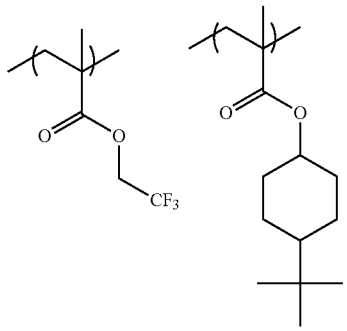
(HR-20)
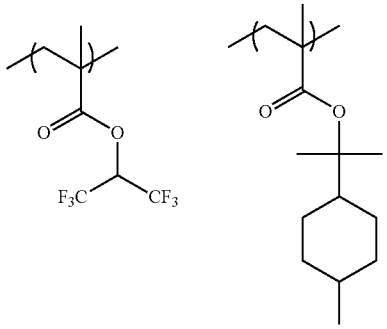
(HR-21)
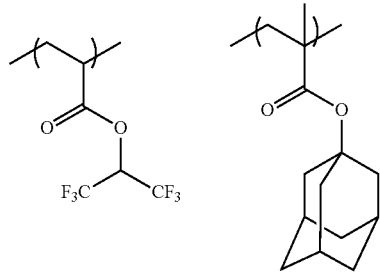
(HR-22)
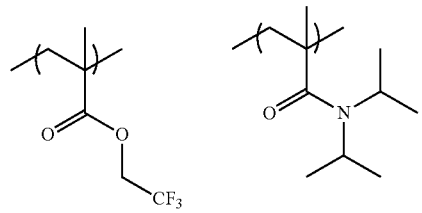
(HR-23)
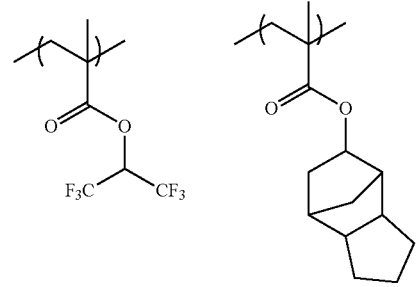

(HR-24)
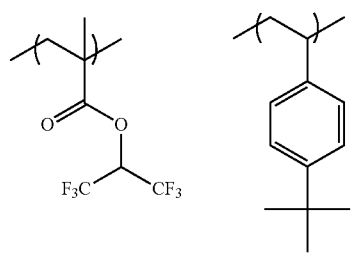
(HR-25)
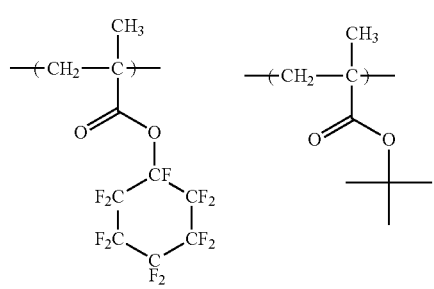
(HR-26)
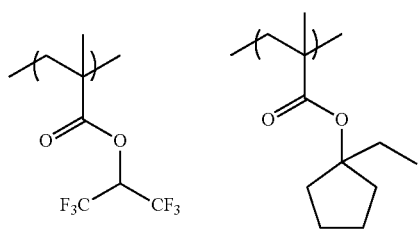
(HR-27)
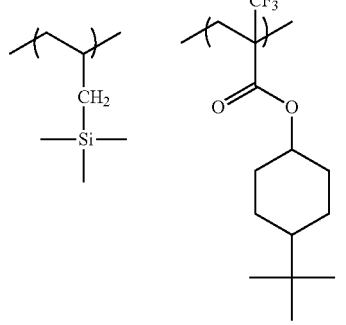
(HR-28)
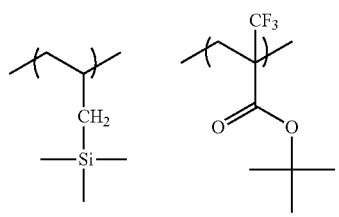
(HR-29)
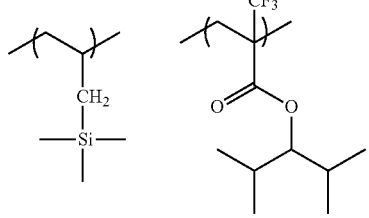
(HR-30)
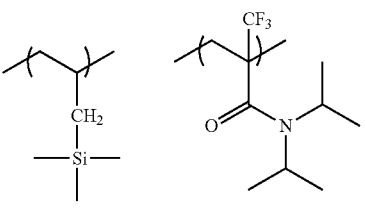
(HR-31)
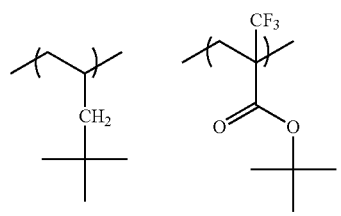
(HR-32)
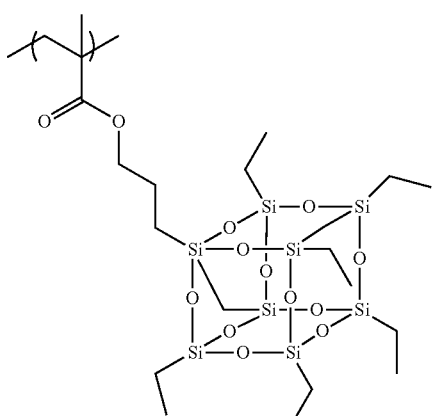
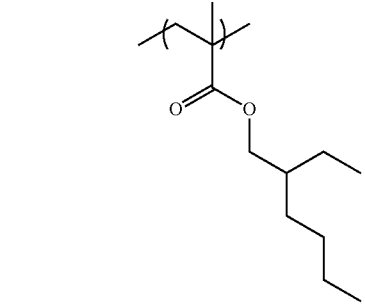
(HR-33)
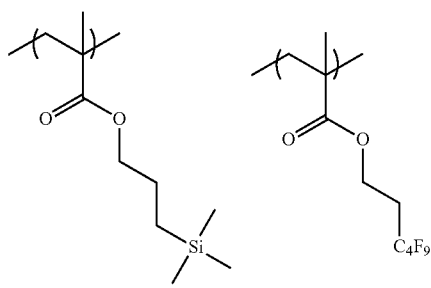

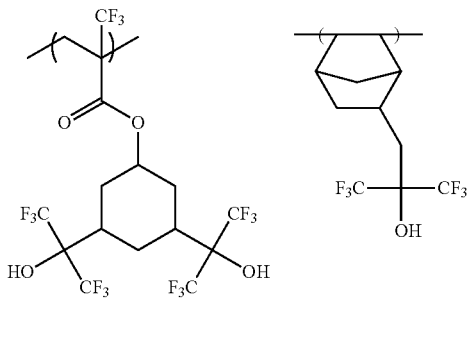
(HR-38)
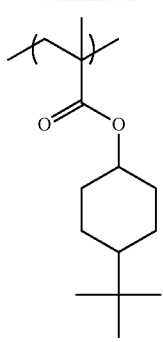
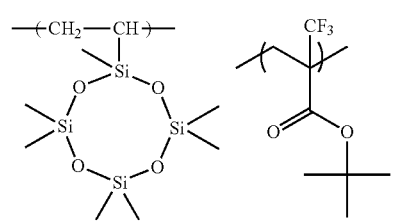
(HR-34)
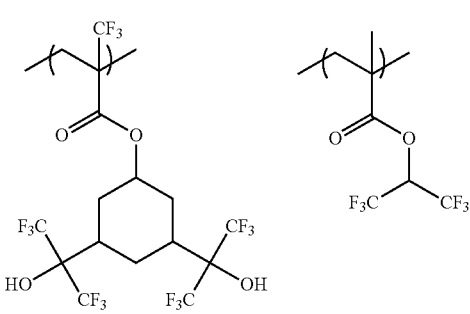
(HR-39)
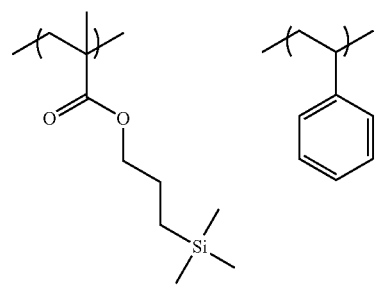
(HR-35)
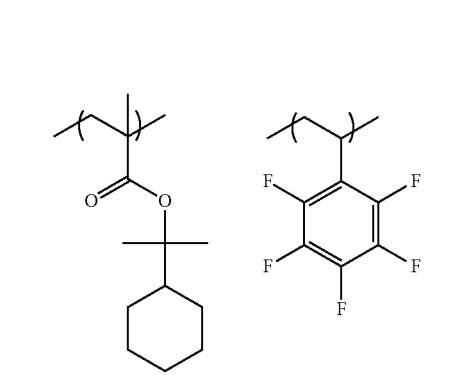
(HR-40)
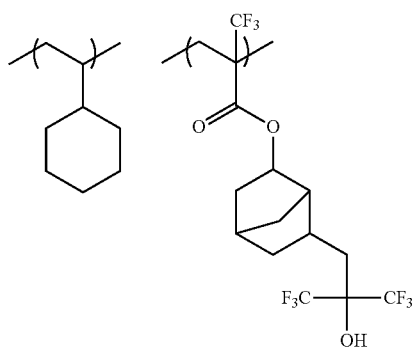
(HR-36)
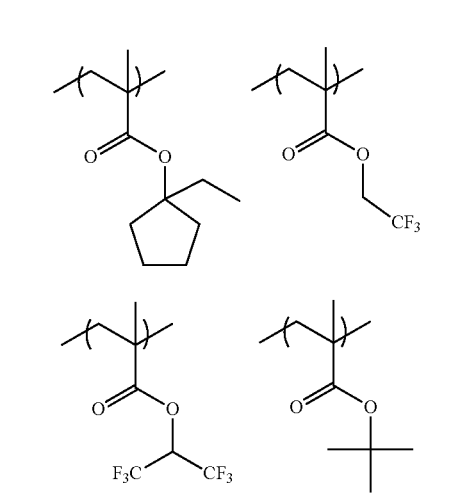
(HR-41)
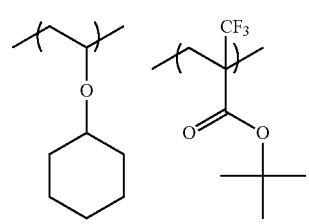
(HR-37)
(HR-42)

(HR-43)
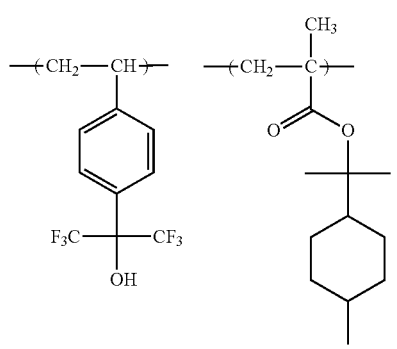
(HR-48)
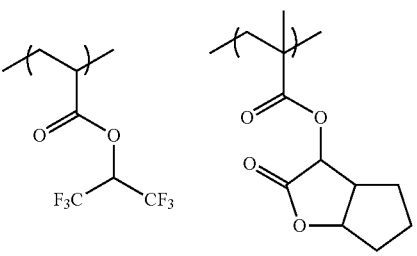
(HR-44)
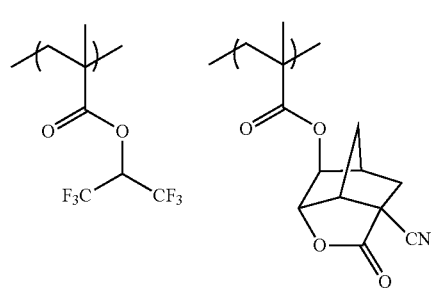
(HR-49)
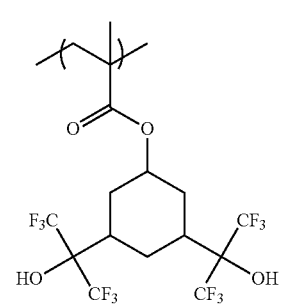
(HR-45)
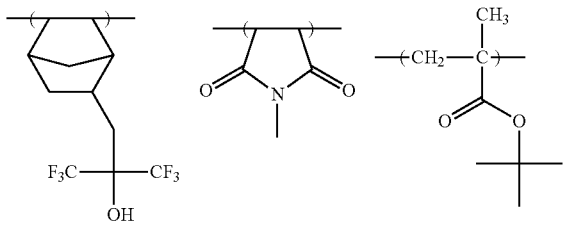
(HR-50)
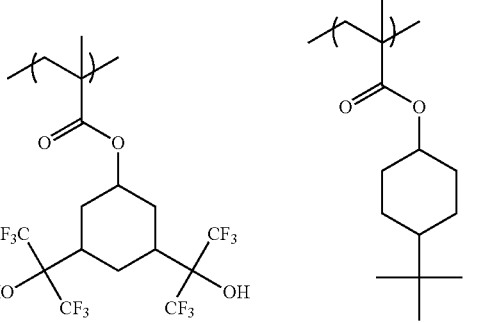
(HR-46)
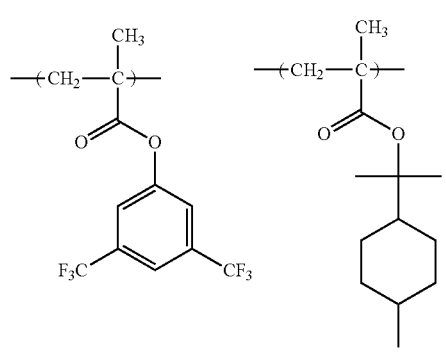
(HR-51)
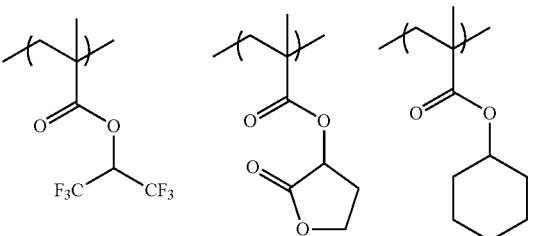
(HR-47)
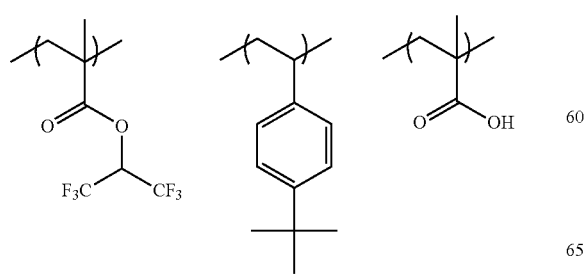
(HR-52)
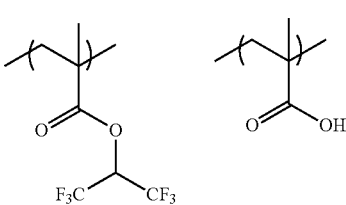

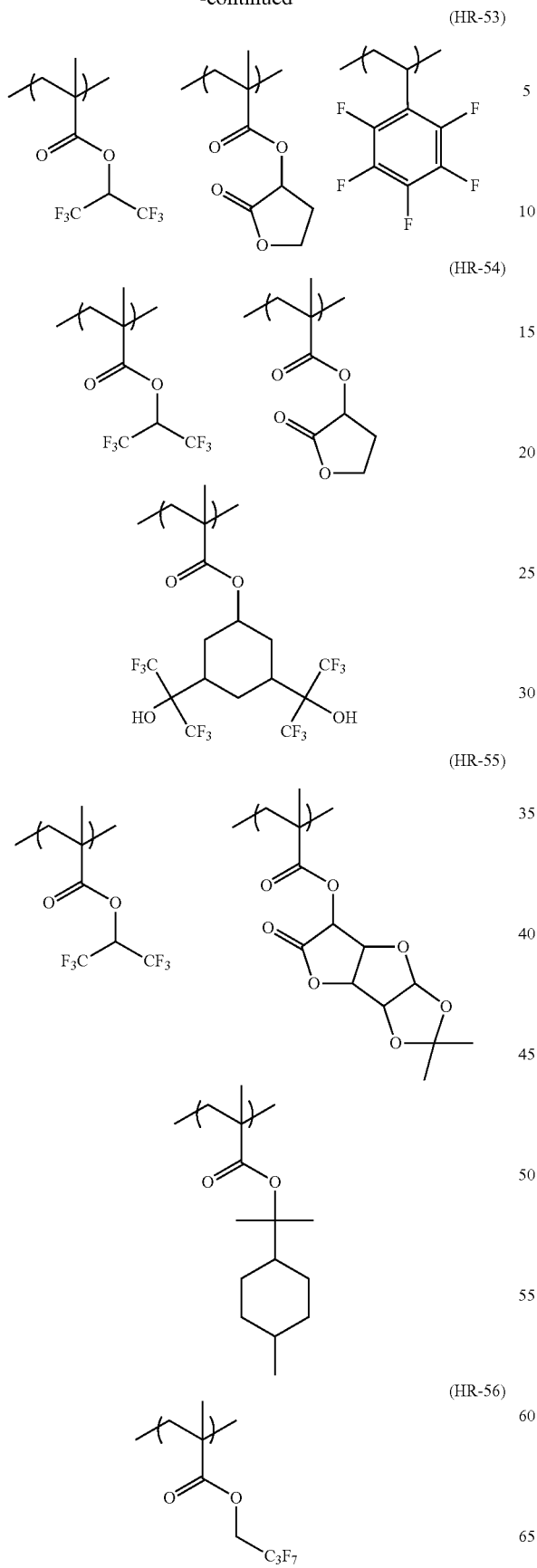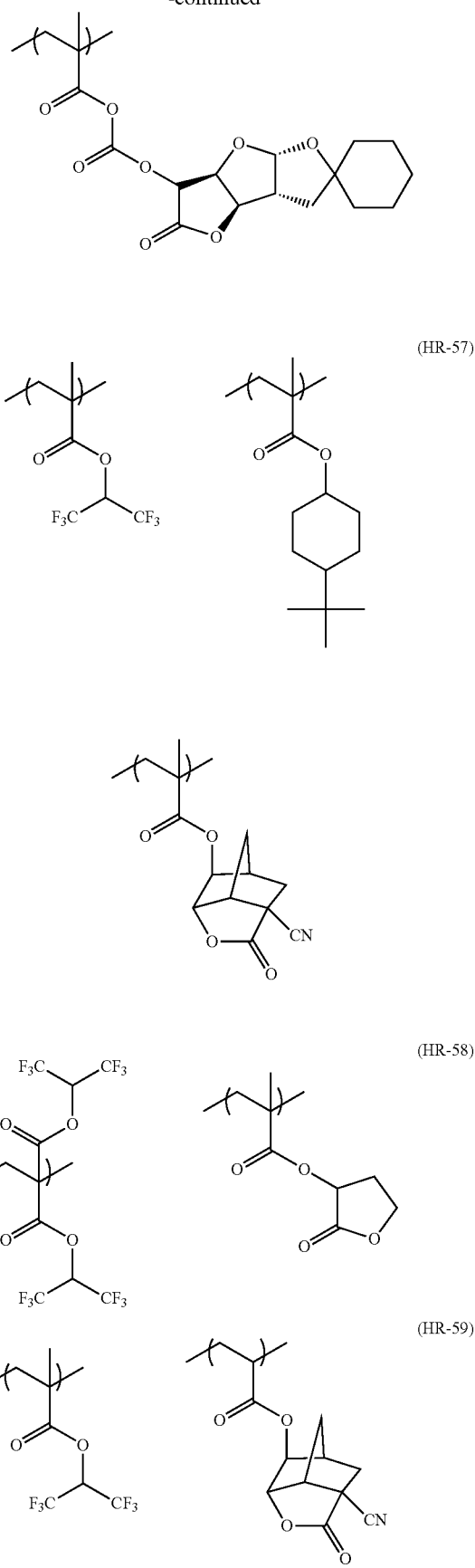

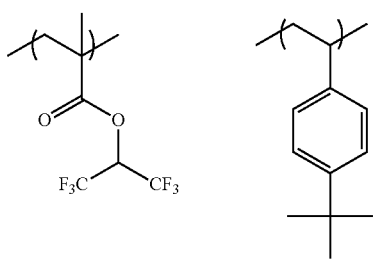
(HR-60)
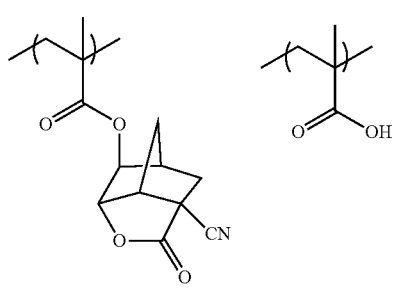
(HR-61)
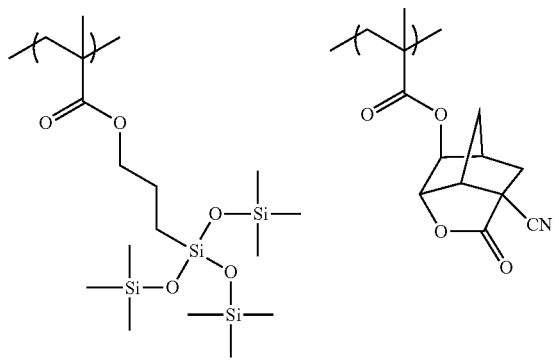
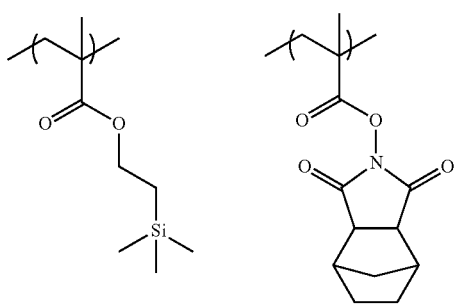
(HR-62)
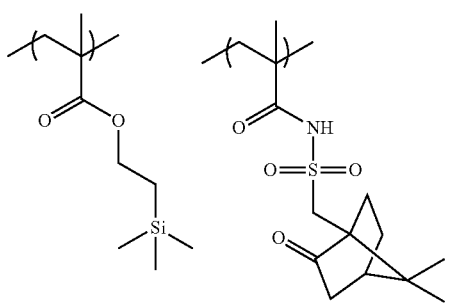
(HR-63)
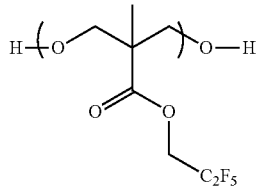
(HR-64)
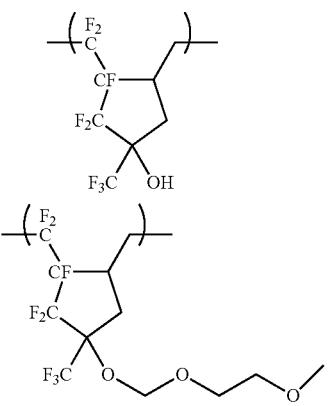
(HR-65)
TABLE 1
| resin | composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |

TABLE 1-continued

| resin | composition | Mw | Mw/Mn |
|---|---|---|---|
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium having a refractive index of 1.5 or higher. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MΩcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film from the composition of the present invention and the liquid for liquid immersion. The functions to be fulfilled by the top coat are applicability to an upper layer portion of the film, transparency in radiation of especially 193 nm and being highly insoluble in the liquid for liquid immersion. Preferably, the top coat does not mix with the film and is uniformly applicable to an upper layer of the film.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

The developing step will be described below.

In the development step, an alkali developer is generally used.

As the alkali developer, use can be made of any of alkaline aqueous solutions containing, for example, an inorganic alkali compound such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide or tetraethylammonium hydroxide; or a cycloamine such as pyrrole or piperidine.

Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

With respect to the particulars of the process for fabricating an imprint mold using the composition according to the present invention, reference can be made to, for example, Japanese Patent No. 4109085, JP-A-2008-162101, "Fundamentals of nanoimprint and its technology development/application deployment—technology of nanoimprint substrate and its latest technology deployment" edited by Yoshihiko Hirai, published by Frontier Publishing, etc.

EXAMPLE

Synthetic Example 1

Synthesis of Photoacid Generator (A1-1)

Isobutyl pentafluorobenzenesulfonate and tetrabutylammonium hydrogen sulfate amounting to 10.00 g and 1.12 g, respectively, were dissolved in 50 ml of methylene chloride, and cooled with ice. Subsequently, 7.24 g of 1,3,5-triisopropylphenol and 50 ml of 1M aqueous sodium hydroxide solution were added to the cooled solution, and agitated while cooling with ice for 40 minutes. The reaction solution was transferred into a separatory funnel, and the thus obtained organic phase was washed with water twice. Thereafter, the organic phase was dried over anhydrous sodium sulfate, and the solvent was removed. Thus, a colorless transparent oil was obtained. The oil was dissolved in 60 ml of acetonitrile, and 5.90 g of sodium iodide was added to the solution. The mixture was agitated in nitrogen at room temperature for 5 hours (white solid gradually precipitated). The reaction solution was cooled with ice, and further agitated for an hour. The thus precipitated solid was collected by filtration and washed with acetonitrile. Thus, a white solid was obtained. The obtained solid was dissolved in 100 ml of methanol, and 11.28 g of triphenylsulfonium bromide was added to the solution. The mixture was agitated at room temperature for an hour, and 300 ml of chloroform was added to the reaction solution. The thus obtained organic phase was washed with water several times, and concentrated by means of an evaporator. Thus, 20.05 g of desired compound (A1-1) was obtained in the form of a white solid.

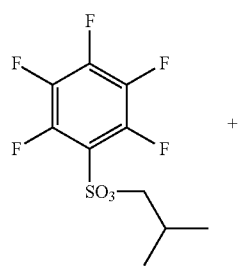

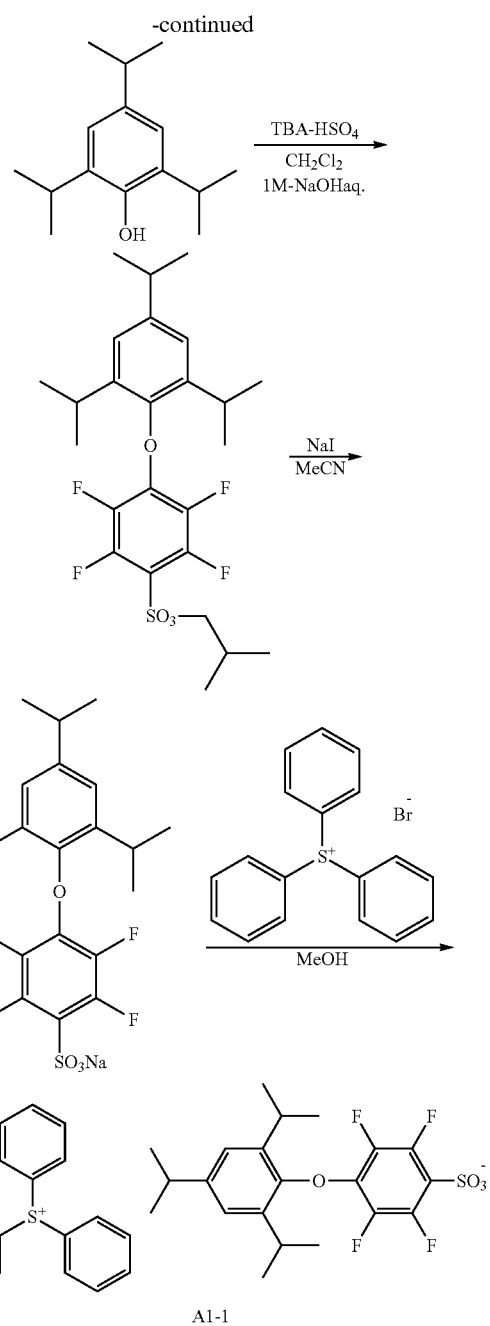

$^1$H-NMR (300 MHz, CDCl$_3$) δ=7.81-7.70 (m, 15H), 6.88 (s, 2H), 3.10 (m, 3H), 1.33 (d, 6H), 1.28 (d, 12H).

$^{19}$F-NMR (300 MHz, CDCl$_3$) δ=−136.22 (m, 2F), −155.33 (m, 2F).

Synthetic Example 2

Synthesis of Photoacid Generator (A1-2)

Compound (A1-2) mentioned above was synthesized in the same manner as in the synthesis of compound (A1-1), except that the 1,3,5-triisopropylphenol was changed to 1,3,5-tricyclohexylphenol.

$^1$H-NMR (300 MHz, CDCl$_3$) δ=7.76-7.70 (m, 15H), 6.92 (s, 2H), 2.70 (m, 2H), 2.48 (m, 1H), 1.28-1.90 (m, 30H).

$^{19}$F-NMR (300 MHz, CDCl$_3$) δ=−136.25 (m, 2F), −155.28 (m, 2F).

Compounds (A1-4), (A1-8), (A1-12), (A1-14), (A1-16), (A1-20), (A1-22), (A1-33), (A1-39) and (A1-41) among the above-mentioned photoacid generators were synthesized in the same manner as described above.

The photoacid generators used in Comparative Examples are shown below.

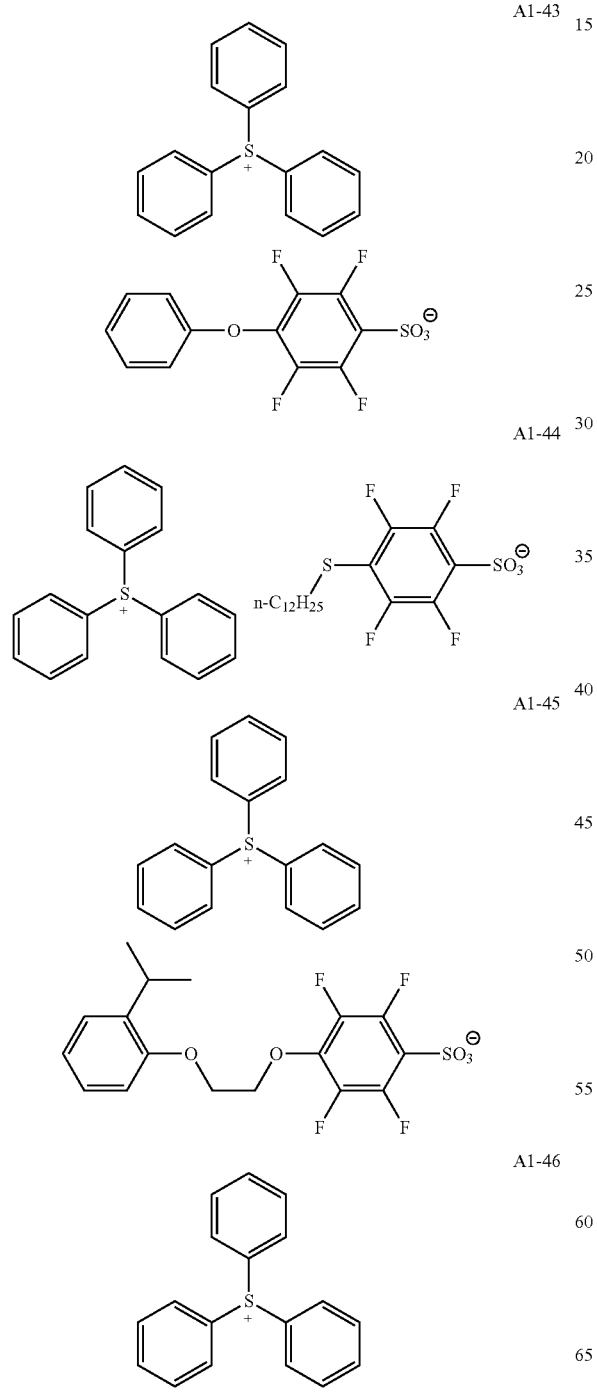

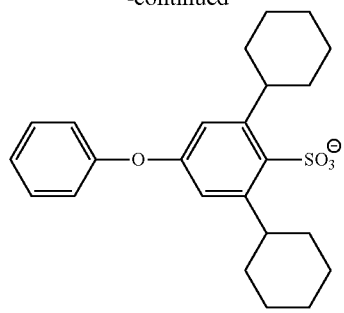

The resins, other photoacid generators, basic compounds, surfactants, acid crosslinking agents and solvents used in Examples and Comparative Examples are as follows.

[Acid-decomposable resin (B)]

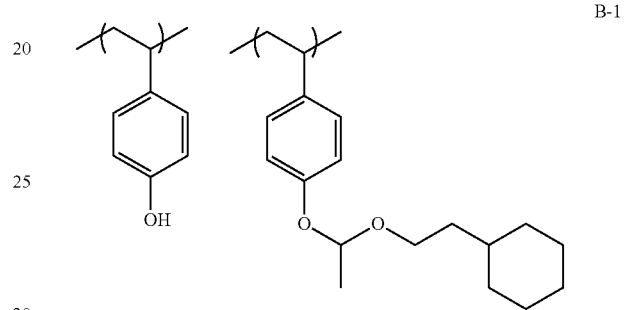

Composition ratio: 70/30
Mw: 10000
Mw/Mn: 1.17

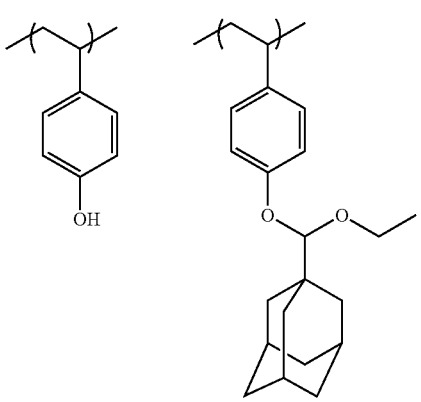

Composition ratio: 70/30
Mw: 11000
Mw/Mn: 1.16

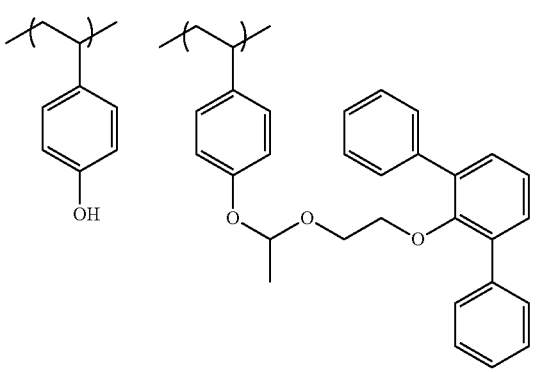

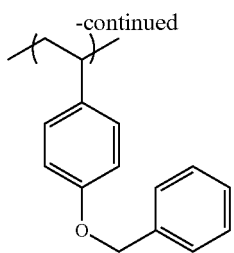
Composition ratio: 70/25/5
Mw: 11000
Mw/Mn: 1.20
B-4
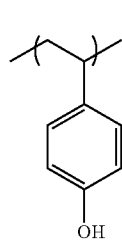 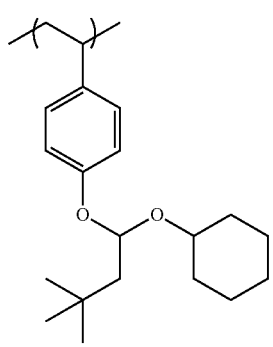
Composition ratio: 60/40
Mw: 10000
Mw/Mn: 1.15
B-5
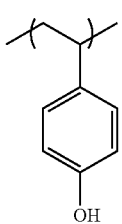 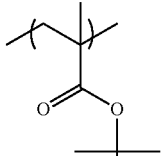 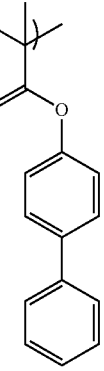
Composition ratio: 40/50/10
Mw: 12000
Mw/Mn: 1.65
B-6
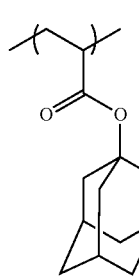 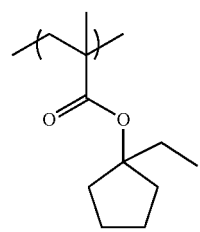
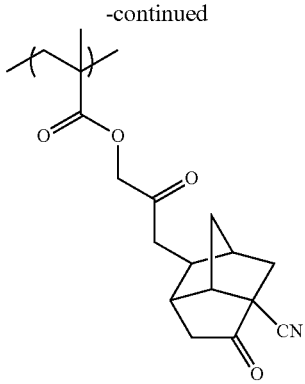
Composition ratio: 25/45/30
Mw: 89000
Mw/Mn: 1.70
[Alkali-soluble resin (C)]
C-1
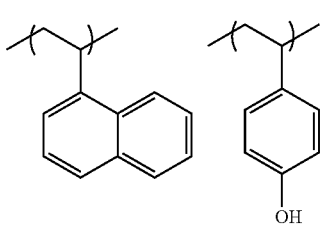
Composition ratio: 10/90
Mw: 16000
Mw/Mn: 2.30
C-2
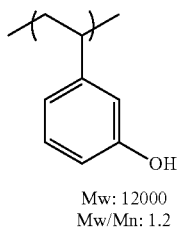
Mw: 12000
Mw/Mn: 1.2
C-3
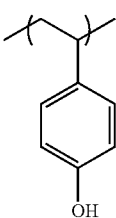
Nippon Soda Co., Ltd.
Mw: 6000
Mw/Mn: 1.2
[Other photoacid generator]
PAG-1
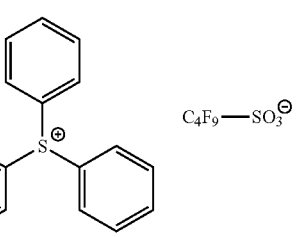
$C_4F_9-SO_3^{\ominus}$ -continued

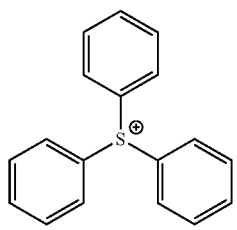
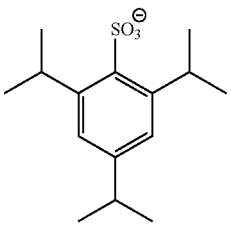

PAG-2

[Acid crosslinking agent]

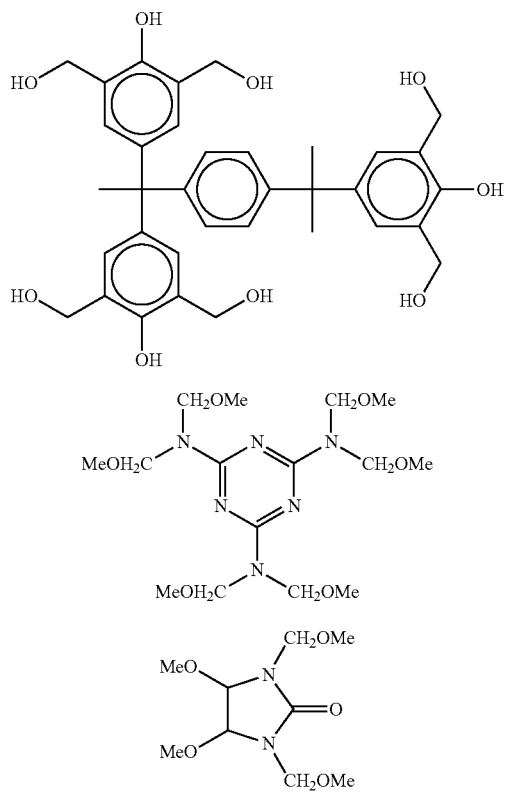

CL-1

CL-2

CL-3

[Basic Compound]
TBAH: tetrabutylammonium hydroxide,
TOA: tri(n-octyl)amine, and
TPI: 2,4,5-triphenylimidazole.
[Surfactant]
W-1: Megafac F176 (produced by DIC Corporation, fluorinated),
W-2: Megafac R08 (produced by DIC Corporation, fluorinated and siliconized),
W-3: polysiloxane polymer KP-341 (produced by Shin-Etsu Chemical Co., Ltd., siliconized), and
W-4: PF6320 (produced by OMNOVA SOLUTIONS, INC., fluorinated).
[Solvent]
S1: propylene glycol monomethyl ether acetate (PGMEA, 1-methoxy-2-acetoxypropane),
S2: propylene glycol monomethyl ether (PGME, 1-methoxy-2-propanol), and
S3: cyclohexanone.
<Evaluation of Resist>
Dissolution of individual components in solvents as indicated in the following Table was carried out, thereby obtaining solutions each of 4 mass % solid content. The solutions were each passed through a polytetrafluoroethylene filter of 0.10 μm pore size, thereby obtaining actinic-ray- or radiation-sensitive resin compositions (resist compositions). The actinic-ray- or radiation-sensitive resin compositions were evaluated by the following methods, and the results are given in the following Table.

With respect to the individual components in the following Table, when a plurality of different species thereof was used, the ratio refers to a mass ratio.

Examples 1A to 17A and Comparative Examples 1A to 4A

Exposure Condition 1

Exposure to EB (Electron Beams), Positive

Each of the prepared actinic-ray- or radiation-sensitive resin compositions was uniformly applied onto a silicon substrate having undergone hexamethyldisilazane treatment by means of a spin coater, and dried by baking on a hot plate at 120° C. for 90 seconds. Thus, actinic-ray- or radiation-sensitive films (resist films) each having a thickness of 100 nm were formed. Each of the formed actinic-ray- or radiation-sensitive films was exposed to electron beams by means of an electron beam irradiating apparatus (HL750 manufactured by Hitachi, Ltd., acceleration voltage 50 KeV). The exposed film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and spin dried. Thus, resist patterns were obtained.

Examples 1B to 10B and Comparative Example 1B

Exposure Condition 2

Exposure to EB (Electron Beams), Negative

Each of the prepared actinic-ray- or radiation-sensitive resin compositions was uniformly applied onto a silicon substrate having undergone hexamethyldisilazane treatment by means of a spin coater, and dried by baking on a hot plate at 120° C. for 90 seconds. Thus, actinic-ray- or radiation-sensitive films (resist films) each having a thickness of 100 nm were formed. Each of the formed actinic-ray- or radiation-sensitive films was exposed to electron beams by means of an electron beam irradiating apparatus (HL750 manufactured by Hitachi, Ltd., acceleration voltage 50 KeV). The exposed film was immediately baked on a hot plate at 110° C. for 60 seconds. The baked film was developed with a 2.38 mass % aqueous tetramethylammonium hydroxide solution at 23° C. for 60 seconds, rinsed with pure water for 30 seconds and spin dried. Thus, resist patterns were obtained.

Examples 1C to 9C and Comparative Examples 1C and 2C

Exposure Condition 3

Exposure to EUV (Extreme Ultraviolet), Positive

Each of the prepared actinic-ray- or radiation-sensitive resin compositions was uniformly applied onto a silicon substrate having undergone hexamethyldisilazane treatment by means of a spin coater, and dried by baking on a hot plate at 120° C. for 90 seconds. Thus, actinic-ray- or radiation-sensitive films (resist films) each having a thickness of 100 nm were formed. Each of the formed actinic-ray- or radiation-sensitive films was exposed through a reflective mask of 100 nm line width 1:1 line and space pattern to EUV by means of an EUV exposure apparatus. The exposed film was immediately baked on a hot plate at 110° C. for 60 seconds. The baked film was developed with a 2.38 mass % aqueous tetramethylammonium hydroxide solution at 23° C. for 60 seconds, rinsed with pure water for 30 seconds and spin dried. Thus, resist patterns were obtained.

Examples 1D to 3D and Comparative Example 1D

Exposure Condition 4
Exposure to EUV (Extreme Ultraviolet), Developed with Organic Solvent, Negative Each of the prepared actinic-ray- or radiation-sensitive resin compositions was uniformly applied onto a silicon substrate having undergone hexamethyldisilazane treatment by means of a spin coater, and dried by baking on a hot plate at 120° C. for 90 seconds. Thus, actinic-ray- or radiation-sensitive films (resist films) each having a thickness of 100 nm were formed. Each of the formed actinic-ray- or radiation-sensitive films was exposed through a reflective mask of 100 nm line width 1:1 line and space pattern to EUV by means of an EUV exposure apparatus. The exposed film was immediately baked on a hot plate at 110° C. for 60 seconds. The baked film was developed by puddling butyl acetate for 30 seconds, and spin dried while further baking at 90° C. for 60 seconds.

Thus, resist patterns were obtained.

(Evaluation of Sensitivity)

The shape of a cross section of each of the obtained patterns was observed by means of a scanning electron microscope (model S-9220, manufactured by Hitachi, Ltd.). The sensitivity was defined as the minimum exposure energy at which a 100 nm line width line and space pattern (line:space=1:1) could be resolved.

(Evaluation of Resolving Power)

The resolving power was defined as a limiting resolving power (minimum line width at which a line and a space could be separated and resolved from each other) under the amount of exposure exhibiting the above sensitivity.

(Evaluation of Pattern Shape)

The shape of a cross section of each 100 nm line width line and space pattern (line:space=1:1) formed in the amount of exposure exhibiting the above sensitivity was observed by means of a scanning electron microscope (model S-4300, manufactured by Hitachi, Ltd.) The pattern shape was graded into rectangle, taper and T-top on a 3-point scale.

(Evaluation of Line Edge Roughness (LER))

With respect to each 100 nm line width line and space pattern (line:space=1:1) formed in the amount of exposure exhibiting the above sensitivity, the distance between actual edge and a reference line on which edges were to be present was measured on arbitrary 30 points within 50 μm in the longitudinal direction of the pattern by means of a scanning electron microscope (model S-9220, manufactured by Hitachi, Ltd.). The standard deviation of measured distances was determined, and 3σ was computed therefrom. The smaller the value thereof, the more favorable the line edge roughness exhibited.

TABLE 2

[EB exposure; positive]

| | Photoacid generator (A1/A2) 0.5 g | Resin (B) 10 g | Basic compd. 0.04 g | Solvent (4/6) | Surfactant 0.1 mass %* | Sensitivity (μC/cm$^2$) | Resolving power (nm) | Pattern shape | LER (nm) |
|---|---|---|---|---|---|---|---|---|---|
| Ex. 1A | A1-1 | B-1 | TPI | S1/S2 | W-1 | 27.5 | 65 | Rectangle | 5.8 |
| Ex. 2A | A1-1 | B-2 | TBAH | S1/S2 | W-2 | 27.0 | 60 | Rectangle | 5.6 |
| Ex. 3A | A1-1 | B-5 | TPI | S1/S2 | W-1 | 27.0 | 70 | Rectangle | 5.8 |
| Ex. 4A | A1-2 | B-1 | TPI | S1/S2 | W-1 | 27.5 | 60 | Rectangle | 5.3 |
| Ex. 5A | A1-2 | B-2 | TBAH | S1/S2 | W-2 | 27.5 | 55 | Rectangle | 5.5 |
| Ex. 6A | A1-2 | B-4 | TPI | S2/S3 | W-1 | 26.5 | 50 | Rectangle | 5.0 |
| Ex. 7A | A1-4 | B-6 | TPI | S1/S2 | W-1 | 27.5 | 70 | Rectangle | 6.5 |
| Ex. 8A | A1-4/PAG-1 (4/1) | B-2 | TPI | S1/S2 | None | 27.0 | 70 | Rectangle | 6.5 |
| Ex. 9A | A1-8 | B-1 | TBAH | S1/S2 | W-2 | 29.0 | 70 | Rectangle | 5.5 |
| Ex. 10A | A1-12 | B-1 | TOA | S1/S2 | W-4 | 29.0 | 55 | Rectangle | 5.1 |
| Ex. 11A | A1-14 | B-1 | TBAH | S1/S2 | W-2 | 30.0 | 70 | Rectangle | 6.5 |
| Ex. 12A | A1-16 | B-4 | TBAH | S1/S2 | W-1 | 30.5 | 75 | Rectangle | 6.5 |
| Ex. 13A | A1-20 | B-3 | TBAH/TPI (1/1) | S1/S2 | W-3 | 30.5 | 70 | Rectangle | 6.2 |
| Ex. 14A | A1-22/PAG-2 (4/1) | B-1 | TPI | S1/S2 | W-1 | 27.5 | 65 | Rectangle | 5.2 |
| Ex. 15A | A1-33 | B-6 | TOA | S1/S2 | W-1 | 27.0 | 75 | Rectangle | 6.0 |
| Ex. 16A | A1-39 | B-1/B-6 (8/2) | TPI | S1/S3 | W-2 | 28.0 | 75 | Rectangle | 6.8 |
| Ex. 17A | A1-41 | B-3 | TPI | S1/S2 | W-3 | 28.0 | 75 | Rectangle | 6.7 |
| Comp. Ex. 1A | A1-43 | B-1 | TBAH | S1/S2 | W-1 | 35.0 | 90 | Taper | 7.5 |
| Comp. Ex. 2A | A1-44 | B-1 | TPI | S1/S2 | W-1 | 35.5 | 85 | Taper | 7.0 |
| Comp. Ex. 3A | A1-45 | B-5 | TBAH | S1/S2 | W-1 | 36.0 | 85 | Taper | 7.0 |
| Comp. Ex. 4A | A1-46 | B-1 | TPI | S1/S2 | W-1 | 39.0 | 80 | Rectangle | 7.5 |

*The conc. of added surfactant is conc. (mass %) based on the amount of total solids.

TABLE 3

[EB exposure; negative]

| | Photoacid generator (A1/A2) 0.5 g | Resin (C) 10 g | Cross-linking agent (D) 3 g | Basic compd. 0.04 g | Solvent (4/6) | Surfactant 0.1 mass %* | Sensitivity ($\mu$C/cm2) | Resolving power (nm) | Pattern shape | LER (nm) |
|---|---|---|---|---|---|---|---|---|---|---|
| Ex. 1B | A1-1 | C-2 | CL-1 | TBAH | S1/S2 | W-1 | 28.0 | 65 | Rectangle | 6.0 |
| Ex. 2B | A1-1 | C-3 | CL-1 | TBAH | S1/S2 | W-1 | 28.0 | 65 | Rectangle | 5.8 |
| Ex. 3B | A1-2 | C-1 | CL-1 | TBAH | S1/S2 | W-1 | 27.5 | 60 | Rectangle | 5.3 |
| Ex. 4B | A1-2 | C-2 | CL-1 | TBAH | S2/S3 | W-1 | 26.5 | 50 | Rectangle | 5.5 |
| Ex. 5B | A1-4 | C-1 | CL-1/CL-3 (1/1) | TBAH | S1/S2 | W-1 | 28.5 | 70 | Rectangle | 6.5 |
| Ex. 6B | A1-8 | C-1 | CL-1 | TBAH | S1/S2 | W-2 | 29.0 | 70 | Rectangle | 6.0 |
| Ex. 7B | A1-12 | C-1 | CL-1 | TPI | S1/S2 | W-4 | 28.5 | 55 | Rectangle | 5.8 |
| Ex. 8B | A1-20 | C-3 | CL-2 | TBAH/TPI (1/1) | S1/S2 | W-3 | 30.5 | 70 | Rectangle | 6.8 |
| Ex. 9B | A1-22/PAG-2 (4/1) | C-1 | CL-1 | TPI | S1/S2 | W-1 | 30.0 | 75 | Rectangle | 7.0 |
| Ex. 10B | A1-39 | C-1/C-2 (8/2) | CL-1 | TBAH | S1/S3 | W-2 | 28.0 | 75 | Rectangle | 7.5 |
| Comp. Ex. 1B | A1-43 | C-1 | CL-1 | TBAH | S1/S2 | W-1 | 35.0 | 80 | T-top | 8.5 |

*The conc. of added surfactant is conc. (mass %) based on the amount of total solids.

TABLE 4

[EUV exposure; positive]

| | Photoacid generator (A1/A2) 0.5 g | Resin (B) 10 g | Basic compd. 0.04 g | Solvent (4/6) | Surfactant 0.1 mass %* | Sensitivity (mJ/cm$^2$) | Resolving power (nm) | Pattern shape | LER (nm) |
|---|---|---|---|---|---|---|---|---|---|
| Ex. 1C | A1-1 | B-1 | TBAH | S1/S2 | W-1 | 26.5 | 25 | Rectangle | 4.5 |
| Ex. 2C | A1-1 | B-5 | TPI | S1/S2 | W-1 | 27.0 | 25 | Rectangle | 4.5 |
| Ex. 3C | A1-2 | B-1 | TBAH | S1/S2 | W-1 | 25.0 | 20 | Rectangle | 4.5 |
| Ex. 4C | A1-2 | B-4 | TPI | S2/S3 | W-1 | 25.5 | 25 | Rectangle | 4.0 |
| Ex. 5C | A1-4 | B-6 | TPI | S1/S2 | W-1 | 27.5 | 30 | Rectangle | 5.5 |
| Ex. 6C | A1-12 | B-2 | TBAH | S1/S2 | W-1 | 27.0 | 25 | Rectangle | 4.0 |
| Ex. 7C | A1-22 | B-1 | TPI | S1/S2 | W-1 | 27.5 | 35 | Rectangle | 5.5 |
| Ex. 8C | A1-33 | B-3 | TBAH | S1/S2 | W-1 | 27.0 | 40 | Rectangle | 5.0 |
| Ex. 9C | A1-39 | B-5/B-6 (8/2) | TPI | S1/S3 | W-1 | 28.0 | 35 | Rectangle | 5.5 |
| Comp. Ex. 1C | A1-43 | B-1 | TBAH | S1/S2 | W-1 | 30.0 | 40 | Taper | 6.0 |
| Comp. Ex. 2C | A1-45 | B-1 | TBAH | S1/S2 | W-1 | 30.0 | 50 | Taper | 6.5 |

*The conc. of added surfactant is conc. (mass %) based on the amount of total solids.

TABLE 5

[EUV exposure; organic solvent development; nesitive]

| | Photoacid generator (A1/A2) 0.5 g | Resin (B) 10 g | Basic compd. 0.04 g | Solvent (4/6) | Surfactant 0.1 mass %* | Sensitivity (mJ/cm2) | Resolving power (nm) | Pattern shape | LER (nm) |
|---|---|---|---|---|---|---|---|---|---|
| Ex. 1D | A1-1 | B-1 | TBAH | S1/S2 | W-1 | 25.5 | 25 | Rectangle | 5.0 |
| Ex. 2D | A1-2 | B-4 | TBAH | S1/S2 | W-1 | 25.0 | 20 | Rectangle | 4.5 |
| Ex. 3D | A1-12 | B-4 | TBAH | S1/S2 | W-1 | 30.0 | 25 | Rectangle | 4.5 |
| Comp. Ex. 1D | A1-43 | B-1 | TBAH | S1/S2 | W-1 | 35.0 | 40 | T-top | 6.5 |

*The conc. of added surfactant is conc. (mass %) based on the amount of total solids.

It is apparent from the results shown in the above Tables that the actinic-ray- or radiation-sensitive resin compositions of the present invention can simultaneously satisfy high sensitivity, high resolution, favorable pattern shape and favorable line edge roughness at exposure to EB and EUV as compared with those of the comparative compositions not containing acid generators (A1). Therefore, the compositions of the present invention can find appropriate application in the lithography process employed in the manufacturing of various semiconductor devices and electronic devices, such as recording media.

What is claimed is:

1. An actinic-ray- or radiation-sensitive resin composition comprising a compound that when exposed to actinic rays or radiation, generates any of acids of general formula (I) below,

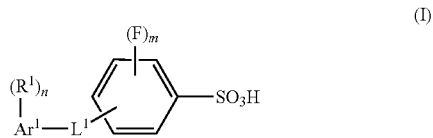

(I)

in which
L$^1$ represents a single bond, —O—, —S—, —C(=O)—, —C(=O)O—, —OC(=O)—, —S(=O)—, —S(=O)$_2$—, an optionally substituted methylene group or an optionally substituted ethylene group;
Ar$^1$ represents an aryl group;
R$^1$ represents a monovalent substituent, provided that at least one R$^1$ represents a group having two or more carbon atoms, and that when n is 2 or greater, two or more R$^1$s may be identical to or different from each other and may be connected to each other to thereby form a ring;
m is an integer of 1 to 4; and
n is an integer of 2 to 5.

2. The actinic-ray- or radiation-sensitive resin composition according to claim 1, wherein in general formula (I), L$^1$ represents —O— or —S—.

3. The actinic-ray- or radiation-sensitive resin composition according to claim 1, wherein in general formula (I), Ar$^1$ is substituted with at least one R$^1$ at an ortho position to -L$^1$-.

4. The actinic-ray- or radiation-sensitive resin composition according to claim 1, further comprising a resin that when acted on by an acid, is decomposed to thereby increase its solubility in an alkali developer.

5. The actinic-ray- or radiation-sensitive resin composition according to claim 1 to be exposed to electron beams, X-rays or soft X-rays.

6. An actinic-ray- or radiation-sensitive film formed from the actinic-ray- or radiation-sensitive resin composition according to claim 1.

7. A method of forming a pattern, comprising exposing the actinic-ray- or radiation-sensitive film according to claim 6 to actinic rays or radiation and developing the exposed film.

8. The method according to claim 7, wherein the exposure is performed by use of electron beams, X-rays or soft X-rays.

9. A process for manufacturing a semiconductor device, comprising the method according to claim 7.

10. A compound of general formula (II) below,

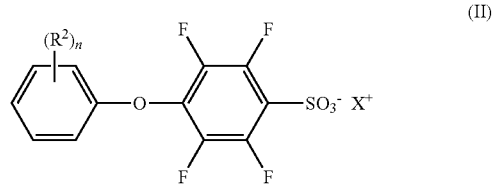

(II)

in which
R$^2$ represents a monovalent substituent, provided that at least one R$^2$ represents a group having two or more carbon atoms, and that when n is 2 or greater, two or more R$^2$s may be identical to or different from each other and may be connected to each other to thereby form a ring;
n is an integer of 2 to 5; and
X$^+$ represents a cation.

11. The actinic-ray- or radiation-sensitive resin composition according to claim 10, wherein n in general formula (II) is 3.

12. The actinic-ray- or radiation-sensitive resin composition according to claim 1, wherein n in general formula (I) is 3.

* * * * *